US012621993B2

(12) United States Patent
Sim et al.

(10) Patent No.: US 12,621,993 B2
(45) Date of Patent: May 5, 2026

(54) THREE-DIMENSIONAL SEMICONDUCTOR MEMORY DEVICE, ELECTRONIC SYSTEM INCLUDING THE SAME, AND METHOD OF FABRICATING THE SAME

(71) Applicant: SAMSUNG ELECTRONICS CO., LTD., Suwon-si (KR)

(72) Inventors: Jaeryong Sim, Suwon-si (KR); Donghyuck Jang, Hwaseong-si (KR); Jeehoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 660 days.

(21) Appl. No.: 18/055,200

(22) Filed: Nov. 14, 2022

(65) Prior Publication Data

US 2023/0247835 A1     Aug. 3, 2023

(30) Foreign Application Priority Data

Jan. 28, 2022    (KR) ........................ 10-2022-0012993

(51) Int. Cl.
H10B 41/10        (2023.01)
H10B 41/27        (2023.01)
(Continued)

(52) U.S. Cl.
CPC ............. H10B 43/27 (2023.02); H10B 41/10 (2023.02); H10B 41/27 (2023.02); H10B 41/41 (2023.02); H10B 43/10 (2023.02); H10B 43/40 (2023.02)

(58) Field of Classification Search
CPC ........ H10B 43/27; H10B 41/10; H10B 41/27; H10B 41/41; H10B 43/10; H10B 43/35; H01L 21/304
See application file for complete search history.

(56) References Cited

U.S. PATENT DOCUMENTS 8,901,635 B2    12/2014  Fujiki et al.
9,082,643 B2    7/2015   Sunamura et al.
(Continued)

FOREIGN PATENT DOCUMENTS

CN      107731831       2/2018
CN      112997309       6/2021
(Continued)

*Primary Examiner* — Ajay Ojha
*Assistant Examiner* — Sandra Milena Rodriguez Villanu
(74) *Attorney, Agent, or Firm* — Morgan, Lewis & Bockius LLP

(57)            ABSTRACT

Disclosed are 3D semiconductor memory device, electronic systems including the same, and methods of fabricating the same. The 3D semiconductor memory device includes lower selection lines extending in a first direction on a substrate and spaced apart from each other in a second direction that is parallel to a top surface of the substrate and intersects the first direction, a middle stack structure including electrode layers and electrode interlayer dielectric layers that are alternately stacked on the lower selection lines, upper selection lines extending in the first direction on the middle stack structure and spaced apart from each other in the second direction, a first polishing stop layer disposed between the middle stack structure and the lower selection lines. The first polishing stop layer includes a material different from that of the electrode interlayer dielectric layers.

20 Claims, 49 Drawing Sheets

(51) Int. Cl.
  *H10B 41/41*   (2023.01)
  *H10B 43/10*   (2023.01)
  *H10B 43/27*   (2023.01)
  *H10B 43/40*   (2023.01)

(56) References Cited

U.S. PATENT DOCUMENTS

| | | |
|---|---|---|
| 10,319,864 B2 | 6/2019 | Kim et al. |
| 10,665,601 B2 | 5/2020 | Lee |
| 10,700,085 B2 | 6/2020 | Hwang et al. |
| 11,037,950 B2 | 6/2021 | Baek |
| 11,456,316 B2 | 9/2022 | Noh et al. |
| 2015/0155296 A1* | 6/2015 | Yoon ..................... H10B 43/27 |
| | | 257/324 |
| 2020/0286530 A1 | 9/2020 | Lee et al. |
| 2021/0013304 A1* | 1/2021 | Ryu ..................... H10B 43/35 |
| 2021/0225872 A1 | 7/2021 | Sun et al. |
| 2022/0077181 A1 | 3/2022 | Guo et al. |
| 2022/0077283 A1 | 3/2022 | Wu et al. |

FOREIGN PATENT DOCUMENTS

| | | |
|---|---|---|
| CN | 112997310 | 6/2021 |
| CN | 111540743 | 8/2021 |
| KR | 10-2014-0026278 A | 3/2014 |
| KR | 10-2018-0138381 A | 12/2018 |
| KR | 10-2021-0081051 A | 7/2021 |
| KR | 10-2021-0101900 A | 8/2021 |
| KR | 10-2021-0134523 A | 11/2021 |

* cited by examiner

THREE-DIMENSIONAL SEMICONDUCTOR MEMORY DEVICE, ELECTRONIC SYSTEM INCLUDING THE SAME, AND METHOD OF FABRICATING THE SAME

CROSS-REFERENCE TO RELATED APPLICATION

This U.S. nonprovisional application claims priority under 35 U.S.C. § 119 to Korean Patent Application No. 10-2022-0012993, filed on Jan. 28, 2022, in the Korean Intellectual Property Office, the disclosure of which is herein incorporated by reference in its entirety.

TECHNICAL FIELD

The present inventive concept relates to a semiconductor device, an electronic system including the same, and a method of fabricating the same, and more particularly, to a three-dimensional semiconductor memory device with enhanced reliability and increased integration, an electronic system including the same, and a method of fabricating the same.

DISCUSSION OF RELATED ART

Because integration of a semiconductor device is an important factor in determining a price of an electronic product, semiconductor devices with high integration may be required to meet the rising demand for high performance and low cost electronic products by consumers. Integration of typical two-dimensional (2D) or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional (2D) or planar semiconductor devices. Therefore, three-dimensional (3D) semiconductor memory devices including three-dimensionally arranged memory cells have been proposed to overcome the above limitations.

SUMMARY

Embodiments of the present inventive concept provide a three-dimensional semiconductor memory device and an electronic system with enhanced reliability and increased integration.

Embodiments of the present inventive concept also provide a method of fabricating a three-dimensional semiconductor memory device with enhanced productivity.

According to an embodiment of the present inventive concept, a three-dimensional semiconductor memory device may include: a plurality of lower selection lines disposed on a substrate and extending in a first direction, the lower selection lines being spaced apart from each other in a second direction that is parallel to a top surface of the substrate and intersects the first direction; a middle stack structure including a plurality of electrode layers and a plurality of electrode interlayer dielectric layers that are alternately stacked on the lower selection lines; a plurality of upper selection lines disposed on the middle stack structure and extending in the first direction, the upper selection lines being spaced apart from each other in the second direction; and a first polishing stop layer disposed between the middle stack structure and the lower selection lines. The first polishing stop layer may include a material different from a material of the electrode interlayer dielectric layers.

According to an embodiment of the present inventive concept, a three-dimensional semiconductor memory device may include a peripheral circuit structure and a cell array structure on the peripheral circuit structure. The cell array structure may include: a substrate including a cell array region and a connection region that are side by side in a first direction; a source structure disposed on the substrate; a plurality of lower selection lines disposed on the source structure and extending in the first direction, the lower selection lines being spaced apart from each other in a second direction that is parallel to a top surface of the substrate and intersects the first direction; a middle stack structure including a plurality of electrode layers and a plurality of electrode interlayer dielectric layers that are alternately stacked on the lower selection lines; a plurality of upper selection lines disposed on the middle stack structure and extending in the first direction, the upper selection lines being spaced apart from each other in the second direction; a first polishing stop layer disposed between the middle stack structure and the lower selection lines; a planarized dielectric layer disposed on the connection region and covering ends of the lower selection lines, an end of the first polishing stop layer, an end of the middle stack structure, and ends of the upper selection lines; a plurality of cell vertical semiconductor patterns disposed on the cell array region and adjacent to the substrate, the cell vertical semiconductor patterns penetrating the upper selection lines, the middle stack structure, the first polishing stop layer, the lower selection lines, and the source structure; and a plurality of bit-line pads disposed on corresponding cell vertical semiconductor patterns. Each of the first polishing stop layer and the electrode interlayer dielectric layers may include silicon oxide. A silicon atomic concentration of the first polishing stop layer may be greater than a silicon atomic concentration of the electrode interlayer dielectric layers.

According to an embodiment of the present inventive concept, an electronic system may include: a semiconductor device that includes a peripheral circuit structure and a cell array structure on the peripheral circuit structure; an input/output pad electrically connected to the peripheral circuit structure; and a controller electrically connected through the input/output pad to the semiconductor device, the controller controlling the semiconductor device. The cell array structure may include: a plurality of lower selection lines disposed on a substrate and extending in a first direction, the lower selection lines being spaced apart from each other in a second direction that is parallel to a top surface of the substrate and intersects the first direction; a middle stack structure including a plurality of electrode layers and a plurality of electrode interlayer dielectric layers that are alternately stacked on the lower selection lines; a plurality of upper selection lines disposed on the middle stack structure and extending in the first direction; and a first polishing stop layer disposed between the middle stack structure and the lower selection lines and including a material different from a material of the electrode interlayer dielectric layers.

According to an embodiment of the present inventive concept, a method of fabricating a three-dimensional semiconductor memory device may include: sequentially stacking a first sacrificial layer and a first electrode interlayer dielectric layer on a substrate; forming a polishing stop layer on the first electrode interlayer dielectric layer; forming a lower separation groove by sequentially etching the polishing stop layer, the first electrode interlayer dielectric layer, and the first sacrificial layer; forming a first lower separation pattern that fills the lower separation groove; sequentially stacking a plurality of second sacrificial layers and a plurality of second electrode interlayer dielectric layers on the polishing stop layer and the first lower separation pattern; forming a plurality of vertical holes by sequentially etching the second electrode interlayer dielectric layers, the second sacrificial layers, the polishing stop layer, the first electrode interlayer dielectric layer, and the first sacrificial layer, the vertical holes exposing the substrate; forming a gate dielectric layer and a plurality of vertical semiconductor patterns in the vertical holes; forming a first groove by sequentially etching the second electrode interlayer dielectric layers, the second sacrificial layers, the polishing stop layer, the first electrode interlayer dielectric layer, and the first sacrificial layer, the first groove exposing the substrate; and replacing the second sacrificial layers and the first sacrificial layers with a plurality of conductive layers through the first groove. The polishing stop layer may be formed of a material different from a material of the first electrode interlayer dielectric layer.

BRIEF DESCRIPTION OF THE DRAWINGS

The above and other aspects and features of the present inventive concept will be more clearly understood from the following detailed description, taken in conjunction with the accompanying drawings, in which:

FIG. 1B illustrates a simplified perspective view showing an electronic system that includes a semiconductor device according to an embodiment of the present inventive concept;

FIG. 3 illustrates a plan view showing a three-dimensional semiconductor memory device according to an embodiment of the present inventive concept;

FIG. 4D illustrates a plan view showing cell gate electrodes and an erase control gate electrode according to an embodiment of the present inventive concept;

FIGS. 7A to 9A and 11A to 17A illustrate cross-sectional views showing a method of fabricating a three-dimensional semiconductor memory device whose cross-sectional view is shown in FIG. 5A;

FIGS. 7B to 9B and 11B to 17B illustrate cross-sectional views showing a method of fabricating a three-dimensional semiconductor memory device whose cross-sectional view is shown in FIG. 5B;

FIGS. 7C to 9C and 11C to 17C illustrate cross-sectional views showing a method of fabricating a three-dimensional semiconductor memory device whose cross-sectional view is shown in FIG. 5C;

FIG. 22 illustrates a cross-sectional view showing a semiconductor device according to an embodiment of the present inventive concept.

Figure 1A:
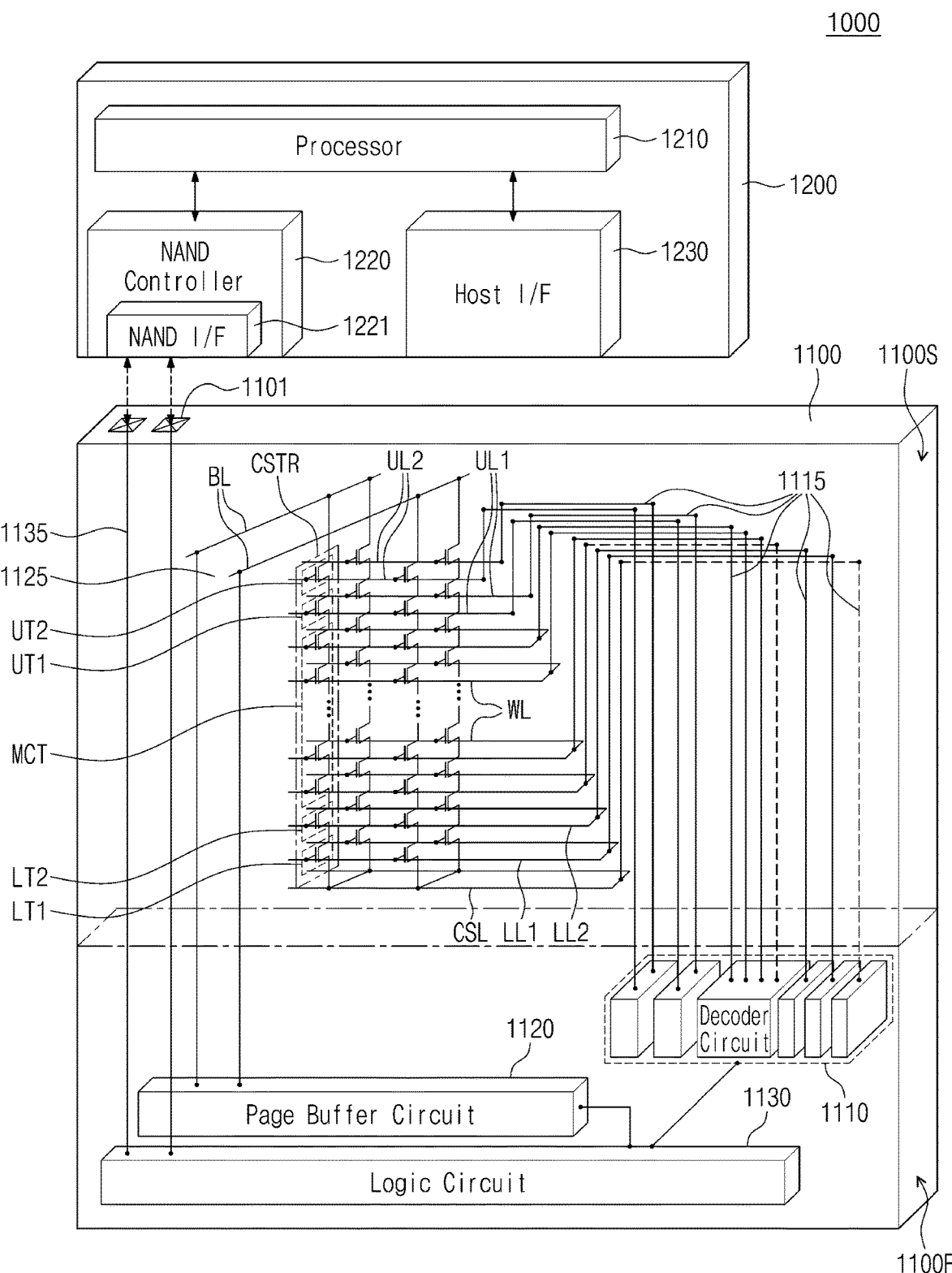
FIG. 1A illustrates a simplified schematic diagram showing an electronic system that includes a semiconductor device according to an embodiment of the present inventive concept.

Since the drawings in FIGS. 1-22 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Embodiments of the present inventive concept will now be described in detail with reference to the accompanying drawings to aid in clearly explaining the present inventive concept.

FIG. 1A illustrates a simplified schematic diagram showing an electronic system that includes a semiconductor device according to an embodiment of the present inventive concept.

Referring to FIG. 1A, an electronic system 1000 according to an embodiment of the present inventive concept may include a semiconductor device 1100 and a controller 1200 electrically connected to the semiconductor device 1100. The electronic system 1000 may be a storage device that includes a single or a plurality of semiconductor devices 1100, or may be an electronic device that includes the storage device. For example, the electronic system 1000 may be, for example, a solid state drive (SSD) device, a universal serial bus (USB), a computing system, a medical apparatus, or a communication apparatus, each of which includes a single or a plurality of semiconductor devices 1100.

The semiconductor device 1100 may be a nonvolatile memory device, such as a NAND Flash memory device. The semiconductor device 1100 may include a first structure 1100F and a second structure 1100S on the first structure 1100F. In an embodiment of the present inventive concept, the first structure 1100F may be disposed on a side of the second structure 1100S. The first structure 1100F may be a peripheral circuit structure that includes a decoder circuit 1110, a page buffer circuit 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR disposed between the bit line BL and the common source line CSL.

For the second structure 1100S, each of the memory cell strings CSTR may include lower transistors LT1 and LT2 adjacent to the common source line CSL, upper transistors UT1 and UT2 adjacent to the bit line BL, and memory cell transistors MCT disposed between the lower transistors LT1 and LT2 and the upper transistors UT1 and UT2. The number of the lower transistors LT1 and LT2 and of the upper transistors UT1 and UT2 may be variously changed in accordance with an embodiment of the present inventive concept.

In an embodiment of the present inventive concept, the upper transistors UT1 and UT2 may include a string selection transistor, and the lower transistors LT1 and LT2 may include a ground selection transistor. The first and second gate lower lines LL1 and LL2 may be gate electrodes of the lower transistors LT1 and LT2, respectively. The word lines WL may be gate electrodes of the memory cell transistors MCT, and the first and second gate upper lines UL1 and UL2 may be gate electrodes of the upper transistors UT1 and UT2, respectively.

In an embodiment of the present inventive concept, the lower transistors LT1 and LT2 may be a lower erase control transistor LT1 and a ground selection transistor LT2 that are connected in series. The upper transistors UT1 and UT2 may be a string selection transistor UT1 and an upper erase control transistor UT2 that are connected in series. One or both of the lower and upper erase control transistors LT1 and UT2 may be employed to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F to the second structure 1100S. The bit lines BL may be electrically connected to the page buffer circuit 1120 through second connection lines 1125 that extend from the first structure 1100F to the second structure 1100S.

For the first structure 1100F, the decoder circuit 1110 and the page buffer circuit 1120 may perform a control operation to at least one selection memory cell transistor among the plurality of memory cell transistors MCT. The logic circuit 1130 may control the decoder circuit 1110 and the page buffer circuit 1120. Each of the decoder circuit 1110, the page buffer circuit 1120 and the logic circuit 1130 may include a plurality of circuit devices. Each of the circuit devices may include, for example, but is not limited to, a transistor. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F to the second structure 1100S.

The controller 1200 may include a processor 1210, a NAND controller 1220, and a host interface (HOST I/F) 1230. In an embodiment of the present inventive concept, the electronic system 1000 may include a plurality of semiconductor devices 1100, and in this case, the controller 1200 may control the plurality of semiconductor devices 1100.

The processor 1210 may control an overall operation of the electronic system 1000 that includes the controller 1200. The processor 1210 may operate based on predetermined firmware, and may control the NAND controller 1220 to access the semiconductor device 1100. The NAND controller 1220 may include a NAND interface (NAND I/F) 1221 that processes communication with the semiconductor device 1100. The NAND interface (NAND I/F) 1221 may be used to transfer therethrough a control command to control the semiconductor device 1100, data which is intended to be written on the memory cell transistors MCT of the semiconductor device 1100, and/or data which is intended to be read from the memory cell transistors MCT of the semiconductor device 1100. The host interface (HOST I/F) 1230 may provide communication between the electronic system 1000 and an external host. When a control command is received through the host interface (HOST I/F) 1230 from an external host, the processor 1210 may control the semiconductor device 1100 in response to the control command.

Figure 1B:
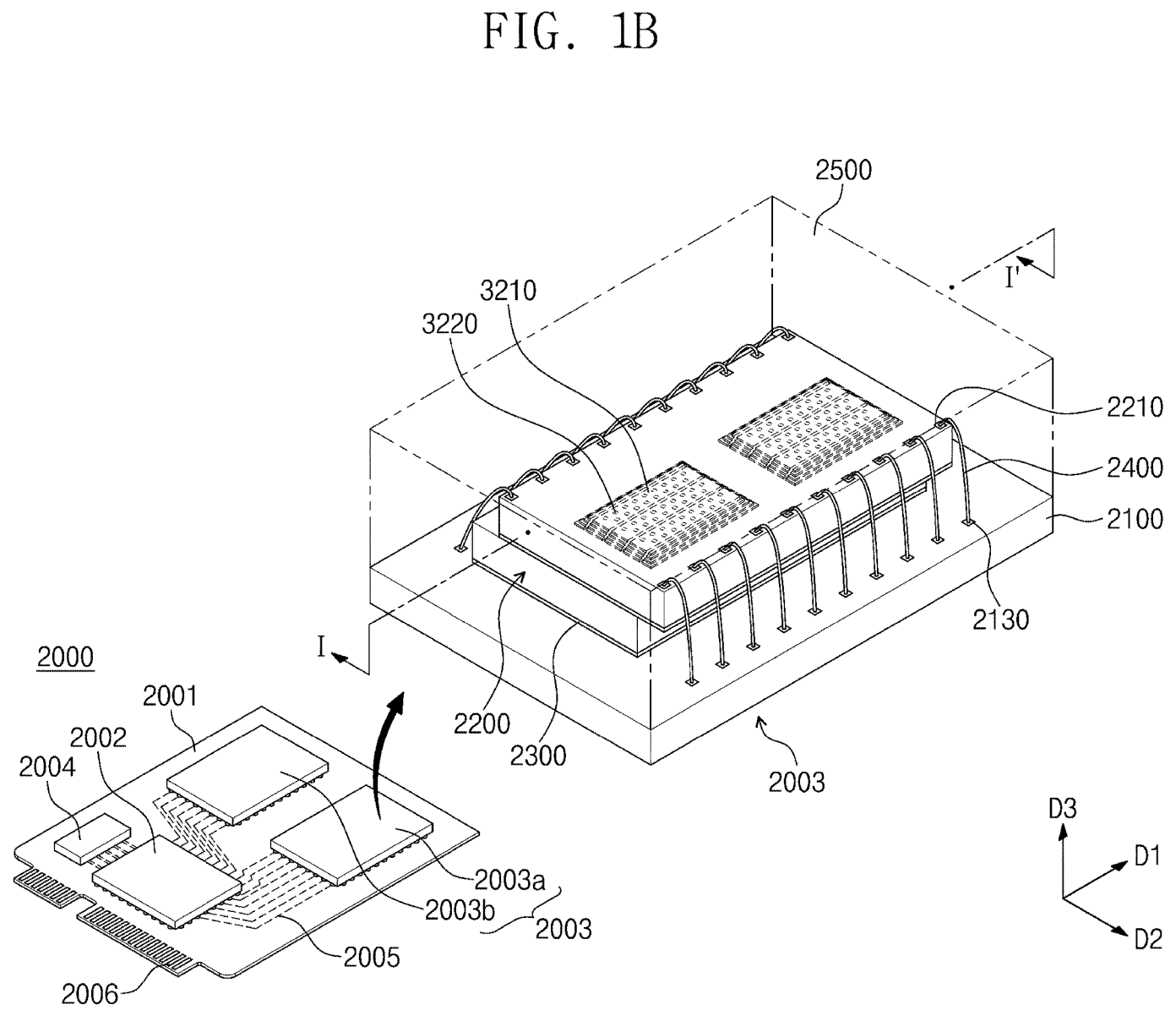

FIG. 1B illustrates a simplified perspective view showing an electronic system that includes a semiconductor device according to an embodiment of the present inventive concept.

Referring to FIG. 1B, an electronic system 2000 according to an embodiment of the present inventive concept may include a main board 2001, a controller 2002 mounted on the main board 2001, at least one semiconductor package 2003, and a dynamic random access memory (DRAM) device 2004. The semiconductor package 2003 and the DRAM device 2004 may be connected to the controller 2002 through wiring patterns 2005 formed on the main board 2001.

The main board 2001 may include a connector 2006 including a plurality of pins that are connected to an external host. The number and arrangement of the plurality of pins on the connector 2006 may be changed based on a communication interface between the electronic system 2000 and the external host. In an embodiment of the present inventive concept, the electronic system 2000 may communicate with the external host through one or more interfaces, for example, universal serial bus (USB), peripheral component interconnect express (PIC-Express), serial advanced technology attachment (SATA), and/or M-PHY for universal flash storage (UFS). In an embodiment of the present inventive concept, the electronic system 2000 may operate with power supplied through the connector 2006 from the external host. The electronic system 2000 may further include a power management integrated circuit (PMIC) by which the power supplied from the external host is distributed to the controller 2002 and the semiconductor package 2003.

The controller 2002 may write data to the semiconductor package 2003, may read data from the semiconductor package 2003, or may increase an operating speed of the electronic system 2000.

The DRAM device 2004 may be a buffer memory that reduces a difference in speed between the external host and the semiconductor package 2003 that serves as a data storage space. The DRAM device 2004 included in the electronic system 2000 may operate as a kind of cache memory, and may provide a space for temporary data storage in a control operation of the semiconductor package 2003. When the DRAM device 2004 is included in the electronic system 2000, the controller 2002 may include not only a NAND controller for controlling the semiconductor package 2003, but a DRAM controller for controlling the DRAM device 2004.

The semiconductor package 2003 may include first and second semiconductor packages 2003a and 2003b that are spaced apart from each other. Each of the first and second semiconductor packages 2003a and 2003b may include a plurality of semiconductor chips 2200. Each of the first and second semiconductor packages 2003a and 2003b may include a package substrate 2100, semiconductor chips 2200 disposed on the package substrate 2100, adhesive layers 2300 correspondingly disposed on bottom surfaces of the semiconductor chips 2200, connection structures 2400 that electrically connect the semiconductor chips 2200 to the package substrate 2100, and a molding layer 2500 on the package substrate 2100 and covering the semiconductor chips 2200 and the connection structures 2400. Although only the first and second semiconductor packages 2003a and 2003b are illustrated, the present inventive concept is not limited thereto. For example, the number of the semiconductor packages is not limited to two, and the electronic system 2000 may include one or more than two semiconductor packages.

The package substrate 2100 may be an integrated circuit board including package upper pads 2130. Each of the semiconductor chips 2200 may include one or more input/output pads 2210. The input/output pad 2210 may correspond to the input/output pad 1101 of FIG. 1A. Each of the semiconductor chips 2200 may include stack structures 3210 and vertical structures 3220. Each of the semiconductor chips 2200 may include a semiconductor device according to an embodiment of the present inventive concept which will be discussed below.

In an embodiment of the present inventive concept, the connection structures 2400 may be bonding wires that electrically connect the input/output pads 2210 to the package upper pads 2130. Therefore, on each of the first and second semiconductor packages 2003a and 2003b, the semiconductor chips 2200 may be electrically connected to each other in a wire bonding manner, and may be electrically connected to the package upper pads 2130 of the package substrate 2100. In an embodiment of the present inventive concept, on each of the first and second semiconductor packages 2003a and 2003b, the semiconductor chips 2200 may be electrically connected to each other using through silicon via (TSV) instead of the connection structures 2400 or the bonding wires.

In an embodiment of the present inventive concept, the controller 2002 and the semiconductor chips 2200 may be included in a single package. For example, the controller 2002 and the semiconductor chips 2200 may be mounted on an interposer substrate other than the main board 2001, and may be connected to each other through wiring lines formed on the interposer substrate.

Figure 1C:
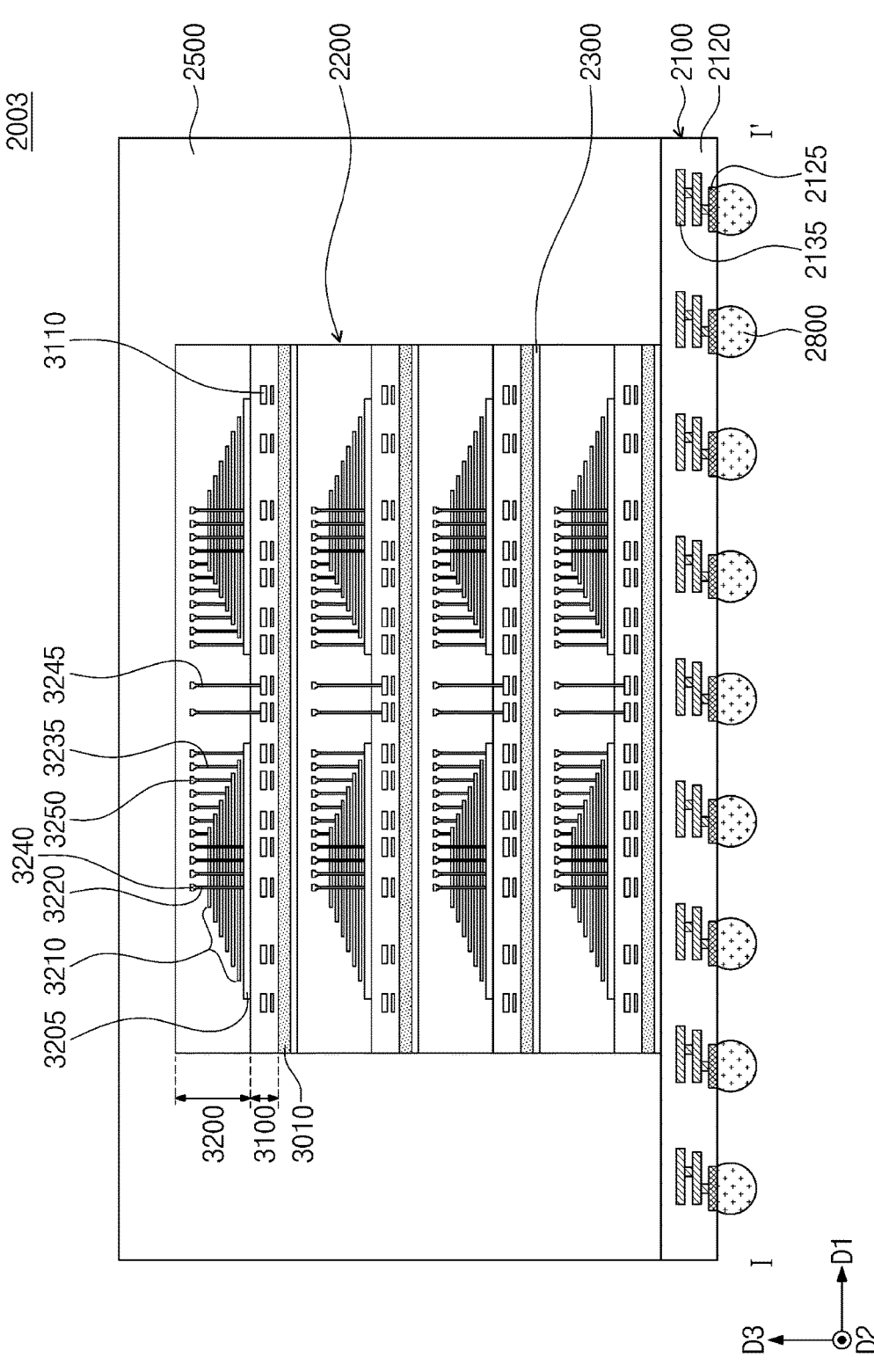
FIGS. 1C and 1D illustrate simplified cross-sectional views showing a semiconductor package according to an embodiment of the present inventive concept.
Figure 1D:
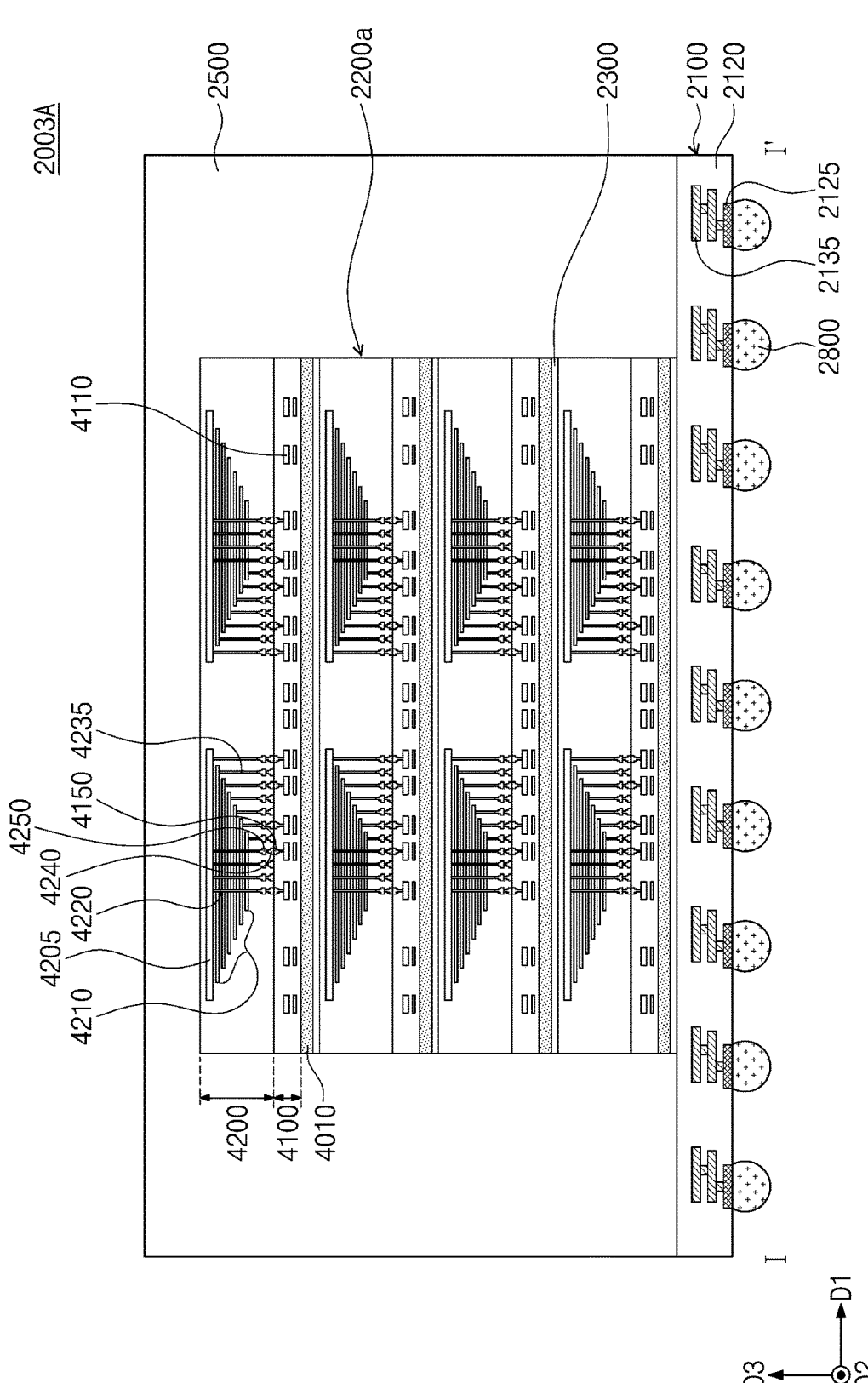

FIGS. 1C and 1D illustrate simplified cross-sectional views each showing a semiconductor package according to an embodiment of the present inventive concept. FIGS. 1C and 1D each depicts an exemplary embodiment of the semiconductor package shown in FIG. 1B, conceptually showing a cross-section taken along line I-I' of the semiconductor package shown in FIG. 1B.

Referring to FIG. 1C, a printed circuit board (PCB) may be used as the package substrate 2100 of the semiconductor package 2003. The package substrate 2100 may include a package substrate body 2120, package upper pads (see 2130 of FIG. 1B) disposed on a top surface of the package substrate body 2120, lower pads 2125 disposed or exposed on a bottom surface of the package substrate body 2120, and internal lines 2135 through which the upper pads 2130 and the lower pads 2125 are electrically connected within the package substrate body 2120. The upper pads 2130 may be electrically connected to the connection structures 2400. The lower pads 2125 may be connected through conductive connection parts 2800 to the wiring patterns 2005 on the main board 2001 of the electronic system 2000, as shown in FIG. 1B.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral wiring lines 3110. The second structure 3200 may include a source structure 3205, a stack structure 3210 on the source structure 3205, vertical structures 3220 penetrate the stack structure 3210, bit lines 3240 electrically connected to the vertical structures 3220, and cell contact plugs 3235 electrically connected to the word lines (see WL of FIG. 1A) of the stack structure 3210. Each of the first structure 3100, the second structure 3200, and the semiconductor chips 2200 may further include separation structures which will be discussed below.

Each of the semiconductor chips 2200 may include one or more through lines 3245 that are electrically connected to the peripheral wiring lines 3110 of the first structure 3100 and extend into the second structure 3200. The through line 3245 may be disposed outside the stack structure 3210 and may further be disposed to penetrate the stack structure 3210. Each of the semiconductor chips 2200 may further include input/output pads (see 2210 of FIG. 1B) electrically connected to the peripheral wiring lines 3110 of the first structure 3100.

Referring to FIG. 1D, in a semiconductor package 2003A, each of semiconductor chips 2200a may include a semiconductor substrate 4010, a first structure 4100 on the semiconductor substrate 4010, a second structure 4200 to which the first structure 4100 is bonded in a wafer bonding manner on the first structure 4100.

The first structure 4100 may include a peripheral circuit region including peripheral wiring lines 4110 and first bonding structures 4150. The second structure 4200 may include a source structure 4205, a stack structure 4210 disposed between the source structure 4205 and the first structure 4100, vertical structures 4220 that penetrate the stack structure 4210, and second bonding structures 4250 that are connected to corresponding vertical structures 4220 and corresponding word lines (see WL of FIG. 1A) of the stack structure 4210. For example, the second bonding structures 4250 may be electrically connected to the vertical structures 4220 and the word lines (see WL of FIG. 1) through bit lines 4240 electrically connected to the vertical structures 4220 and through cell contact plugs 4235 electrically connected to the word lines (see WL of FIG. 1A). The first bonding structures 4150 of the first structure 4100 and the second bonding structures 4250 of the second structure 4200 may be bonded to each other while being in contact with each other. The first and second bonding structures

4150 and 4250 may have their bonding portions formed of, for example, copper (Cu). For example, when the first and second bonding structures 4150 and 4250 are formed of copper (Cu), the first and second bonding structures 4150 and 4250 may be physically and electrically connected to each other by a copper (Cu)-copper (Cu) bonding method.

Each of the first structure 4100, the second structure 4200, and the semiconductor chip 2200a may further include a source structure which will be discussed below. Each of the semiconductor chips 2200a may further include input/output pads (see 2210 of FIG. 1B) electrically connected to the peripheral wiring lines 4110 of the first structure 4100.

The semiconductor chips 2200 of FIG. 1C may be electrically connected to each other through the connection structures (see 2400 of FIG. 1B) shaped like bonding wires, and the same may be true for the semiconductor chips 2200a of FIG. 1D. In an embodiment of the present inventive concept, connection structures such as through silicon vias (TSV) may be used such that semiconductor chips, for example, the semiconductor chips 2200 of FIG. 1C or the semiconductor chips 2200a of FIG. 1D, are electrically connected in a single semiconductor package.

The first structure 3100 of FIG. 1C and the first structure 4100 of FIG. 1D may correspond to a peripheral circuit structure in embodiments which will be discussed below, and the second structure 3200 of FIG. 1C and the second structure 4200 of FIG. 1D may correspond to a cell array structure in embodiments which will be discussed below.

Figure 2A:
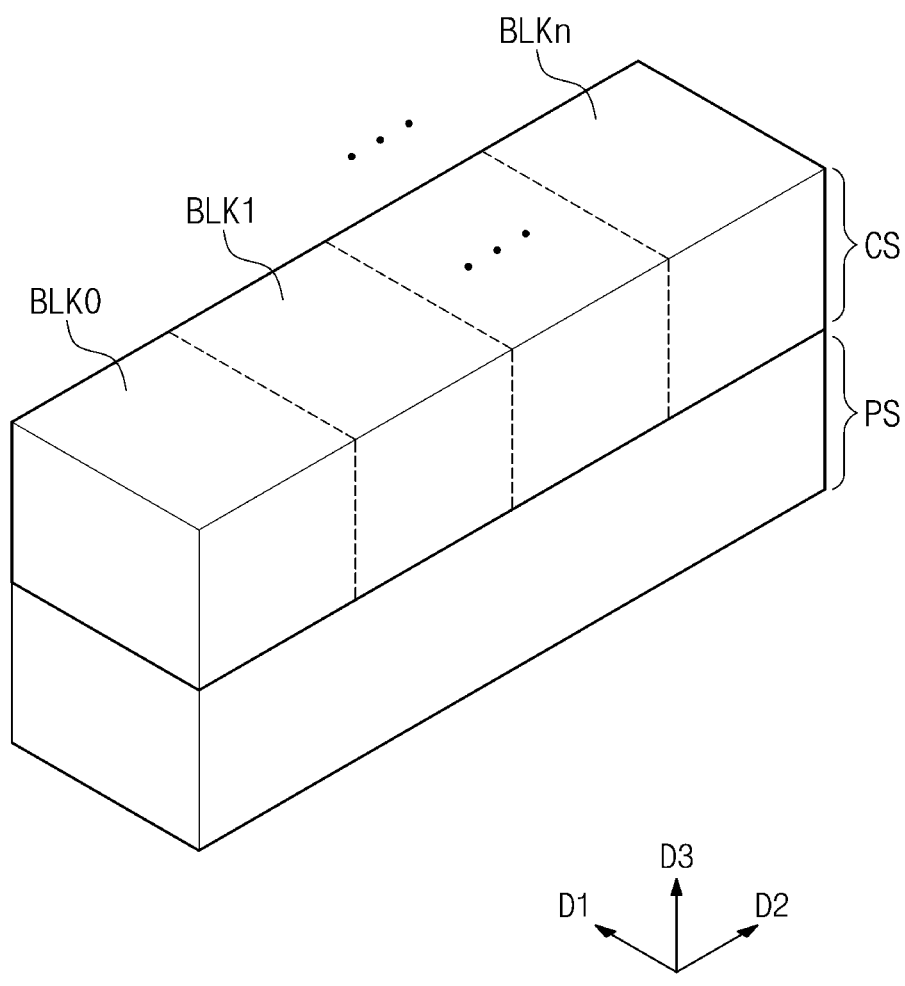
FIG. 2A illustrates a block diagram showing a three-dimensional semiconductor memory device according to an embodiment of the present inventive concept.

FIG. 2A illustrates a block diagram showing a three-dimensional semiconductor memory device according to an embodiment of the present inventive concept.

Referring to FIG. 2A, a three-dimensional semiconductor memory device according to an embodiment of present inventive concept may include a peripheral circuit structure PS, a cell array structure CS on the peripheral circuit structure PS, and a wiring structure that connects the cell array structure CS to the peripheral circuit structure PS. The three-dimensional semiconductor memory device of FIG. 2A may correspond to the semiconductor device 1100 of FIG. 1A. The peripheral circuit structure PS may correspond to the first structure 1100F of FIG. 1A, and may include row and column decoder circuits, a page buffer circuit, and control circuits. The cell array structure CS may correspond to the second structure 1100S of FIG. 1A, and may include a plurality of memory blocks BLK0 to BLKn each of which is a data erase unit. Each of the memory blocks BLK0 to BLKn may include a memory cell array having a three-dimensional structure (or vertical structure). For example, the memory blocks BLK0 to BLKn may be connected to a decoder circuit (see 1110 of FIG. 1A) via the word lines (see WL of FIG. 1A), the string selection line (see UL1 of FIG. 1A), the ground selection line (see LL2 of FIG. 1A), and the lower and upper erase control lines (see LL1 and UL2 of FIG. 1A). Further, the memory blocks BLK0 to BLKn may be connected to a page buffer circuit (see 1120 of FIG. 1A) via the bit lines (see BL of FIG. 1A).

Figure 2B:
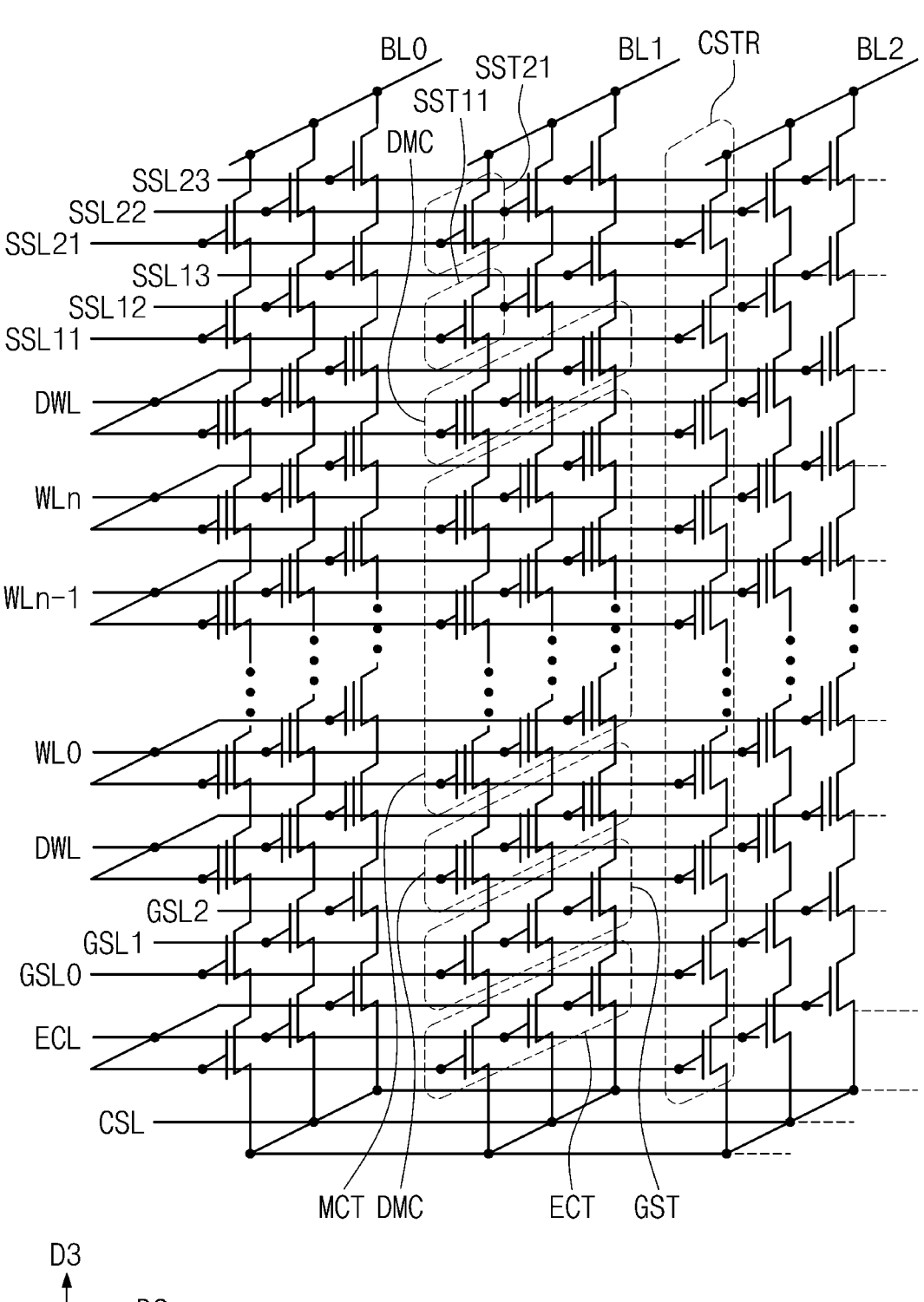
FIG. 2B illustrates a circuit diagram showing a cell array of a three-dimensional semiconductor memory device according to an embodiment of the present inventive concept.

FIG. 2B illustrates a circuit diagram showing a cell array of a three-dimensional semiconductor memory device according to an embodiment of the present inventive concept. The circuit diagram of FIG. 2B depicts a detailed circuit of the configuration shown in the second structure 1100S of FIG. 1A.

Referring to FIG. 2B, in each of the memory blocks BLK0 to BLKn of FIG. 2A, cell strings CSTR may be two-dimensionally arranged along first and second directions D1 and D2 and may extend along a third direction D3. A plurality of cell strings CSTR may be connected in parallel to each of bit lines BL0 to BL2. The plurality of cell strings CSTR may be connected in common to a common source line CSL and provided between the common source line CSL and the bit lines BL0 to BL2. In an embodiment of the present inventive concept, the common source line CSL may be provided in plurality, with the plurality of common source lines CSL supplied with the same voltage, or in some instances independently controlled and supplied with voltages different from each other.

One of the cell strings CSTR may include string selection transistors SST21 and SST11 connected in series, memory cell transistors MCT connected in series, a ground selection transistor GST, and an erase control transistor ECT. The string selection transistors SST21 and SST11 may correspond to the upper transistors UT1 and UT2 of FIG. 1A. The ground selection transistor GST may correspond to the lower transistor LT2 of FIG. 1A. The erase control transistor ECT may correspond to the lower transistor LT1 of FIG. 1A.

Each of the memory cell transistors MCT may include a data storage element. One of the cell strings CSTR may further include dummy cells DMC between the string selection transistor SST11 and the memory cell transistor MCT and between the ground selection transistor GST and the memory cell transistor MCT. Other cell strings CSTR may have an identical or similar structure to that discussed above.

The string selection transistor SST11 may be controlled by a string selection line SSL11, and the string selection transistor SST21 may be controlled by a string selection line SSL21. The memory cell transistors MCT may be controlled by corresponding word lines WL0 to WLn, and the dummy cells DMC may be controlled by corresponding dummy word lines DWL. The ground selection transistor GST may be controlled by a ground selection line GSL0, GSL1, or GSL2, and the erase control transistor ECT may be controlled by an erase control line ECL. For example, the erase control line ECL, the ground selection line GSL0, GSL1, or GSL2, the dummy word lines DWL, the word lines WL0 to WLn, and the string selection lines SSL11, SSL12, or SSL13 and SSL21, SSL22, or SSL23, which are disposed between the common source line CSL and the bit lines BL0 to BL2, may be used as gate electrodes of the erase control transistor ECT, the ground selection transistor GST, the dummy cells DMC, the memory cell transistors MCT, and the string selection transistors SST11 and SST21, respectively.

The memory cell transistors MCT may include gate electrodes at substantially the same distance from the common source line CSL, and the gate electrodes may be connected in common to one of the word lines WL0 to WLn and DWL and thus may have the same potential state. Thus, the word lines WL0 to WLn may act as the gate electrodes of the memory cell transistors MCT. Alternatively, although the gate electrodes of the memory cell transistors MCT are disposed at substantially the same distance from the common source line CSL, the gate electrodes disposed at different rows or columns may be controlled independently of each other. For example, since one cell string CSTR includes the memory cell transistors MCT respectively located at different levels from the common source line CSL, the word lines WL0 to WLn, which may act as gate electrodes for the memory cell transistors MCT, may respectively located at different levels from each other between the common source line CSL and the bit lines BL, and may be provided with potential states the same as or different from each other. In an embodiment of the present inventive concept, the ground and string select transistors GST and SST (SST11 and SST21) and the memory cell transistors MCT may be metal-oxide-semiconductor (MOS) field effect transistors (FETs) using a vertical channel structure as channel regions.

String selection lines SSL11 to SSL13 may be separated from each other. String selection lines SSL21 to SSL23 may be separated from each other. Ground selection lines GSL0 to GSL2 may be separated from each other. The ground selection lines GSL0 to GSL2 may one-to-one correspond to the string selection lines SSL21 to SSL23 (and/or the string selection lines SSL11 to SSL13). Therefore, the ground selection lines GSL0 to GSL2 may be divided corresponding to the string selection lines SSL21 to SSL23, and may correspondingly control the cell strings CSTR. Accordingly, a three-dimensional semiconductor memory device may enhance in program/read/erase operating properties.

Figure 3:
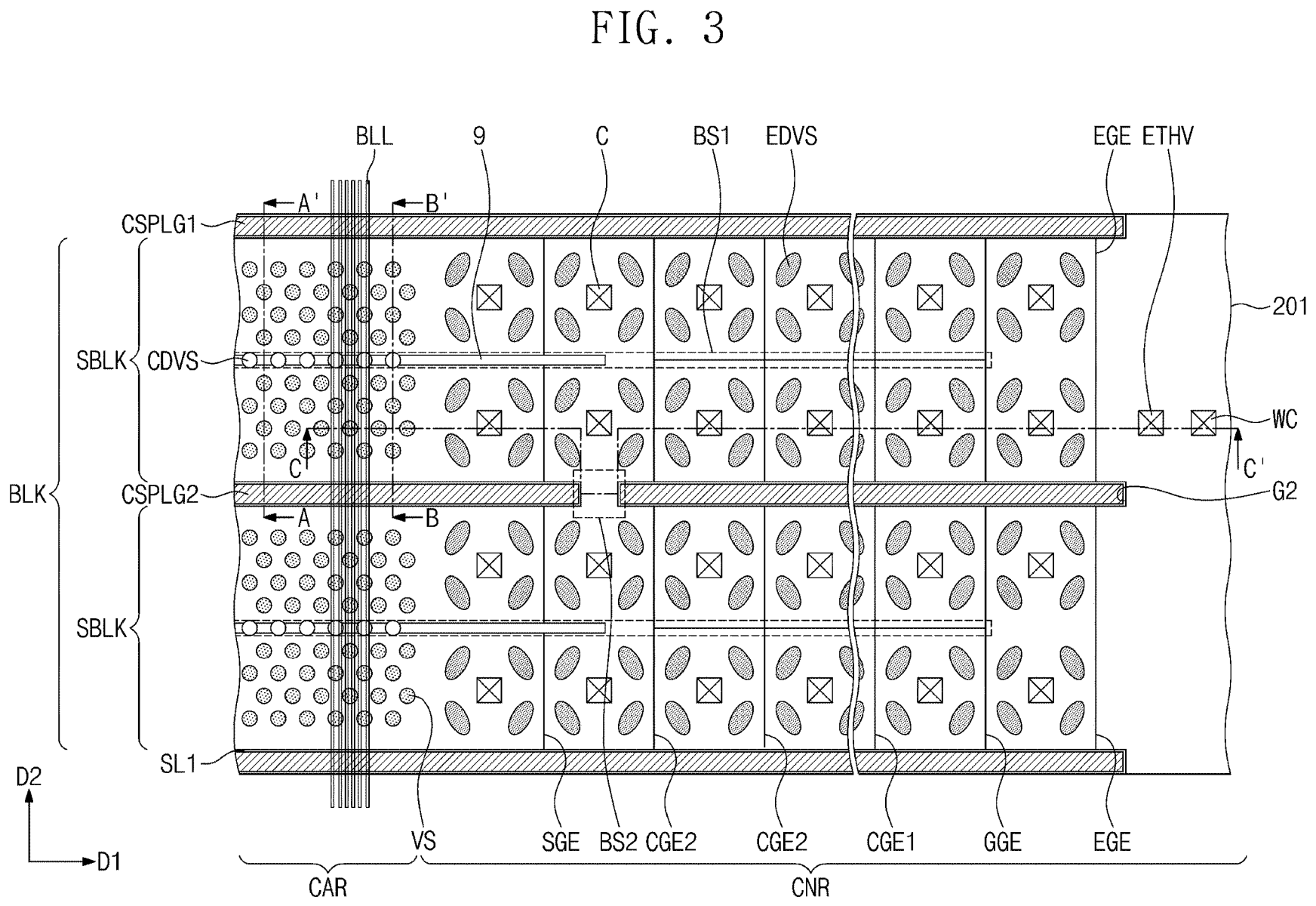
Figure 4A:
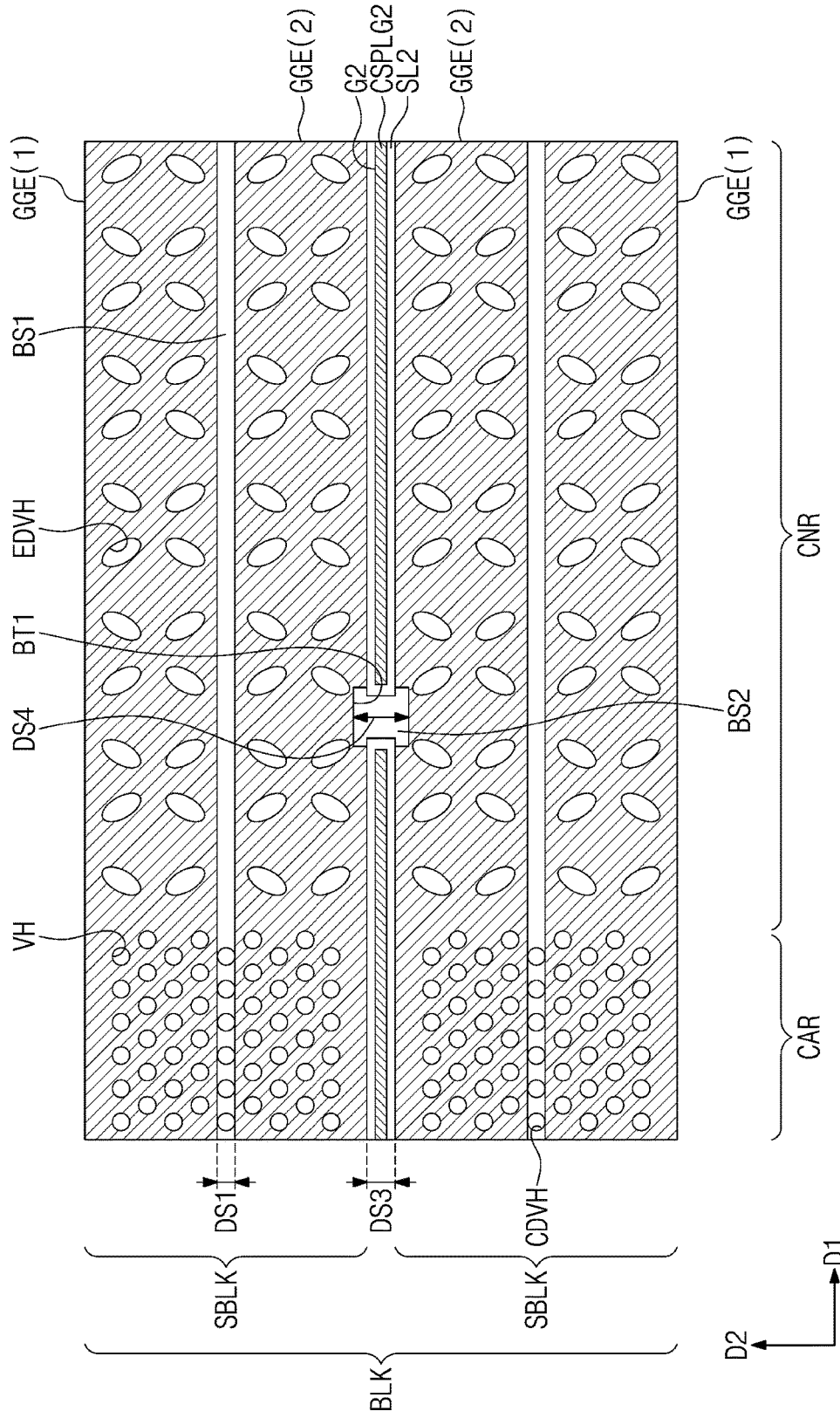
FIG. 4A illustrates a plan view showing ground selection gate electrodes according to an embodiment of the present inventive concept.
Figure 4B:
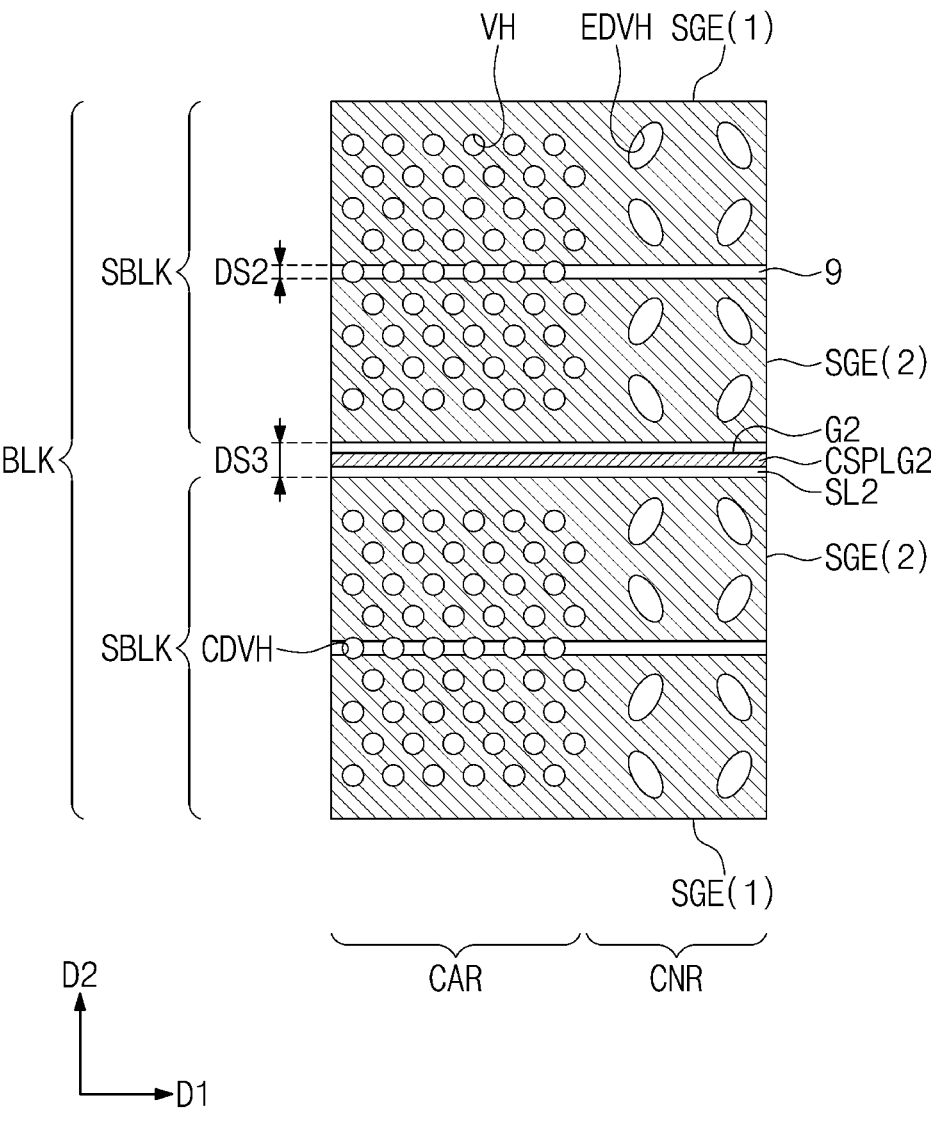
FIG. 4B illustrates a plan view showing string selection gate electrodes according to an embodiment of the present inventive concept.
Figure 4C:
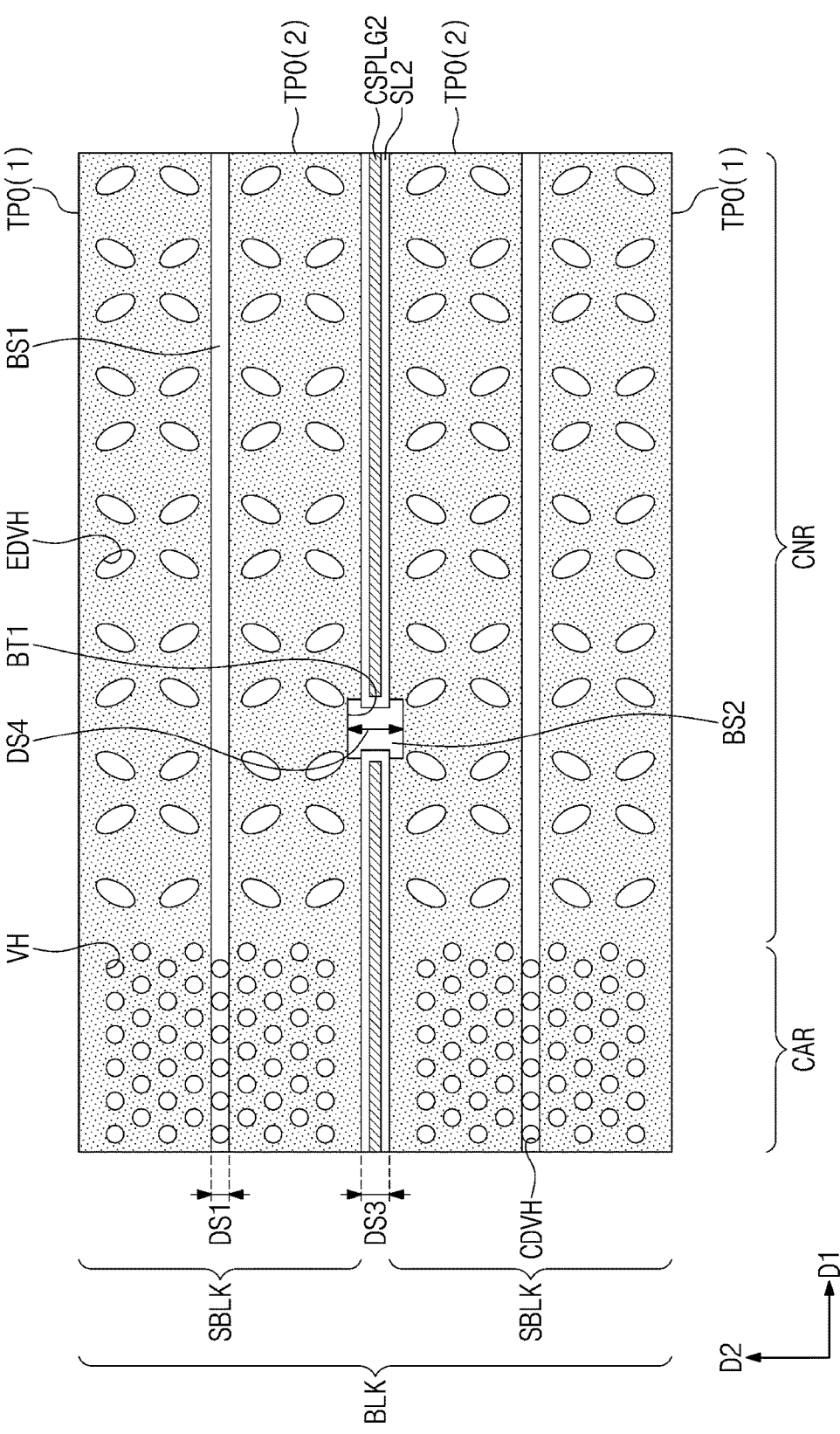
FIG. 4C illustrates a plan view showing a polishing stop pattern according to an embodiment of the present inventive concept.
Figure 4D:
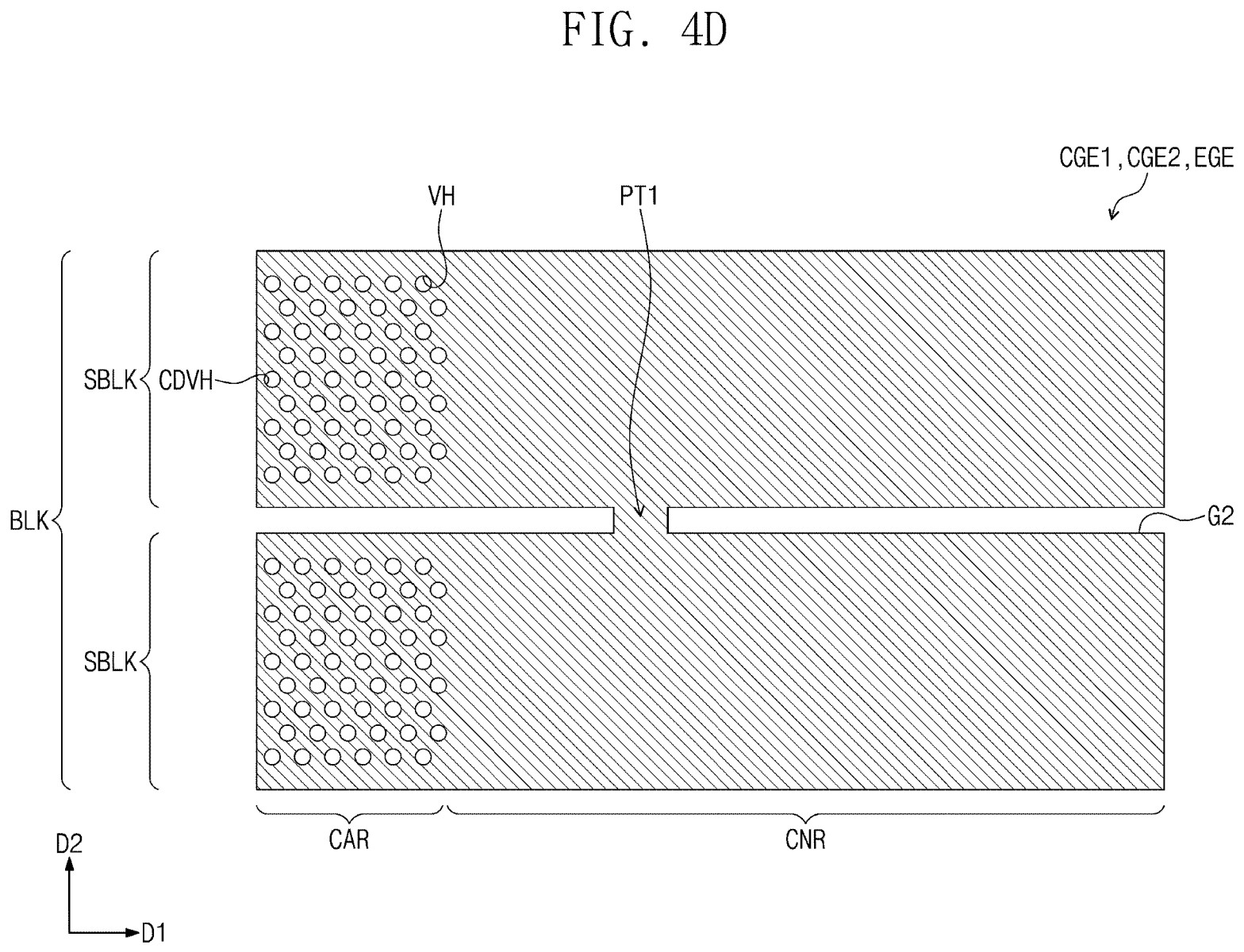
Figure 5A:
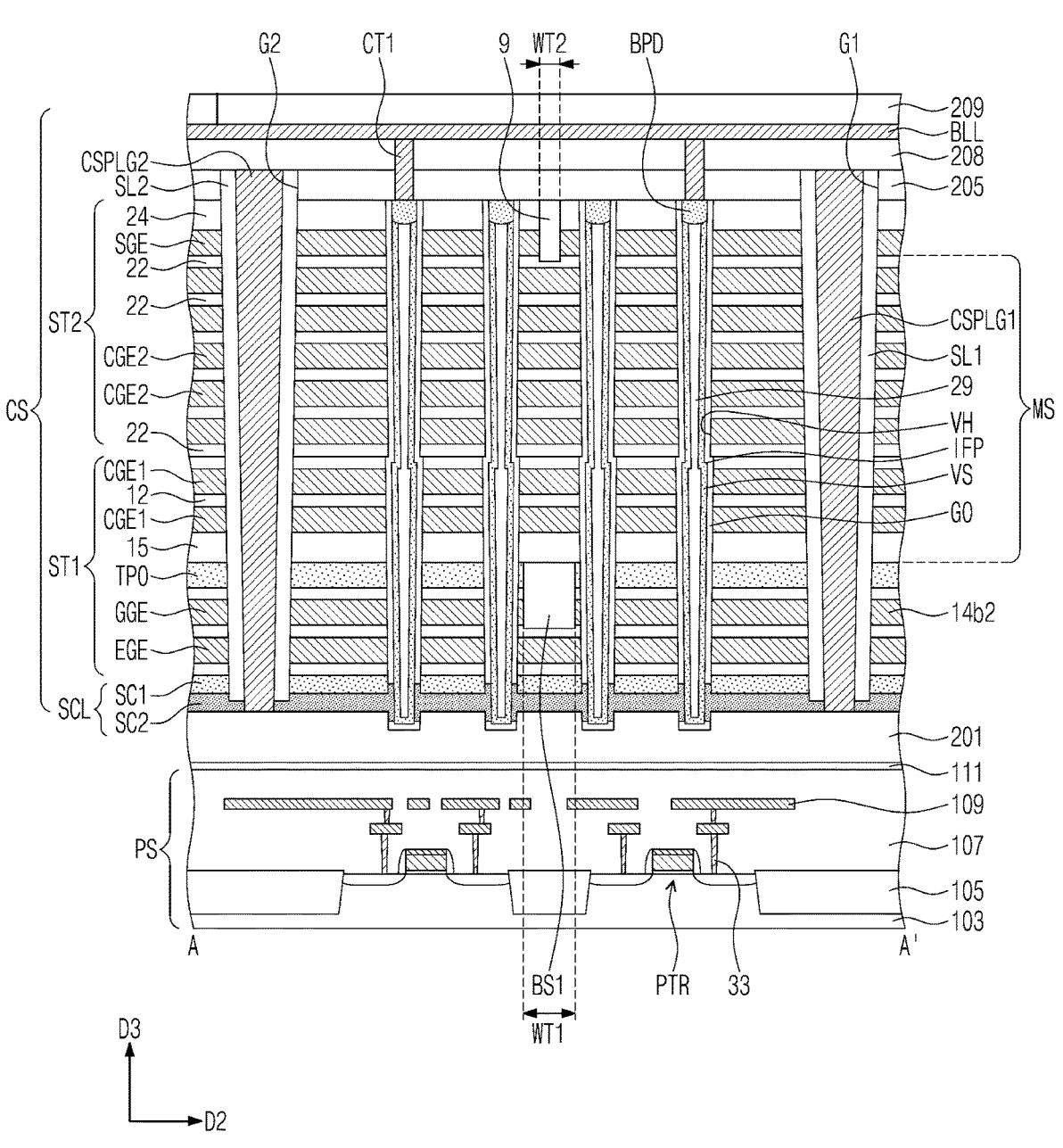
FIG. 5A illustrates a cross-sectional view taken along line A-A' of FIG. 3.
Figure 5B:
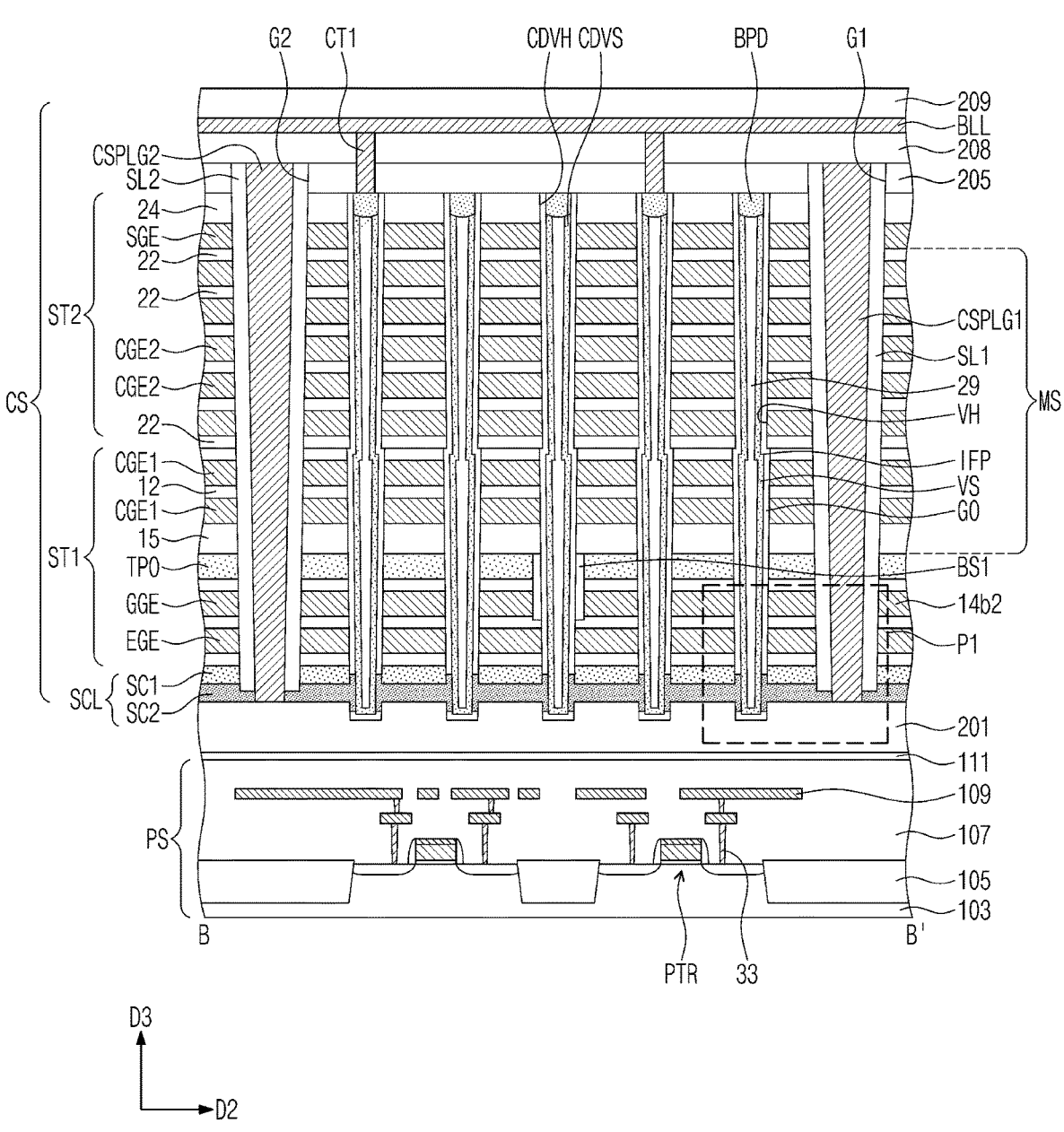
FIG. 5B illustrates a cross-sectional view taken along line B-B' of FIG. 3.
Figure 5C:
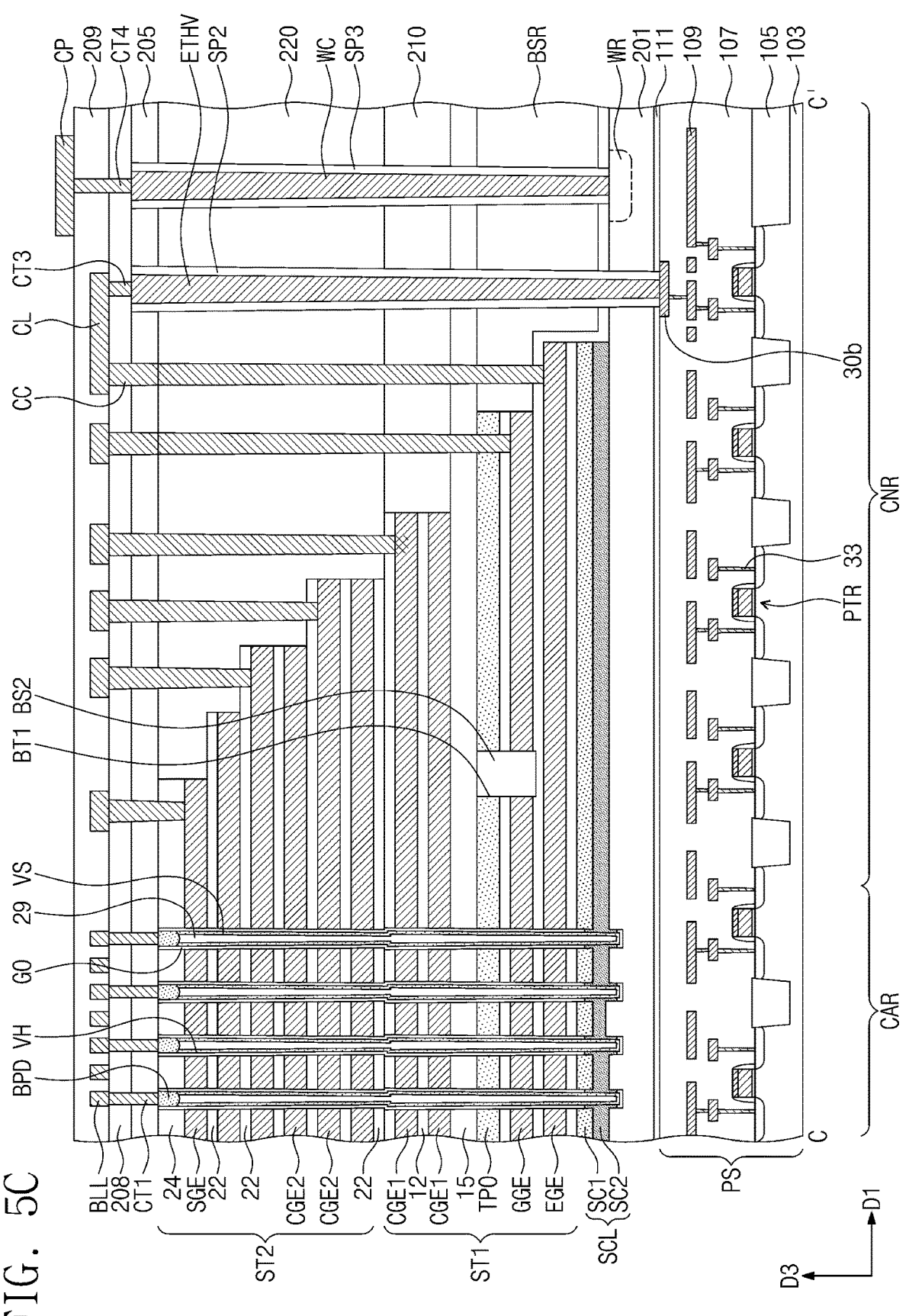
FIG. 5C illustrates a cross-sectional view taken along line C-C' of FIG. 3.
Figure 6:
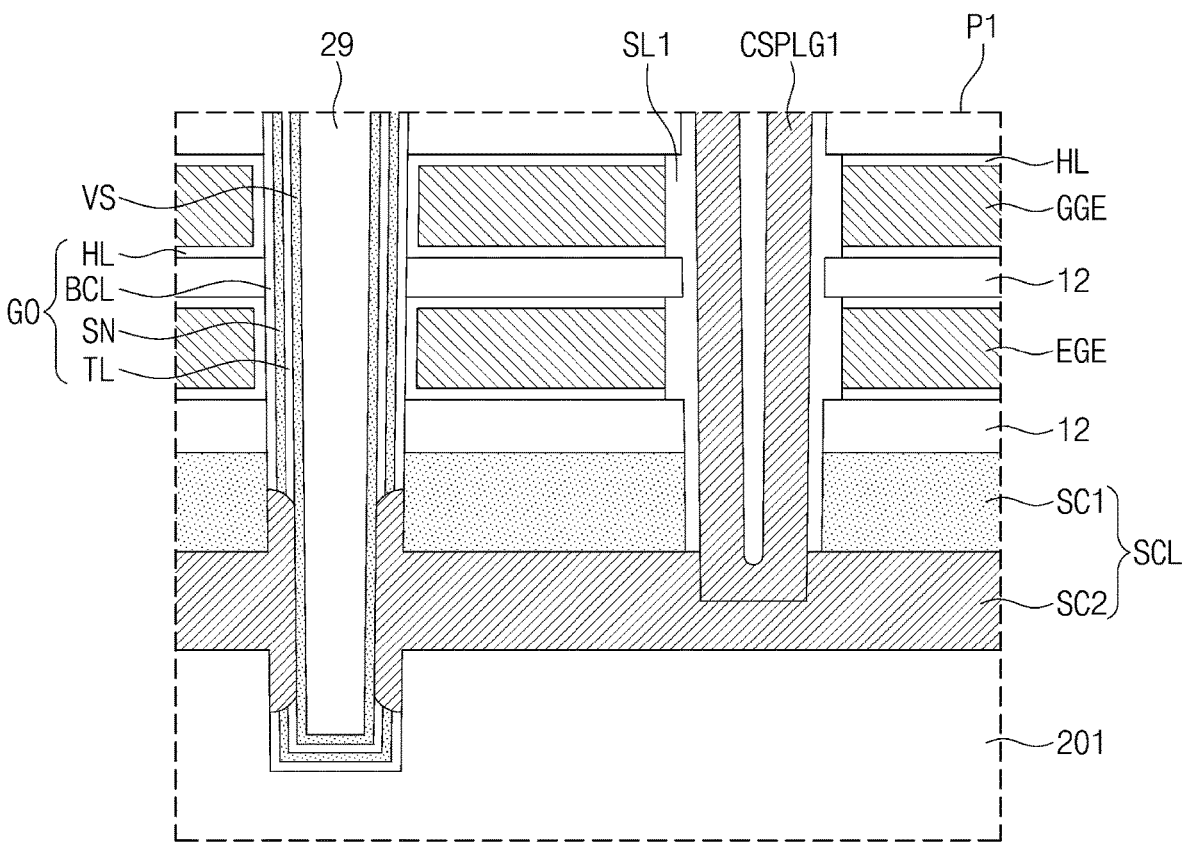
FIG. 6 illustrates an enlarged view showing section P1 of FIG. 5B.

FIG. 3 illustrates a plan view showing a three-dimensional semiconductor memory device according to an embodiment of the present inventive concept. FIG. 4A illustrates a plan view showing ground selection gate electrodes according to an embodiment of the present inventive concept. FIG. 4B illustrates a plan view showing string selection gate electrodes according to an embodiment of the present inventive concept. FIG. 4C illustrates a plan view showing a polishing stop pattern according to an embodiment of the present inventive concept. FIG. 4D illustrates a plan view showing cell gate electrodes and an erase control gate electrode according to an embodiment of the present inventive concept. FIG. 5A illustrates a cross-sectional view taken along line A-A' of FIG. 3. FIG. 5B illustrates a cross-sectional view taken along line B-B' of FIG. 3. FIG. 5C illustrates a cross-sectional view taken along line C-C' of FIG. 3. FIG. 6 illustrates an enlarged view showing section P1 of FIG. 5B.

Referring to FIGS. 3 to 6, a cell array structure CS may be disposed on a peripheral circuit structure PS. The cell array structure CS may include blocks BLK that are arranged parallel to a second direction D2. The blocks BLK may correspond to the memory blocks BLK0 to BLKn of FIG. 2A. Most of the blocks BLK may be memory blocks where data program/read/erase operations are performed. Alternatively, a portion of the blocks BLK may be a dummy block where data program/read/erase operations are not performed. The blocks BLK may be correspondingly separated by first separation dielectric lines SL1. FIG. 3 depicts one of the blocks BLK.

The first separation dielectric line SL1 may extend in a first direction D1 that intersects the second direction D2. The first separation dielectric line SL1 may be disposed in a first groove G1. The first separation dielectric line SL1 may have a single-layered or multi-layered structure including at least one selected from, for example, a silicon oxide ($SiO_2$) layer, a silicon nitride ($Si_3N_4$) layer, a silicon oxynitride (SiON) layer, and a porous dielectric layer. The blocks BLK may each include a cell array region CAR and a connection region CNR disposed on opposite ends of the cell array region CAR.

A second separation dielectric line SL2 may extend in the first direction D1 while passing through a center of the block BLK, and the second separation dielectric line SL2 may divide the block BLK into two sub-blocks SBLK. The second separation dielectric line SL2 may not be cut on the cell array region CAR and may extend toward the connection region CNR. On the connection region CNR, the second separation dielectric line SL2 may be cut into two pieces. The second separation dielectric line SL2 may be disposed in a second groove G2.

The peripheral circuit structure PS may include a first substrate 103. The first substrate 103 may be a single-crystalline silicon (sc-Si) substrate or a silicon-on-insulator (SOI) substrate. Alternatively, the first substrate 103 may be a germanium (Ge) substrate, a silicon-germanium (SiGe) substrate, a III-V compound semiconductor substrate, a single-crystalline epitaxial layer grown on a single-crystalline silicon (sc-Si) substrate, a germanium-on-insulator (GOI) substrate, or a combination thereof. The first substrate 103 may have therein a device isolation layer 105 that defines active areas. The active areas may be provided thereon with peripheral transistors PTR. The peripheral transistors PTR may each include a peripheral gate electrode, a peripheral gate dielectric layer, and peripheral source/drain sections disposed in the first substrate 103 adjacent to opposite sides of the peripheral gate dielectric layer. The peripheral circuit structure PS may include various active elements such as transistors, as well as various passive elements such as capacitors, resistors, and inductors. The peripheral transistors PTR may be covered with a peripheral interlayer dielectric layer 107. The peripheral interlayer dielectric layer 107 may have a single-layered or multi-layered structure including at least one selected from, for example, a silicon oxide ($SiO_2$) layer, a silicon nitride ($Si_3N_4$) layer, a silicon oxynitride (SiON) layer, and a porous dielectric layer. The peripheral interlayer dielectric layer 107 may be provided therein with peripheral lines 109 and peripheral contacts 33. The peripheral lines 109 and the peripheral contacts 33 may include a conductive layer.

Some of the peripheral lines 109a and the peripheral contacts 33 may be electrically connected to the peripheral transistors PTR. The peripheral lines 109a and the peripheral transistors PTR may constitute the page buffer circuit 1120 and the decoder circuit 1110 of FIG. 1A. The peripheral circuit structure PS may include peripheral conductive pads 30b disposed at top thereof.

An etch stop layer 111 may be disposed on the peripheral circuit structure PS. The etch stop layer 111 may include a material having an etch selectivity with respect to materials of the peripheral interlayer dielectric layer 107 and a second substrate 201 which will be discussed below. For example, the etch stop layer 111 may include silicon nitride ($Si_3N_4$) or silicon oxide ($SiO_2$). The etch stop layer 111 may be called an adhesive layer.

Each of the blocks BLK included in the cell array structure CS may include a second substrate 201, a source structure SCL, a first sub-stack structure ST1, a second sub-stack structure ST2, and first, second, and third upper interlayer dielectric layers 205, 208, and 209 that are sequentially stacked. The first sub-stack structure ST1 may include first gate electrodes EGE, GGE, and CGE1, first electrode interlayer dielectric layers 12 that are alternately stacked with the first gate electrodes EGE, GGE, and CGE1, a capping interlayer dielectric layer 15, and a polishing stop pattern TPO. The second sub-stack structure ST2 may include second gate electrodes CGE2 and SGE, second electrode interlayer dielectric layers 22 that are alternately stacked with the second gate electrodes CGE2 and SGE, and an uppermost second electrode interlayer dielectric layer 24 positioned at top of the second sub-stack structure ST2.

The second substrate 201 may be, for example, a single-crystalline silicon (sc-Si) layer, a silicon (Si) epitaxial layer, or a silicon-on-insulator (SOI) substrate. Alternatively, the second substrate 201 may be a germanium (Ge) substrate, a silicon-germanium (SiGe) substrate, a III-V compound semiconductor substrate, a single-crystalline epitaxial layer grown on a single-crystalline silicon (sc-Si) substrate, a germanium-on-insulator (GOI) substrate, or a combination thereof. The second substrate 201 may be, for example, doped with impurities having a first conductivity type. The first conductivity impurities may be, for example, p-type boron (B). Alternatively, the first conductivity impurities may be n-type arsenic (As) or phosphorus (P). However, the present inventive concept is not limited thereto. In an embodiment of the present inventive concept, the second substrate 201 may include a p-type bulk silicon (Si) substrate and an n-type epitaxial layer grown on the p-type bulk silicon (Si) substrate. In an example embodiment of the present inventive concept, the second substrate 201 may include an n-type bulk silicon (Si) substrate and a p-type or n-type epitaxial layer grown thereon.

Referring to FIGS. 5A to 5C, the first gate electrodes EGE, GGE, and CGE1 may be an erase control gate electrode EGE, a ground selection gate electrode GGE, and first cell gate electrodes CGE1 in a sequence from bottom to top. The second gate electrodes CGE2 and SGE may be second cell gate electrodes CGE2 and a string selection gate electrode SGE in a sequence from bottom to top. The first cell gate electrodes CGE1 and the second cell gate electrodes CGE2 may be referred to as electrode layers.

Referring to FIG. 5A, a middle stack structure MS may collectively indicate layers from the capping interlayer dielectric layer 15 to the second electrode interlayer dielectric layer 22 below the string selection gate electrode SGE. The string selection gate electrode SGE may be positioned on the middle stack structure MS, and the polishing stop pattern TPO, the ground selection gate electrode GGE, and the erase control gate electrode EGE may be disposed below the middle stack structure MS.

The first gate electrodes EGE, GGE, CGE1 and the second gate electrodes CGE2 and SGE may include, for example, at least one selected from, for example, doped semiconductor (e.g., doped silicon (Si)), metal (e.g., tungsten (W), copper (Cu), or aluminum (Al)), conductive metal nitride (e.g., titanium nitride (TiN) or tantalum nitride (TaN)), and transition metal (e.g., titanium (Ti) or tantalum (Ta)).

The erase control gate electrode EGE may correspond to the erase control line ECL of FIG. 2B. The erase control gate electrode EGE may be divided into two pieces by the second groove G2 that passes between the sub-blocks SBLK as illustrated in FIG. 4D, but the two divided pieces may be connected to each other through a connection part PT1 that is present on the connection region CNR. Therefore, for one block BLK, the erase control gate electrode EGE may have the same potential state.

The first and second cell gate electrodes CGE1 and CGE2 may correspond to the word lines WL0 to WLn and the dummy word line DWL of FIG. 2B. The first and second cell gate electrodes CGE1 and CGE2 may be divided into two pieces by the second groove G2 that passes between the sub-blocks SBLK as illustrated in FIG. 4D, but the two divided pieces may be connected to each other through a connection part PT1 that is present on the connection region CNR. Therefore, for one block BLK, each the first and second cell gate electrodes CGE1 and CGE2 may have the same potential state at a certain height (level).

The ground selection gate electrodes GGE may correspond to the ground selection lines GSL0 to GSL2 of FIG. 2B. The ground selection gate electrodes GGE and the ground selection lines GSL0 to GSL2 of FIG. 2B may be referred to as lower selection lines. The ground selection gate electrodes GGE may have their linear shapes that extend in the first direction D1 and may be spaced apart from each other in the second direction D2. For one sub-block SBLK, the ground selection gate electrodes GGE may include first and second ground selection gate electrodes GGE(1) and GGE(2). For one sub-block SBLK, the first and second ground selection gate electrodes GGE(1) and GGE(2) may be spaced apart at a first interval DS1 from each other across a first lower separation pattern BS1 that is interposed therebetween. The first interval DS1 between the first and second ground selection gate electrodes GGE(1) and GGE(2) may be the same as a first width WT1 of the first lower separation pattern BS1 depicted in FIG. 5A.

In the present embodiment, one first lower separation pattern BS1 may be present in one sub-block SBLK, but two or more first lower separation patterns BS1 may be provided and in this case the number of vertical holes VH and central dummy vertical holes CDVH may be greater than that shown in FIG. 4A. For example, two first lower separation patterns BS1 may be provided in one sub-block SBLK, and in this case three ground selection gate electrodes GGE may be present in one sub-block SBLK. For another example, three first lower separation patterns BS1 may be provided in one sub-block SBLK, and in this case four ground selection gate electrodes GGE may be present in one sub-block SBLK. In some instances, one ground selection line GSL must control two or more string selection lines SSLs may occur. To suppress deterioration of cell operation characteristics and performance, each sub-block SBLK may be divided into as many ground selection gate electrodes GGE as possible.

The string selection gate electrodes SGE may correspond to the string selection lines SSL11 to SSL13 or SSL21 to SSL23 of FIG. 2B. The string selection gate electrodes SGE and the string selection lines SSL11 to SSL13 or SSL21 to SSL23 may be referred to as upper selection lines. The string selection gate electrodes SGE may have their linear shapes that extend in the first direction D1 and may be spaced apart from each other in the second direction D2. For one sub-block SBLK, the string selection gate electrodes SGE may include first and second string selection gate electrodes SGE(1) and SGE(2). For one sub-block SBLK, the first and second string selection gate electrodes SGE(1) and SGE(2) may be spaced apart at a second interval DS2 from each other across an upper separation pattern 9 interposed therebetween. The second interval DS2 between the first and second string selection gate electrodes SGE(1) and SGE(2) may be the same as a second width WT2 of the upper separation pattern 9 depicted in FIG. 5A. The second width WT2 of the upper separation pattern 9 may be smaller than the first width WT1 of the first lower separation pattern BS1. The second interval DS2 between the first and second string selection gate electrodes SGE(1) and SGE(2) may be smaller than the first interval DS1 between the first and second ground selection gate electrodes GGE(1) and GGE(2). In the present embodiment, one upper separation pattern 9 may be present in one sub-block SBLK, but the present inventive concept is not limited thereto. For example, two or more upper separation patterns 9 may be provided and in this case the number of vertical holes VH and central dummy vertical holes CDVH may be greater than that shown in FIG. 4B. For example, three upper separation patterns 9 may be provided in one sub-block SBLK, and in this case four string selection gate electrodes SGE may be present in one sub-block SBLK.

As illustrated in FIG. 4A, the second separation dielectric line SL2 may be interposed between the sub-blocks SBLK. The second separation dielectric line SL2 may be disposed in the second groove G2. For one block BLK, the sub-blocks SBLK may be spaced apart from each other at a third interval DS3. The third interval DS3 may correspond to a width of the second separation dielectric line SL2. The third interval DS3 may be greater than the first interval DS1 and the second interval DS2. For sub-blocks SBLK, the second ground selection gate electrodes GGE(2) may be in contact with the second separation dielectric line SL2. The second ground selection gate electrodes GGE(2) may have their shapes that are mirror-symmetric about the second separation dielectric line SL2.

As illustrated in FIG. 4A, a second separation pattern BS2 may be disposed between neighboring second ground selection gate electrodes GGE(2) on the connection region CNR. The second lower separation pattern BS2 may be disposed in a lower trench BT1. The second lower separation pattern BS2 may not have a linear shape but an island shape when viewed in plan. Between the sub-blocks SBLK, lateral surfaces of the second ground selection gate electrodes GGE(2) may be recessed in the second direction D2 or in a direction opposite to the second direction D2. The recessed lateral surface may correspond to an inner sidewall of the lower trench BT1. A fourth interval DS4 between the inner sidewalls of the lower trench BT1 may correspond to a width in the second direction D2 of the second lower separation pattern BS2. The fourth interval DS4 may be greater than the third interval DS3. The second lower separation pattern BS2 may be interposed between the second separation dielectric lines SL2. The second separation dielectric line SL2 may be in contact with a lateral surface of the second lower separation pattern BS2.

The connection parts PT1 of the erase control gate electrode EGE and the first and second cell gate electrodes CGE(1) and CGE(2) of FIG. 4D may overlap the second lower separation pattern BS2. The first lower separation pattern BS1 and the second lower separation pattern BS2 may include the same dielectric material. For example, the first and second lower separation patterns BS1 and BS2 may include silicon oxide ($SiO_2$).

The first separation dielectric line SL1 and the second separation dielectric line SL2 may extend in the third direction D3 to penetrate the first gate electrodes EGE, GGE, and CGE1 and the second gate electrodes CGE2 and SGE and to contact sidewalls of the first and second gate electrodes EGE, GGE, CGE1, CGE2, and SGE.

Referring to FIGS. 4C and 5A, the polishing stop pattern TPO may be formed of a material having an etch selectivity with respect to materials of the first electrode interlayer dielectric layers 12, the capping interlayer dielectric layer 15, and the second electrode interlayer dielectric layers 22 and 24. The first electrode interlayer dielectric layers 12, the capping interlayer dielectric layer 15, and the second electrode interlayer dielectric layers 22 and 24 may be formed of, for example, silicon oxide ($SiO_2$). The polishing stop pattern TPO may be formed of, for example, silicon carbonitride (SiCN). Alternatively, the polishing stop pattern TPO may be formed of silicon oxide ($SiO_2$). The polishing stop pattern TPO may have a silicon (Si) atomic concentration different from those of the first electrode interlayer dielectric layers 12, the capping interlayer dielectric layer 15, and the second electrode interlayer dielectric layers 22 and 24. For example, a silicon atomic concentration (or density/amount) of the polishing stop pattern TPO may be greater than those of the first electrode interlayer dielectric layers 12, the capping interlayer dielectric layer 15, and the second electrode interlayer dielectric layers 22 and 24. Alternatively, a silicon (Si) atomic concentration (or density/amount) of the polishing stop pattern TPO may increase with decreasing distance from the second substrate 201. For example, the polishing stop pattern TPO may include a material different from those of the first electrode interlayer dielectric layers 12, the capping interlayer dielectric layer 15, and the second electrode interlayer dielectric layers 22 and 24. The polishing stop pattern TPO may be referred to as a first polishing stop layer.

As illustrated in FIGS. 5A to 5C, the polishing stop pattern TPO may have a top surface coplanar with that of the first lower separation pattern BS1 and that of the second lower separation pattern BS2. As illustrated in FIG. 4C, a planar shape of the polishing stop pattern TPO may be coincident with that of each of the ground selection gate electrodes GGE depicted in FIG. 4A. For one sub-block SBLK, the polishing stop pattern TPO may include first and second polishing stop patterns TOP(1) and TPO(2). The first and second polishing stop patterns TPO(1) and TPO(2) may have their linear shapes that extend in the first direction D1 and are spaced apart from each other in the second direction D2.

For one sub-block SBLK, the first lower separation pattern BS1 may be interposed between the first and second polishing stop patterns TPO(1) and TPO(2). The second lower separation pattern BS2 may be disposed between neighboring second polishing stop patterns TPO(2) on the connection region CNR. Between the sub-blocks SBLK, lateral surfaces of the second polishing stop patterns TPO(2) may be recessed in the second direction D2 or in a direction opposite to the second direction D2. The recessed lateral surface may correspond to the inner sidewall of the lower trench BT1.

The source structure SCL may include a first source pattern SC1 interposed between the first electrode interlayer dielectric layer 12 and the second substrate 201, and may also include a second source pattern SC2 interposed between the first source pattern SC1 and the second substrate 201. The first source pattern SC1 may include an impurity-doped semiconductor pattern, for example, polysilicon (p-Si) doped with impurities having a first conductivity type. The second source pattern SC2 may include an impurity-doped semiconductor pattern, for example, impurity-doped polysilicon (p-Si). The second source pattern SC2 may include a semiconductor material different from that of the first source pattern SC1. A conductivity type of impurities doped into the second source pattern SC2 may be the same as that of impurities doped into the first source pattern SC1. A concentration of impurities doped into the second source pattern SC2 may be the same as or different from that of impurities doped into the first source pattern SC1. The source structure SCL may correspond to the common source line CSL of FIG. 1A. In addition, the second substrate 201 may serve as the common source line CSL of FIG. 1A.

On the cell array region CAR of each of the sub-blocks SBLK, cell vertical semiconductor patterns VS may penetrate the electrode interlayer dielectric layers 12, 22, and 24, the capping interlayer dielectric layer 15, the polishing stop pattern TPO, the first gate electrodes EGE, GGE, and CGE1, and the second gate electrodes CGE2 and SGE. For example, the cell vertical semiconductor patterns VS on the cell array region CAR may penetrate the upper selection lines (i.e., the string selection gate electrodes SGE), the middle stack structure MS, the first polishing stop layer (i.e., the polishing stop pattern TPO), the lower selection lines (i.e., the ground selection gate electrodes GGE), and the source structure SCL to be adjacent to the second substrate 201. For example, lower portions of the cell vertical semiconductor patterns VS may be disposed in the second substrate 201. For example, each of the cell vertical semiconductor patterns VS may extend in the third direction D3 and intersect the upper surface of the second substrate 201. Central dummy vertical semiconductor patterns CDVS may penetrate the electrode interlayer dielectric layers 12, 22, and 24, the capping interlayer dielectric layer 15, the polishing stop pattern TPO, the first lower separation pattern BS1, the first cell gate electrodes CGE1, the erase control gate electrode EGE, and the second gate electrodes CGE2 and SGE. For example, the central dummy vertical semiconductor patterns CDVS may penetrate the upper selection lines (i.e., the string selection gate electrodes SGE), the middle stack structure MS, the first polishing stop layer (i.e., the polishing stop pattern TPO), and the first lower separation pattern BS1 to be adjacent to the second substrate 201. For example, lower portions of the central dummy vertical semiconductor patterns CDVS may be disposed in the second substrate 201. For example, each of the central dummy vertical semiconductor patterns CDVS may extend in the third direction D3 and intersect the upper surface of the second substrate 201. The central dummy vertical semiconductor patterns CDVS may be arranged in one row along the first direction D1. The upper separation pattern 9 may be disposed between upper portions of the central dummy vertical semiconductor patterns CDVS. The cell vertical semiconductor patterns VS may be positioned in vertical holes VH. The central dummy vertical semiconductor patterns CDVS may be positioned in central dummy vertical holes CDVH. A gate dielectric layer GO may be interposed between the vertical semiconductor patterns VS and CDVS and the first and second sub-stack structures ST1 and ST2.

The cell vertical semiconductor patterns VS and the central dummy vertical semiconductor patterns CDVS may each have a hollow cup shape. However, the present inventive concept is not limited thereto. In an embodiment of the present inventive concept, the cell vertical semiconductor patterns VS and the central dummy vertical semiconductor patterns CDVS may have various shapes, such as, for example, a cylindrical shape, a rectangular cylindrical shape, and a solid pillar shape. The cell vertical semiconductor patterns VS and the central dummy vertical semiconductor patterns CDVS may each have a sidewall that has an inflection point IFP adjacent to a location between the first sub-stack structure ST1 and the second sub-stack structure ST2.

The cell vertical semiconductor patterns VS and the central dummy vertical semiconductor patterns CDVS may include, for example, a single-crystalline silicon (sc-Si) layer or a polysilicon (p-Si) layer. The cell vertical semiconductor patterns VS and the central dummy vertical semiconductor patterns CDVS may have their insides each of which is filled with a buried dielectric pattern 29. The buried dielectric pattern 29 may have a single-layered or multi-layered structure including, for example, at least one selected from, for example, a silicon oxide ($SiO_2$) layer, a silicon nitride ($Si_3N_4$) layer, and a silicon oxynitride (SiON) layer. However, the present inventive concept is not limited thereto. Alternatively, the inner space surrounded by each of the cup-shaped cell vertical semiconductor patterns VS and central dummy vertical semiconductor patterns CDVS may not be filled with the buried dielectric pattern 29, and each of the cup-shaped cell vertical semiconductor patterns VS and central dummy vertical semiconductor patterns CDVS may include a hollow space or an air gap in the inner space defined by each of the cup-shaped cell vertical semiconductor patterns VS and central dummy vertical semiconductor patterns CDVS. A bit-line pad BPD may be disposed on each of the cell vertical semiconductor pattern VS and the central dummy vertical semiconductor pattern CDVS. The bit-line pad BPD may include impurity-doped polysilicon (p-Si) or a metal such as, for example, tungsten (W), aluminum (Al), or copper (Cu).

Referring to FIG. 6, the gate dielectric layer GO may include a tunnel dielectric layer TL, a charge storage layer SN, and a blocking dielectric layer BCL. The charge storage layer SN may be a trap dielectric layer, a floating gate electrode, or a dielectric layer including conductive nanodots. For example, the charge storage layer SN may include at least one selected from, for example, a silicon nitride ($Si_3N_4$) layer, a silicon oxynitride (SiON) layer, a silicon-rich nitride ($Si_xN_y$, x>y) layer, a nano-crystalline silicon (nc-Si) layer, and a laminated trap layer. For example, the tunnel dielectric layer TL may be adjacent to each of the cell vertical semiconductor pattern VS and the central dummy vertical semiconductor pattern CDVS and may surround the outer sidewall of each of the cell vertical semiconductor pattern VS and the central dummy vertical semiconductor pattern CDVS. The tunnel dielectric layer TL may allow charges to tunnel to the charge storage layer SN through the process of Fowler-Nordheim (F-N) tunneling. The tunnel dielectric layer TL may include one of materials each having a bandgap greater than that of the charge storage layer SN, and the blocking dielectric layer BCL may include a high-k dielectric layer such as, for example, an aluminum oxide ($Al_2O_3$) layer or a hafnium oxide ($HfO_2$) layer. The gate dielectric layer GO may further include a high-k dielectric layer HL. The high-k dielectric layer HL may be interposed between the blocking dielectric layer BCL and the gate electrodes EGE, GGE, CGE1, CGE2, and SGE. The high-k dielectric layer HL may be interposed between the first and second gate electrodes EGE, GGE, CGE1, CGE2, and SGE and the interlayer dielectric layers 12, 15, 22, and 24. The high-k dielectric layer HL may include a metal oxide layer, such as, for example, a hafnium oxide ($HfO_2$) layer or an aluminum oxide ($Al_2O_3$) layer, having a dielectric constant greater than that of a silicon oxide ($SiO_2$) layer. The second source pattern SC2 may separate a lower portion of the gate dielectric layer GO from an upper portion of the gate dielectric layer GO. For example, the second source pattern SC2 may extend through the gate dielectric layer GO and may contact side surfaces of the cell vertical semiconductor pattern VS and the central dummy vertical semiconductor pattern CDVS. A portion of the first separation dielectric line SL1 may protrude in the second direction D2 toward the first and second gate electrodes EGE, GGE, CGE1, CGE2, and SGE to be interposed between the interlayer dielectric layers 12, 15, 22, and 24. The first separation dielectric lines SL1 may have their uneven structures at sidewalls thereof. Identical or similar to the first separation dielectric lines SL1, the second separation dielectric lines SL2 may have their uneven structures at sidewalls thereof.

The first separation dielectric lines SL1 and the second separation dielectric lines SL2 may be formed of, for example, silicon oxide ($SiO_2$). In the present embodiment, the first separation dielectric lines SL1 and the second separation dielectric lines SL2 may penetrate the first source pattern SC1 of the source structure SCL, thereby being in contact with the second source pattern SC2 of the source structure SCL. The first separation dielectric lines SL1 and the second separation dielectric lines SL2 may have their bottom surfaces located at the same or different levels. Alternatively, the first separation dielectric lines SL1 and the second separation dielectric lines SL2 may penetrate the source structure SCL to contact the second substrate 201.

A first source connection line CSPLG1 and a second source connection line CSPLG2 may be respectively disposed in the first separation dielectric line SL1 and the second separation dielectric line SL2, thereby being in contact with the second substrate 201 and/or the source structure SCL.

The second upper interlayer dielectric layer 208 may be disposed on the first upper interlayer dielectric layer 205. The second upper interlayer dielectric layer 208 may be provided thereon with first conductive lines BLL that extend in the second direction D2 and are parallel to each other. The first conductive lines BLL may correspond to the bit lines BL of FIG. 1A. On the cell array region CAR, first contacts CT1 may penetrate the first and second upper interlayer dielectric layers 205 and 208 to connect the first conductive lines BLL to the bit-line pads BPD disposed on the cell vertical semiconductor patterns VS.

Figure 10:
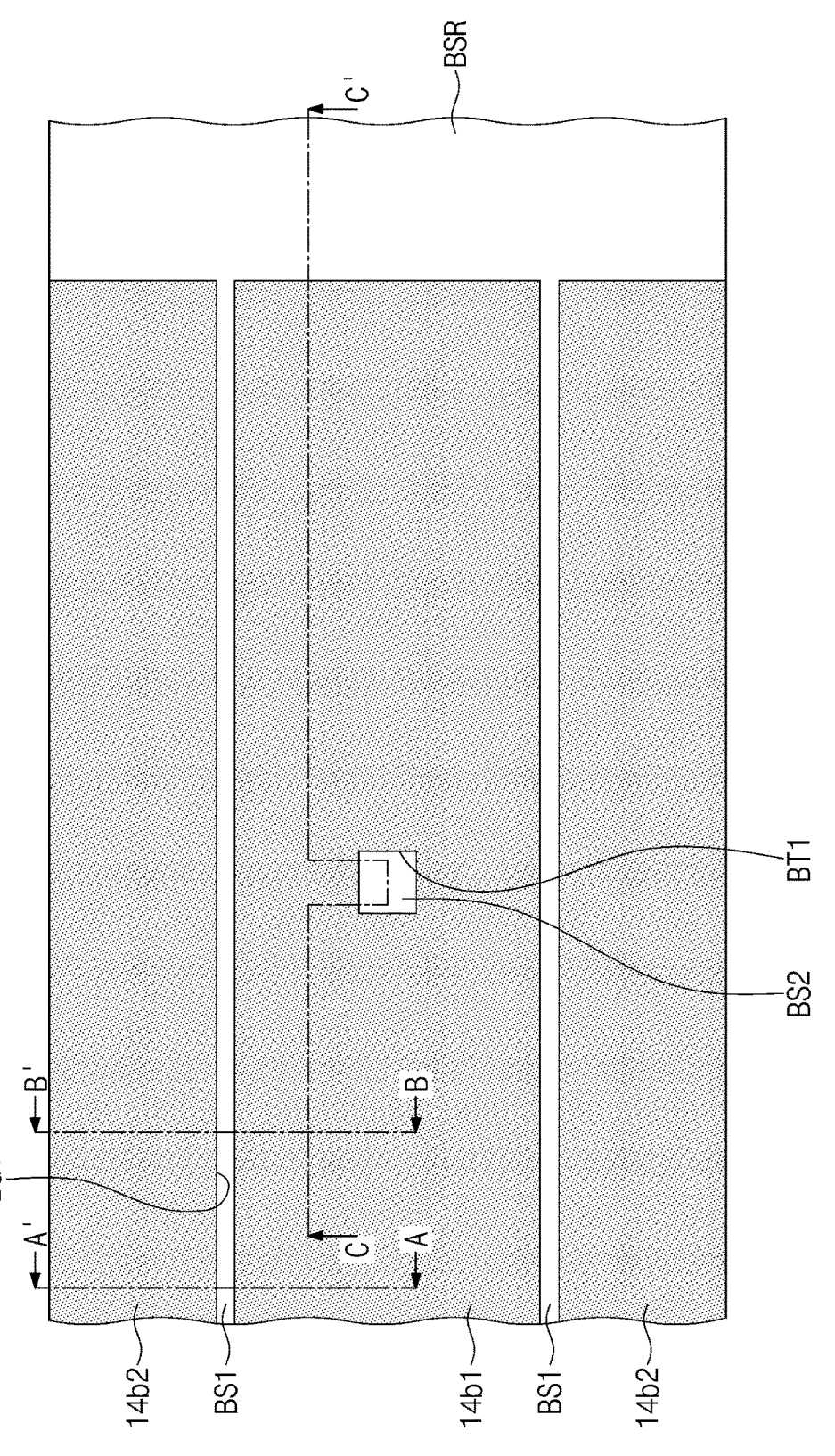
FIG. 10 illustrates a plan view showing a method of fabricating a three-dimensional semiconductor memory device whose plan view is shown in FIG. 3.

Referring to FIG. 5C, the first and second sub-stack structures ST1 and ST2 included in each of the blocks BLK may have a stepwise shape on the connection region CNR. For example, the erase control gate electrode EGE and the ground selection gate electrode GGE may have their ends that constitute a stepwise shape. On the connection region CNR, a sidewall of the polishing stop pattern TPO may be aligned with that of the ground selection gate electrode GGE. A residual lower separation pattern BSR may cover the ends of the erase control gate electrode EGE and the ground selection gate electrode GGE. The residual lower separation pattern BSR may be in contact with the sidewall of the polishing stop pattern TPO. The residual lower separation pattern BSR may have a top surface coplanar with that of the polishing stop pattern TPO. The residual lower separation pattern BSR may include a material the same as that of the first and second lower separation patterns BS1 and BS2. As illustrated in FIG. 10, the residual lower separation pattern BSR and an end of the first lower separation pattern BS1 may be connected into a single unitary body.

Referring back to FIG. 5C, the capping interlayer dielectric layer 15 may cover the polishing stop pattern TPO and the residual lower separation pattern BSR. The first cell gate electrodes CGE1 positioned on the capping interlayer dielectric layer 15 may have their ends that constitute a stepwise shape. The ends of the first cell gate electrodes CGE1 may be covered with a first planarized dielectric layer 210.

The second cell gate electrodes CGE2 and the string selection gate electrodes SGE may have their ends that constitute a stepwise shape. For example, first cell gate electrodes CGE1, the second cell gate electrodes CGE2 and the string selection gate electrodes SGE may be staked in a staircase shape in which extension lengths in the first direction D1 may gradually decrease in a stepwise manner from a lowermost level toward an uppermost level. On the connection region CNR, an end of the second sub-stack structure ST2 may be covered with a second planarized dielectric layer 220. The first and second planarized dielectric layers 210 and 220 may include a silicon oxide (SiO₂) layer or a porous dielectric layer. The first, second, and third upper interlayer dielectric layers 205, 208, and 209 may be sequentially stacked on the first and second planarized dielectric layers 210 and 220. In an embodiment of the present inventive concept, the residual lower separation pattern BSR and the first and second planarized dielectric layers 210 and 220 may be formed of the same material such as silicon oxide (SiO₂) and may be connected into a single unitary body as one planarized dielectric layer, and thus, the one planarized dielectric layer may be disposed on the connection region CNR and covering the ends of the lower selection lines (i.e., the ground selection gate electrodes GGE), the end of the first polishing stop layer (i.e., the polishing stop pattern TPO), the end of the middle stack structure MS (which includes electrode layers), and the ends of the upper selection lines (i.e., the string selection gate electrodes SGE). The interlayer dielectric layer 1315 illustrated in FIG. 22 may be similar to the planarized dielectric layer described above.

The first gate electrodes EGE, GGE, and CGE1 and the second gate electrodes CGE2 and SGE may have their ends that are connected to corresponding cell contact plugs CC. The cell contact plugs CC may penetrate the first and second upper interlayer dielectric layers 205 and 208 to correspondingly contact the first gate electrodes EGE, GGE, and CGE1 and the second gate electrodes CGE2 and SGE.

Referring to FIG. 3, edge dummy vertical semiconductor patterns EDVS may penetrate the first and second planarized dielectric layers 210 and 220 and stepwise shaped ends of the first gate electrodes EGE, GGE, and CGE1, the second gate electrodes CGE2 and SGE, and electrode interlayer dielectric layers 12, 22, and 24. The edge dummy vertical semiconductor patterns EDVS may be disposed in corresponding edge dummy vertical holes (see EDVH of FIGS. 4A to 4C).

When viewed in plan, the edge dummy vertical semiconductor patterns EDVS may each have an elliptical shape that is elongated in a certain direction. The edge dummy vertical semiconductor patterns EDVS may each have a cross section identical or similar to that of the cell vertical semiconductor pattern VS depicted in FIG. 6. The edge dummy vertical semiconductor patterns EDVS may have their insides each of which is filled with a buried dielectric pattern 29. A gate dielectric layer GO may be interposed between the edge dummy vertical semiconductor patterns EDVS and the first and second sub-stack structures ST1 and ST2. A bit-line pad BPD may also be disposed on each of the edge dummy vertical semiconductor patterns EDVS. However, the edge dummy vertical semiconductor patterns EDVS may not be connected to the first conductive lines BLL.

Referring still to FIG. 5C, an electrode connection line CL may be disposed on the second upper interlayer dielectric layer 208. On the connection region CNR, edge through vias ETHV may penetrate the first upper interlayer dielectric layer 205, the first and second planarized dielectric layers 210 and 220, the second substrate 201, and the etch stop layer 111, thereby being correspondingly coupled to the peripheral conductive pads 30b. In the present embodiment, the edge through vias ETHV may be spaced apart from the first and second sub-stack structures ST1 and ST2. The edge through vias ETHV may be correspondingly connected to the electrode connection lines CL through third contacts CT3 disposed in the second upper interlayer dielectric layer 208. Therefore, the first gate electrodes EGE, GGE and CGE1 and the second gate electrodes CGE2 and SGE may be connected to, for example, decoder circuit (see 1110 of FIG. 1A) of the peripheral circuit structure PS. A via dielectric pattern SP2 may be interposed between the edge through via ETHV and the first and second planarized dielectric layers 210 and 220 and between the edge through via ETHV and the etch stop layer 111. Also, the via dielectric pattern SP2 may be interposed between the edge through via ETHV and the second substrate 201, and thus, the edge through via ETHV may be electrically insulated from the second substrate 201 by the via dielectric pattern SP2.

The edge through vias ETHV may each include at least one metal selected from, for example, tungsten (W), aluminum (Al), copper (Cu), titanium (Ti), and tantalum (Ta). The via dielectric pattern SP2 may include a dielectric material, such as, for example, silicon oxide ($SiO_2$), silicon nitride ($Si_3N_4$), or silicon oxynitride (SiON).

Referring again to FIG. 5C, a substrate ground section WR may be disposed in the second substrate 201 and spaced apart from the edge through vias ETHV. The substrate ground section WR may be doped with first conductivity impurities that are doped into the second substrate 201, and may have an impurity concentration greater than that of the second substrate 201. On the connection region CNR, a substrate contact plug WC may penetrate the first upper interlayer dielectric layer 205, the first and second planarized dielectric layers 210 and 220, the capping interlayer dielectric layer 15, the residual lower separation pattern BSR, and the first electrode interlayer dielectric layer 12, thereby being in contact with the substrate ground section WR.

The electrode connection lines CL may be covered with the third upper interlayer dielectric layer 209. An external terminal CP may be disposed on the third upper interlayer dielectric layer 209. A fourth contact CT4 may penetrate the third and second upper interlayer dielectric layers 209 and 208 to connect the external terminal CP to the substrate contact plug WC. A sidewall of the substrate contact plug WC may be covered with a contact dielectric pattern SP3.

A three-dimensional semiconductor memory device according to the present inventive concept may include the polishing stop pattern TPO to prevent process failure such as dishing issues, and thus the first and second gate electrodes EGE, GGE, CGE1, CGE2, and SGE may be minimized or prevented from breakdown voltage degradation, and the interlayer dielectric layers 12, 15, 22, and 24 may be prevented from variation in thickness. Accordingly, the three-dimensional semiconductor memory device may increase in reliability.

A three-dimensional semiconductor memory device according to the present inventive concept may be configured such that the ground selection gate electrodes GGE may be divided by the first and second lower separation patterns BS1 and BS2 and the second separation dielectric lines SL2, and thus the divided ground selection gate electrodes GGE may one-to-one correspond to the string selection gate electrodes SGE. Therefore, the ground selection lines GSL0 to GSL2 included in the circuit of FIG. 2B may be divided corresponding to the string selection lines SSL21 to SSL23, and may correspondingly control the cell strings CSTR. Thus, deterioration of cell operation characteristics and performance may be suppressed. Accordingly, a three-dimensional semiconductor memory device may enhance in program/read/erase operating properties.

FIGS. 7A to 9A and 11A to 17A illustrate cross-sectional views showing a method of fabricating a three-dimensional semiconductor memory device whose cross-sectional view is shown in FIG. 5A. FIGS. 7B to 9B and 11B to 17B illustrate cross-sectional views showing a method of fabricating a three-dimensional semiconductor memory device whose cross-sectional view is shown in FIG. 5B. FIGS. 7C to 9C and 11C to 17C illustrate cross-sectional views showing a method of fabricating a three-dimensional semiconductor memory device whose cross-sectional view is shown in FIG. 5C. FIG. 10 illustrates a plan view showing a method of fabricating a three-dimensional semiconductor memory device whose plan view is shown in FIG. 3.

Figure 7A:
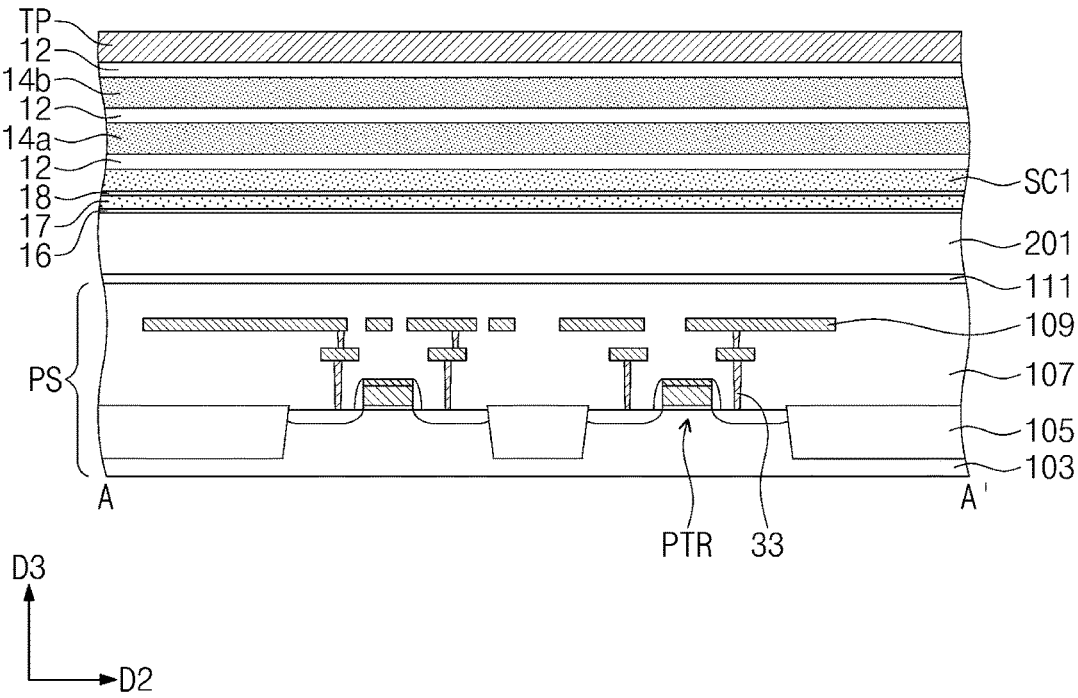
Figure 7B:
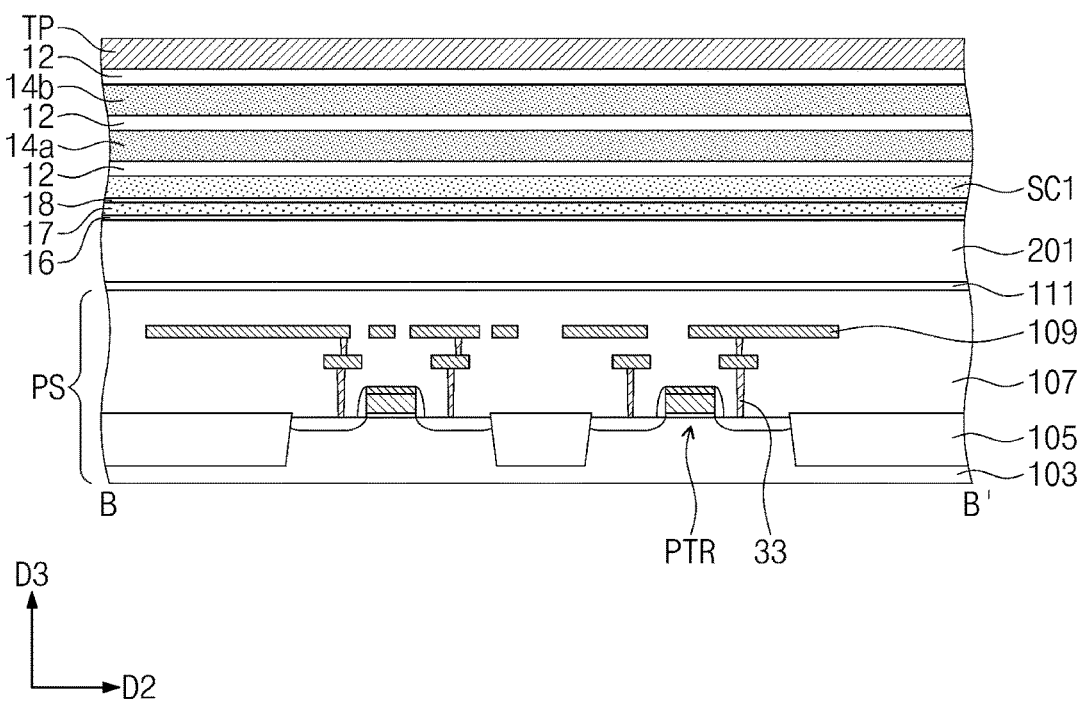
Figure 7C:
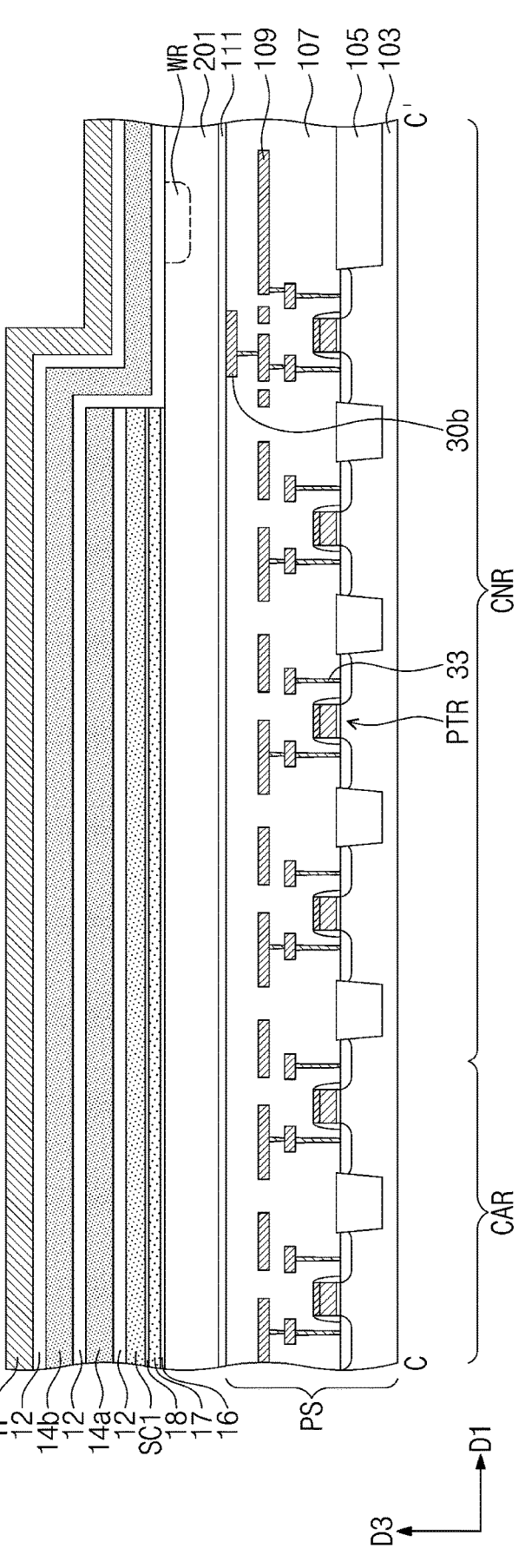

Referring to FIGS. 7A to 7C, a peripheral circuit structure PS may be manufactured. A device isolation layer 105 may be formed in a first substrate 103, restricting active areas. Peripheral transistors PTR may be formed on the active areas. A peripheral interlayer dielectric layer 107 may be formed to cover the peripheral transistors PTR, and peripheral contacts 33 and peripheral lines 109 may be formed in the peripheral interlayer dielectric layer 107. The peripheral transistors PTR may each include a peripheral gate electrode, a peripheral gate dielectric layer, and peripheral source/drain sections disposed in the first substrate 103 adjacent to opposite sides of the peripheral gate dielectric layer. The peripheral contacts 33 may be connected to the peripheral source/drain sections. Peripheral conductive pads 30b may be formed at top of the peripheral circuit structure PS. An etch stop layer 111 may be formed on an entire surface of the peripheral circuit structure PS.

A second substrate 201 may be formed on the etch stop layer 111. The second substrate 201 may be formed by forming a semiconductor epitaxial layer or attaching a single-crystalline semiconductor substrate onto the etch stop layer 111. The second substrate 201 may be called a semiconductor layer. The second substrate 201 may be doped with, for example, impurities having a first conductivity type. A substrate ground section WR may be formed in the second substrate 201. The substrate ground section WR may be formed by doping impurities having the first conductivity type, and may have an impurity concentration greater than that of the second substrate 201. The second substrate 201 may include a cell array region CAR and a connection region CNR.

A first buffer layer 16, a first sacrificial layer 17, a second buffer layer 18, and a first source pattern SC1 may be sequentially stacked on the second substrate 201. A first electrode interlayer dielectric layer 12 and another sacrificial layer 14a may be stacked on the first source pattern SC1. On the connection region CNR, the second substrate 201 may be exposed by etching the another sacrificial layer 14a, the first electrode interlayer dielectric layer 12, the first source pattern SC1, the second buffer layer 18, the first sacrificial layer 17, and the first buffer layer 16. In addition, a first electrode interlayer dielectric layer 12, another sacrificial layer 14b, a first electrode interlayer dielectric layer 12, and a polishing stop layer TP may further be formed on the second substrate 201. In the present embodiment, the polishing stop layer TP may be a polysilicon (p-Si) layer. The first and second buffer layers 16 and 18 and the first electrode interlayer dielectric layers 12 may include silicon oxide ($SiO_2$) that is formed by, for example, atomic layer deposition (ALD) or chemical vapor deposition (CVD). The first sacrificial layer 17 and the another sacrificial layers 14a and 14b may be formed of a silicon nitride ($Si_3N_4$) layer.

Figure 8A:
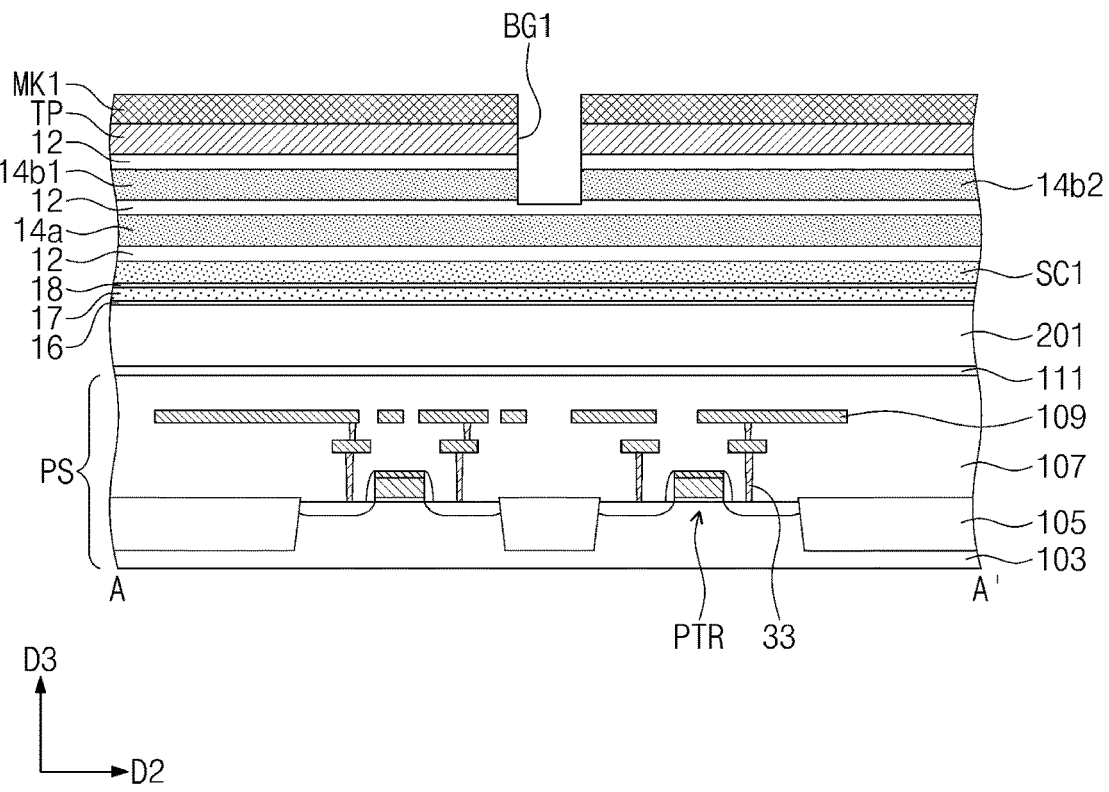
Figure 8B:
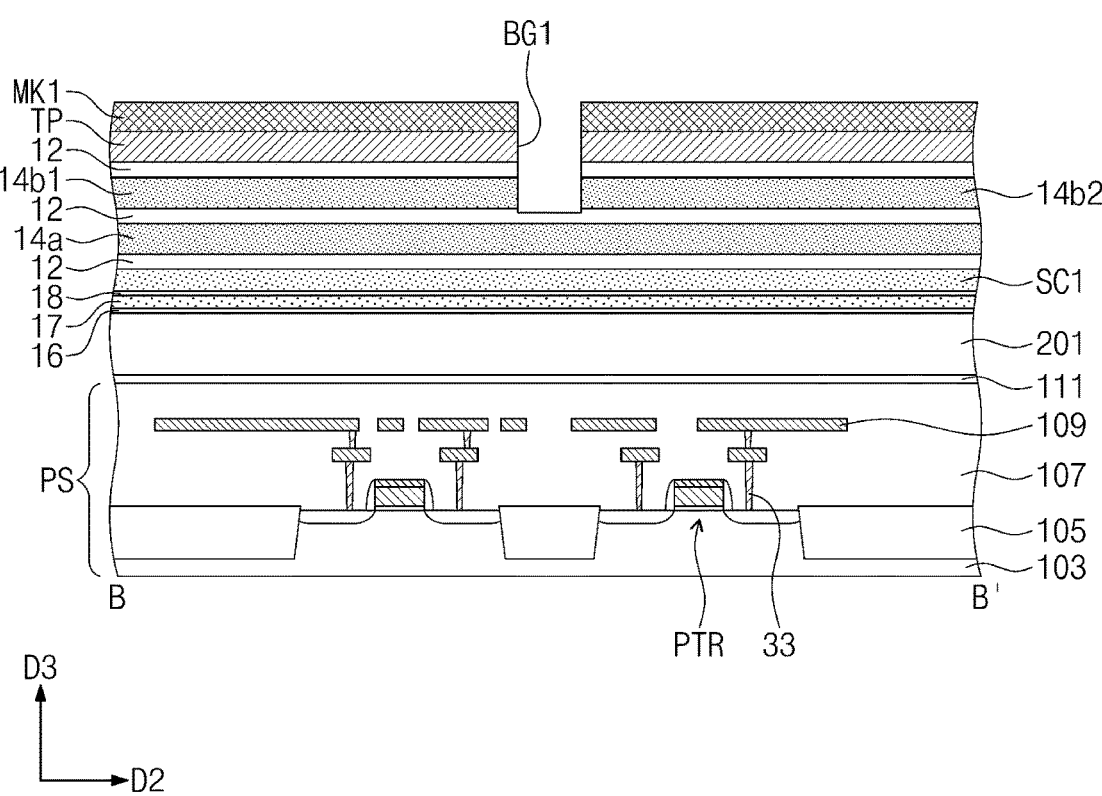
Figure 8C:
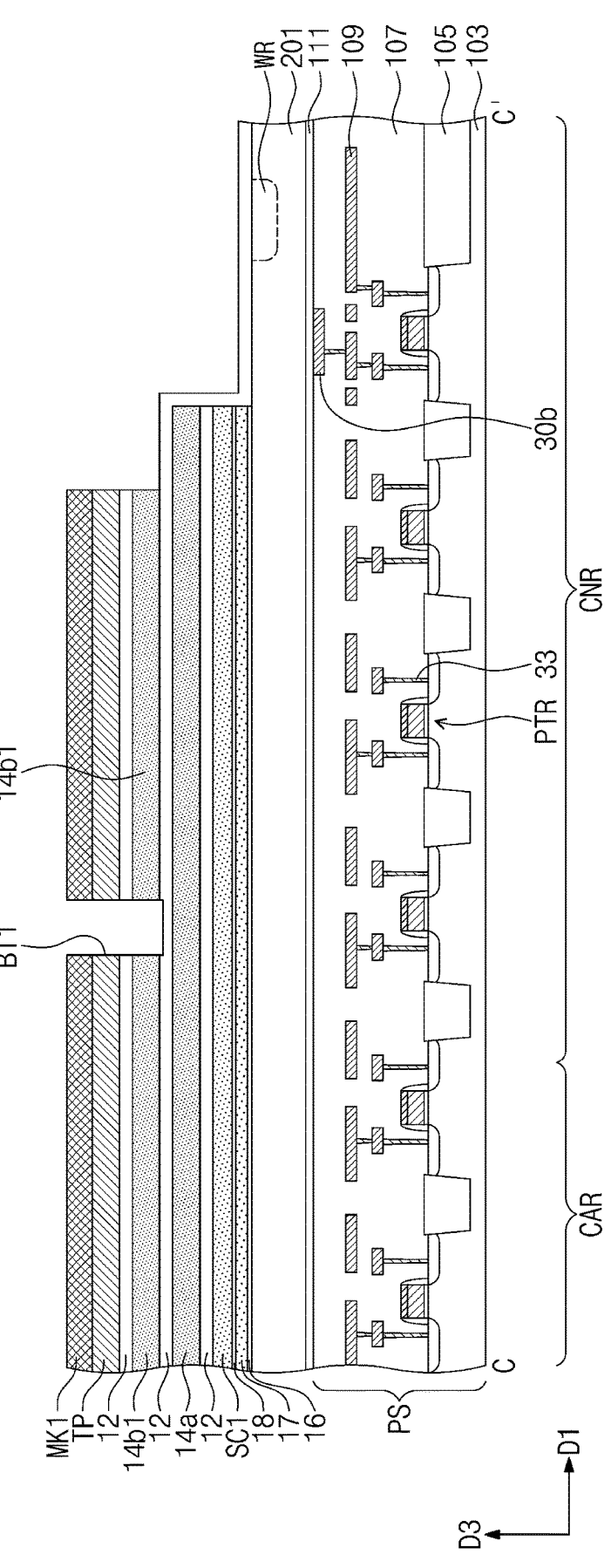

Referring to FIGS. 8A to 8C, a first mask pattern MK1 may be formed on the polishing stop layer TP. The first mask pattern MK1 may be formed of, for example, a photoresist pattern, a spin-on-hardmask (SOH) layer, an amorphous carbon layer (ACL), or a metal layer. The first mask pattern MK1 may be formed by a photolithography process. The first mask pattern MK1 may be used as an etching mask to etch the polishing stop layer TP, the first electrode interlayer dielectric layer 12, and the another sacrificial layer 14b to form lower separation grooves BG1 and a lower trench BT1. Neither the lower separation grooves BG1 nor the lower trench BT1 may expose the another sacrificial layer 14a. For example, bottom surfaces of the lower separation grooves BG1 and the lower trench BT1 may be located within the first electrode interlayer dielectric layer 12 interposed between the another sacrificial layer 14a and the another sacrificial layer 14b. When viewed in plan, the lower separation grooves BG1 and the lower trench BT1 may be formed as shown in FIG. 10. The formation of the lower separation grooves BG1 may divide the another sacrificial layer 14$b$ into a central sacrificial pattern 14$b$1 and edge sacrificial patterns 14$b$2 adjacent to an edge of the central sacrificial pattern 14$b$1. On the connection region CNR, the lower trench BT1 may be positioned on a center of the central sacrificial pattern 14$b$1.

Figure 9A:
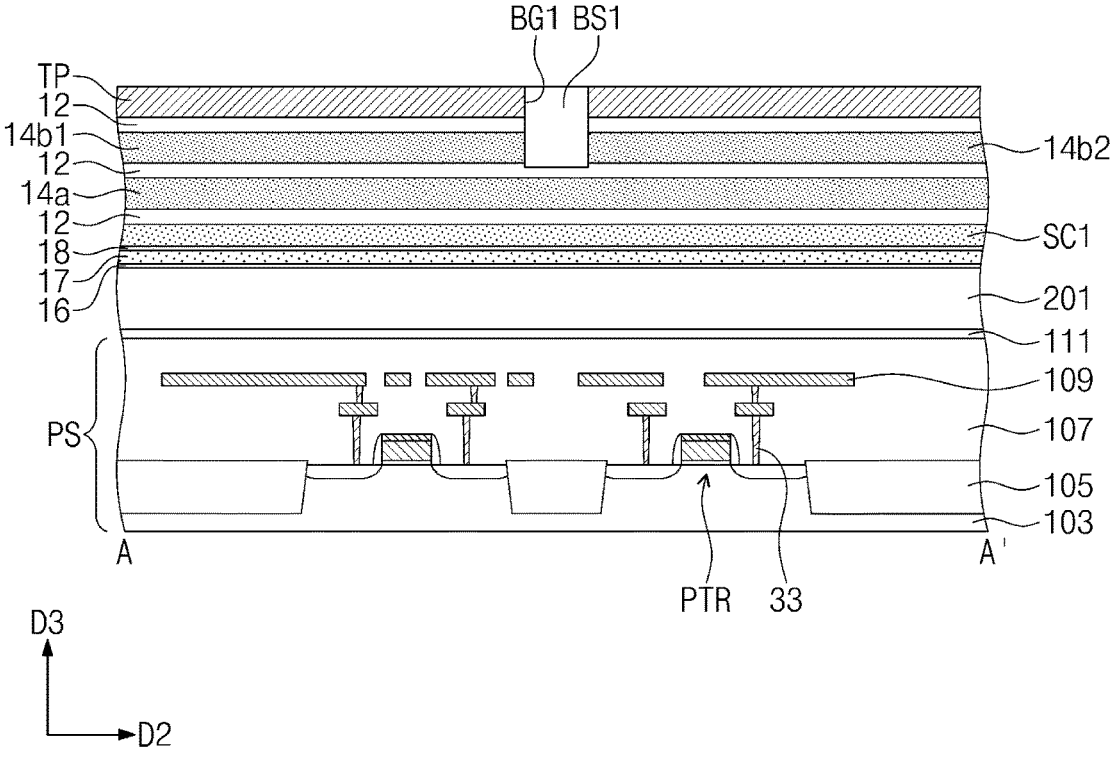
Figure 9B:
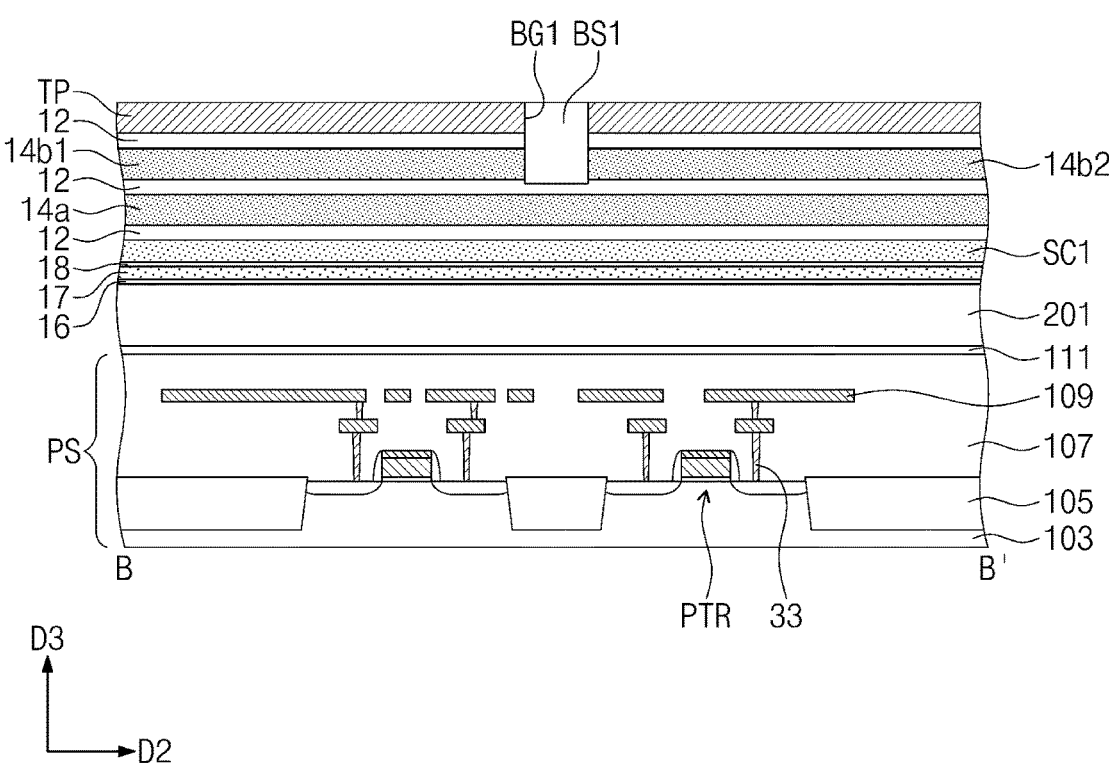
Figure 9C:
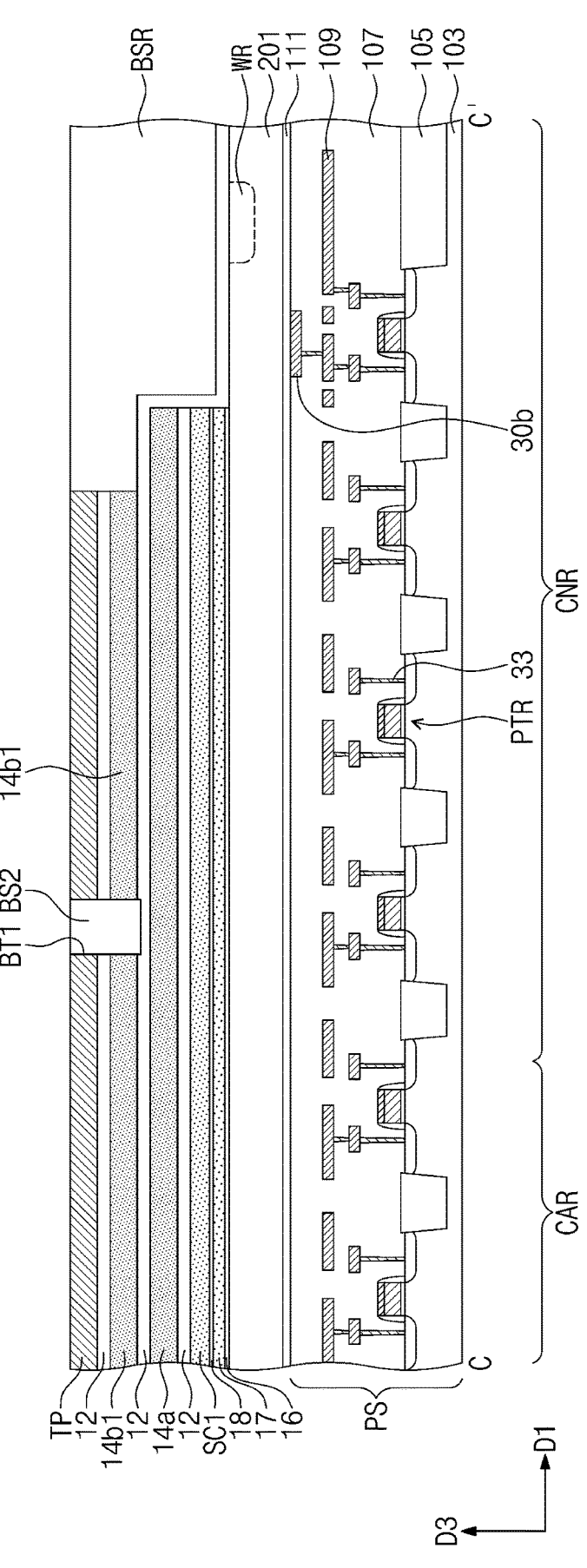

Referring to FIGS. 9A to 9C, the first mask pattern MK1 may be removed to expose the polishing stop layer TP. A buried dielectric layer may be stacked on the polishing stop layer TP to fill the lower separation grooves BG1 and the lower trench BT1, and the buried dielectric layer may undergo a polishing process such as chemical mechanical polishing (CMP). The buried dielectric layer may be formed of, for example, silicon oxide (SiO$_2$). The polishing process may simultaneously form a first lower separation pattern BS1 and a second lower separation pattern BS2 in the lower separation groove BG1 and the lower trench BT1, respectively, and top surface of the polishing stop layer TP may be exposed. In addition, on the connection region CNR, a residual lower separation pattern BSR may be formed which is connected to the first lower separation pattern BS1. The residual lower separation pattern BSR may have a top surface coplanar with those of the polishing stop layer TP, the first lower separation pattern BS1 and the second lower separation pattern BS2 after the chemical mechanical polishing (CMP) process. FIGS. 9A, 9B, and 9C may respectively correspond to cross sections taken along lines A-A', B-B', and C-C' of FIG. 10.

A portion of the buried dielectric layer may be formed into the first lower separation pattern BS1, the second lower separation pattern BS2, and the residual lower separation pattern BSR. The polishing stop layer TP may be formed of a polysilicon (p-Si) layer having an excellent etch/polish selectivity with respect to the buried dielectric layer, and thus the first lower separation pattern BS1, the second lower separation pattern BS2, and the residual lower separation pattern BSR may be formed flat without process failure such as dishing issues in which top surfaces thereof are downwardly dented. Therefore, a wavy (or seagull-like) profile may not be formed in subsequent processes, and subsequently-formed electrodes may be minimized or prevented from breakdown voltage degradation, and subsequently-formed interlayer dielectric layers may be prevented from variation in thickness. As such, process defects may be prevented to increase manufacturing yields. Also, after the chemical mechanical polishing (CMP) process, the polishing stop layer TP is left in the assembly structure without being removed, and thus the reverse step risk that may occur while removing the polishing stop layer TP may be eliminated. For example, there may be no step difference when a capping interlayer dielectric layer 15 is subsequently formed. Also, the process steps for manufacturing the three-dimensional semiconductor memory device may be simplified.

Figure 11A:
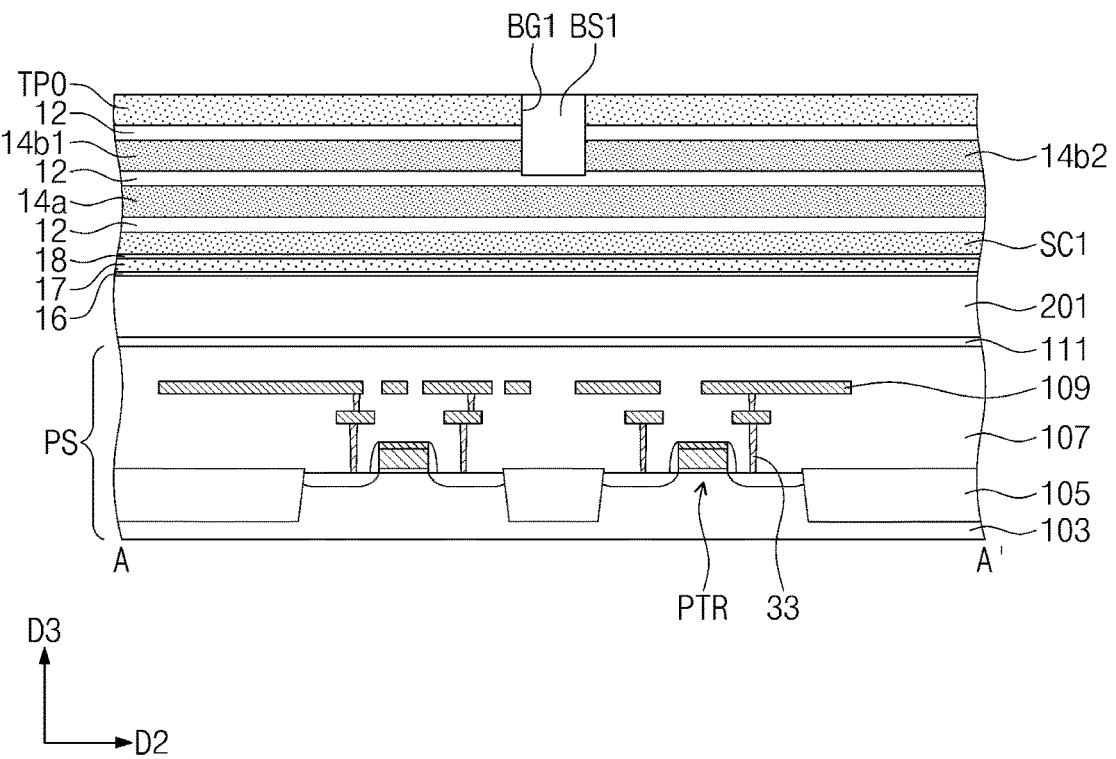
Figure 11B:
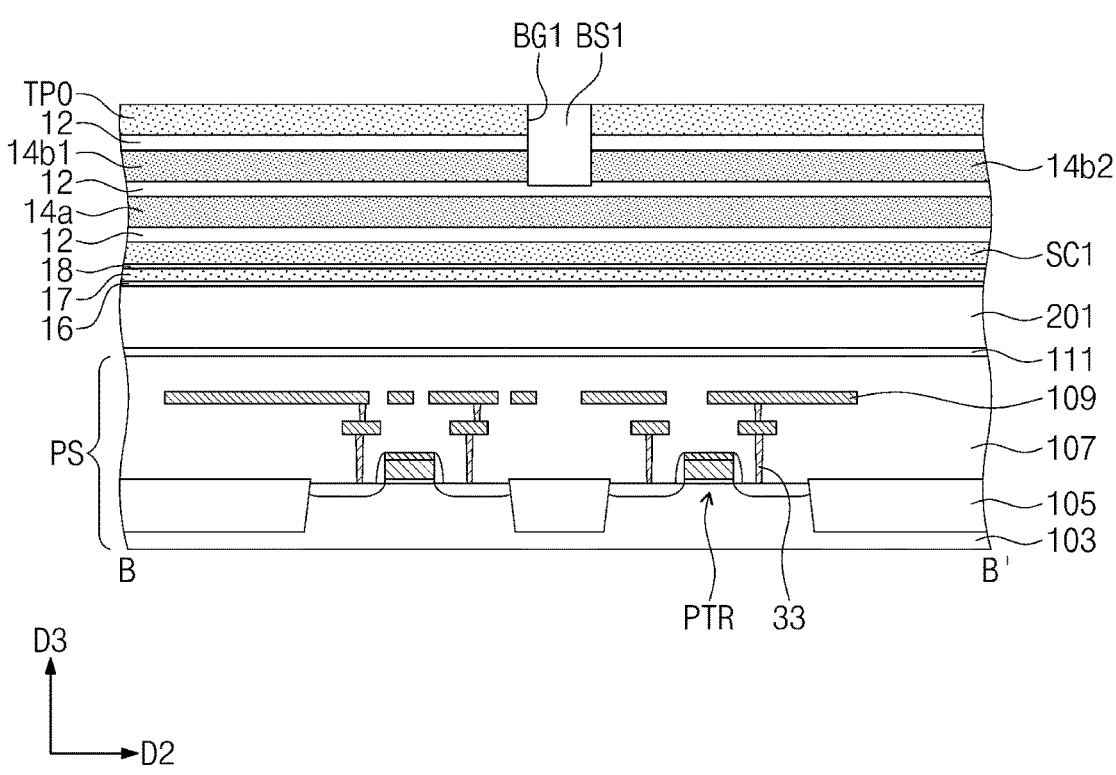
Figure 11C:
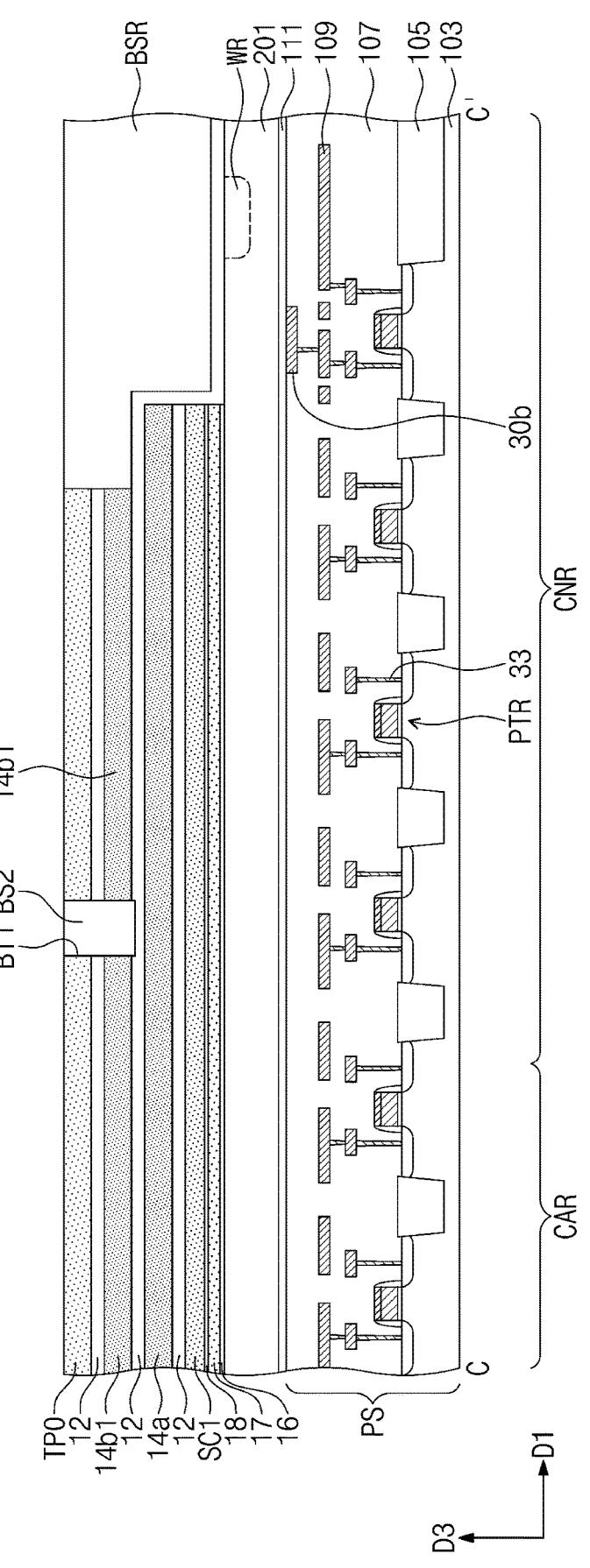

Referring to FIGS. 11A to 11C, a thermal oxidation process may be performed to oxidize the polishing stop layer TP formed of a polysilicon (p-Si) layer. Therefore, the polishing stop layer TP may be converted into a polishing stop pattern TPO formed of silicon oxide (SiO$_2$). In this stage, an oxygen (O) concentration of the polishing stop pattern TPO may be changed based on the degree of oxidation or the penetration depth of oxygen (O). Therefore, a composition of oxygen (O) and silicon (Si) atoms in the polishing stop pattern TPO formed by thermal oxidation may be different from that of oxygen (O) and silicon (Si) atoms in the first electrode interlayer dielectric layers 12 formed by atomic layer deposition (ALD) or chemical vapor deposition (CVD). For example, a silicon (Si) atomic concentration (or density/amount) of the polishing stop pattern TPO may be greater than that of the first electrode interlayer dielectric layers 12. Alternatively, a silicon (Si) atomic concentration (or density/amount) of the polishing stop pattern TPO may increase with decreasing distance from the second substrate 201. An oxygen (O) atomic concentration (or density/amount) of the polishing stop pattern TPO may be smaller than that of the first electrode interlayer dielectric layers 12. Alternatively, an oxygen (O) atomic concentration (or density/amount) of the polishing stop pattern TPO may decrease with decreasing distance from the second substrate 201. Accordingly, the polishing stop pattern TPO may include a material different from a material of the first electrode interlayer dielectric layers 12.

Figure 12A:
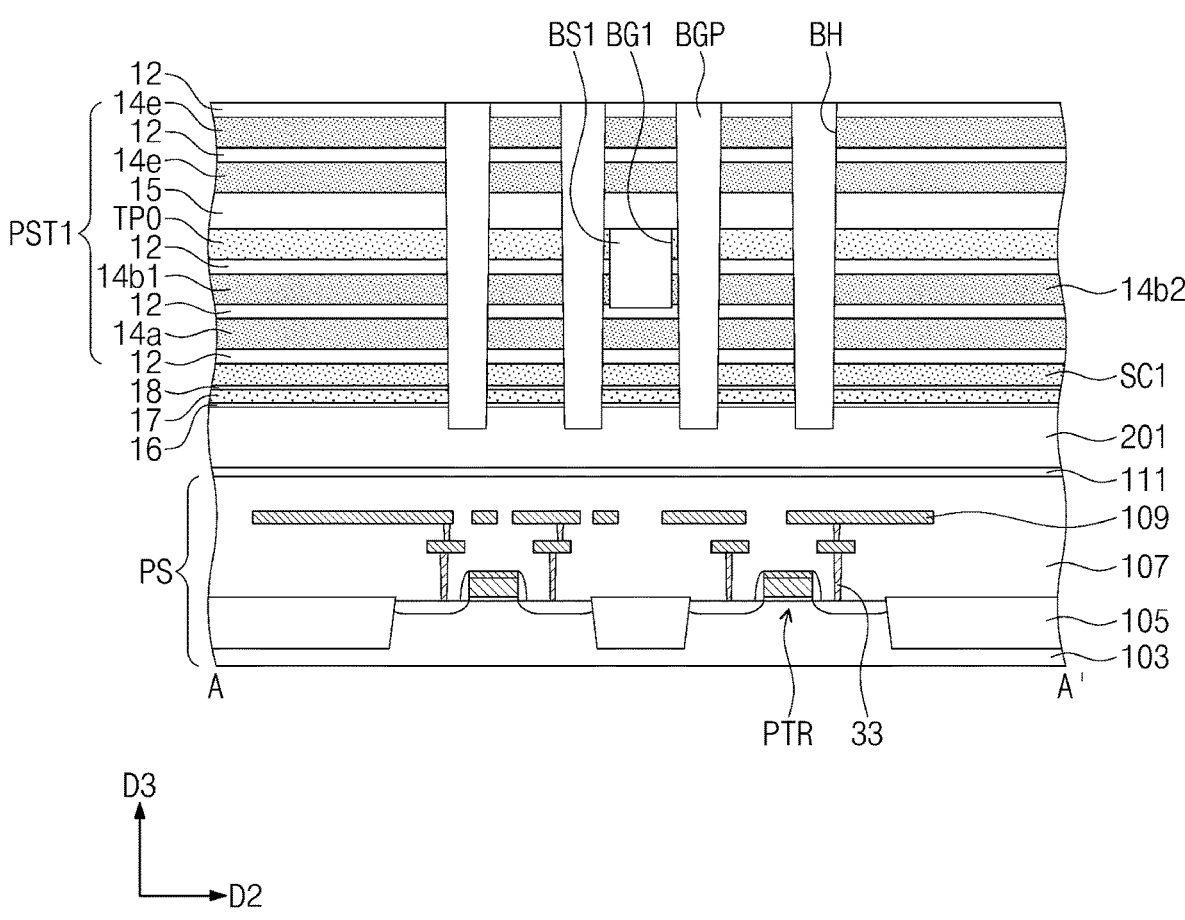
Figure 12B:
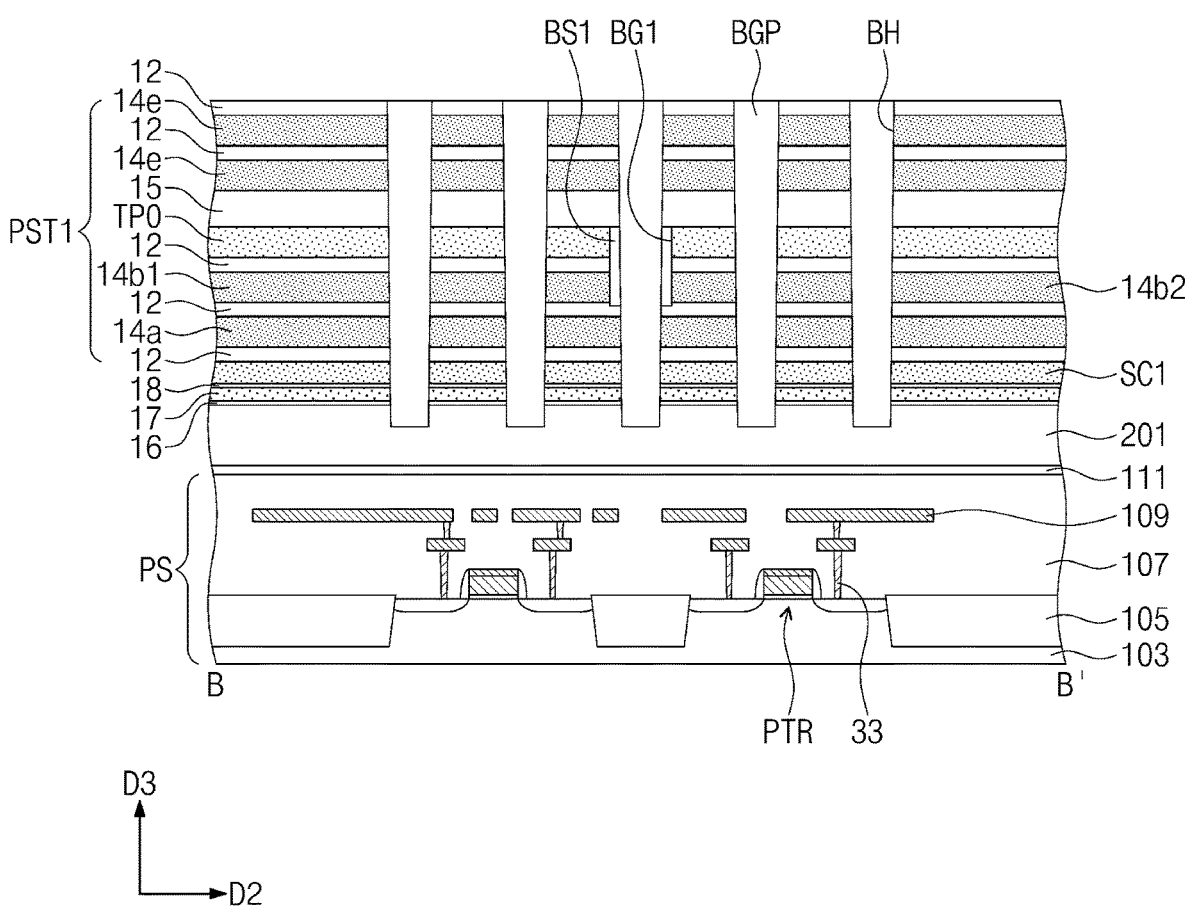
Figure 12C:
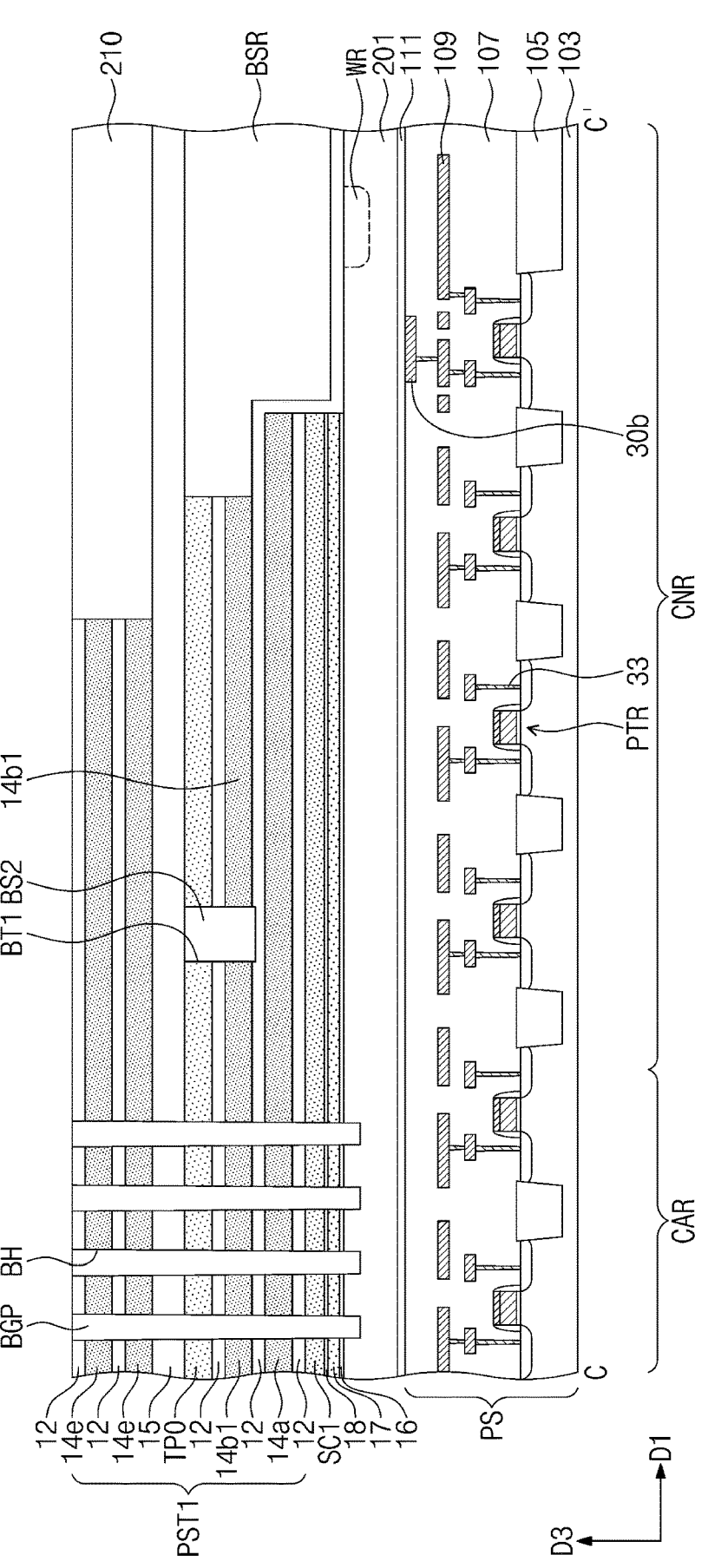

Referring to FIGS. 12A to 12C, a capping interlayer dielectric layer 15 may be stacked on the polishing stop pattern TPO, the first lower separation pattern BS1, the second lower separation pattern BS2, and the residual lower separation pattern BSR. As the first lower separation pattern BS1, the second lower separation pattern BS2, and the residual lower separation pattern BSR are formed to have their flat top surface, the capping interlayer dielectric layer 15 may also be formed to have a flat top surface. First electrode interlayer dielectric layers 12 and third sacrificial layers 14$e$ may be alternately stacked on the capping interlayer dielectric layer 15. A first preliminary stack structure PST1 may thus be formed. The first preliminary stack structure PST1 may include various layers 12, 14$a$, 14$b$1, 14$b$2, TPO, 15, and 14$e$ positioned on the second buffer layer 18. The third sacrificial layers 14$e$ may be formed of silicon nitride (Si$_3$N$_4$) layer.

Referring to FIG. 12C, a trimming process and an anisotropic etching process may be repeatedly performed such that the first electrode interlayer dielectric layers 12 and the third sacrificial layers 14$e$ on the capping interlayer dielectric layer 15 may be formed to have a stepwise shape at their ends on the connection region CNR. For example, the etching of the first electrode interlayer dielectric layers 12 and the third sacrificial layers 14$e$ and the reducing of the width of a mask pattern that is used as an etch mask may be repeatedly performed during the trimming and anisotropic etching processes. A first planarized dielectric layer 210 may be formed and then a chemical mechanical polishing (CMP) process may be executed to cover the ends of the first electrode interlayer dielectric layers 12 and the third sacrificial layers 14$e$.

On the cell array region CAR, a plurality of lower holes BH may be formed by etching the first preliminary stack structure PST1, the first source pattern SC1, the second buffer layer 18, the first sacrificial layer 17, the first buffer layer 16, and a portion of the second substrate 201. In this stage, some of the lower holes BH may be formed in the first lower separation patterns BS1. The lower holes BH may be correspondingly filled with lower sacrificial buried patterns BGP. The lower sacrificial buried pattern BGP may be a material having an etch selectivity with respect to the first electrode interlayer dielectric layers 12, the sacrificial layers 14$a$, 14$b$1, and 14$e$, the first source pattern SC1, the second buffer layer 18, the first sacrificial layer 17, the first buffer layer 16, and the second substrate 201. For example, the lower sacrificial buried pattern BGP may have an etch rate significantly higher than etch rates of the other layers, pattern and substrate described above in an etching process, and may be selectively removed in the etching process. For example, the lower sacrificial buried pattern BGP may include, for example, a spin-on-hardmask (SOH) layer, an amorphous carbon layer (ACL), or a silicon germanium (SiGe) layer.

Figure 13A:
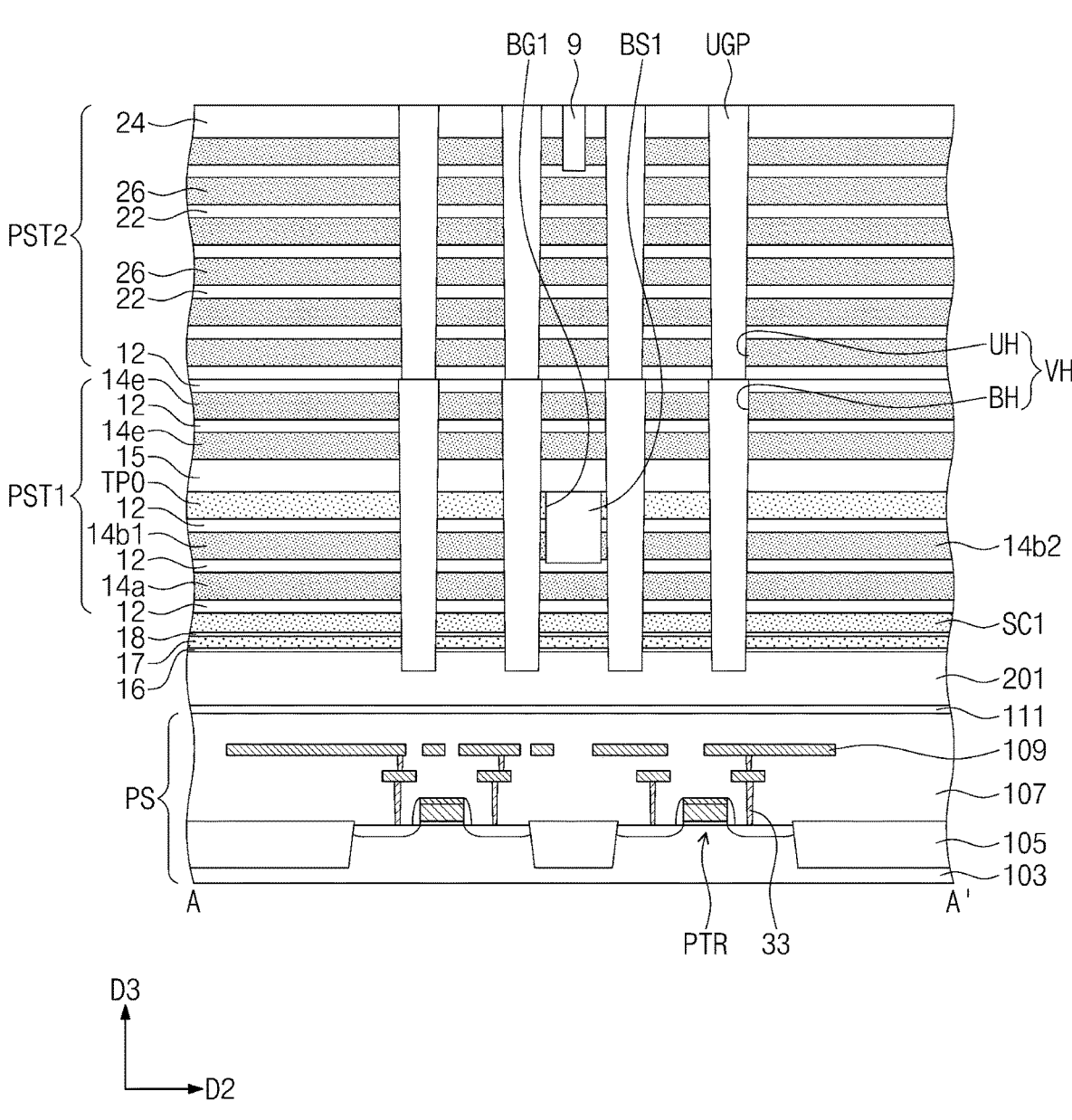
Figure 13B:
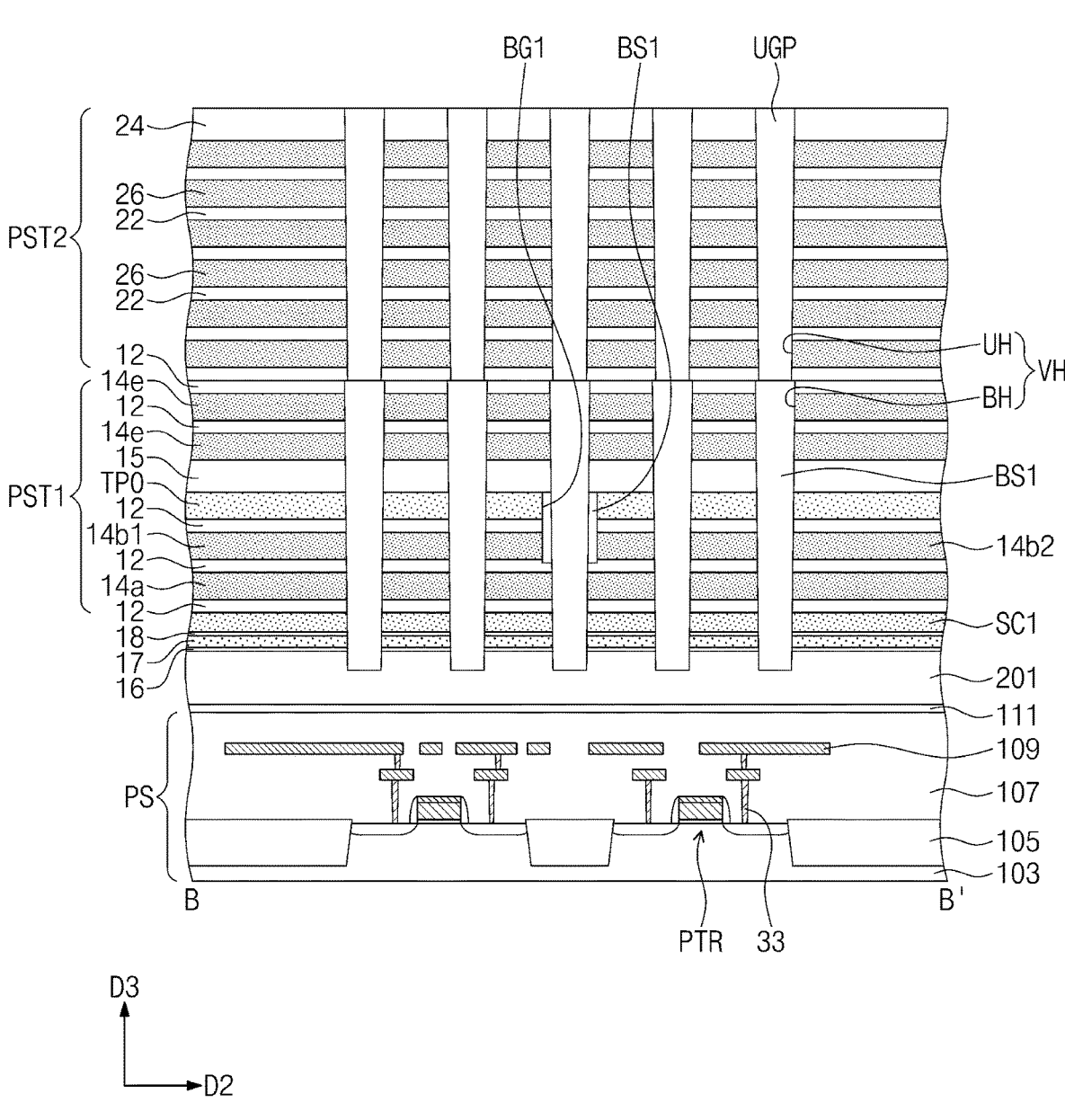
Figure 13C:
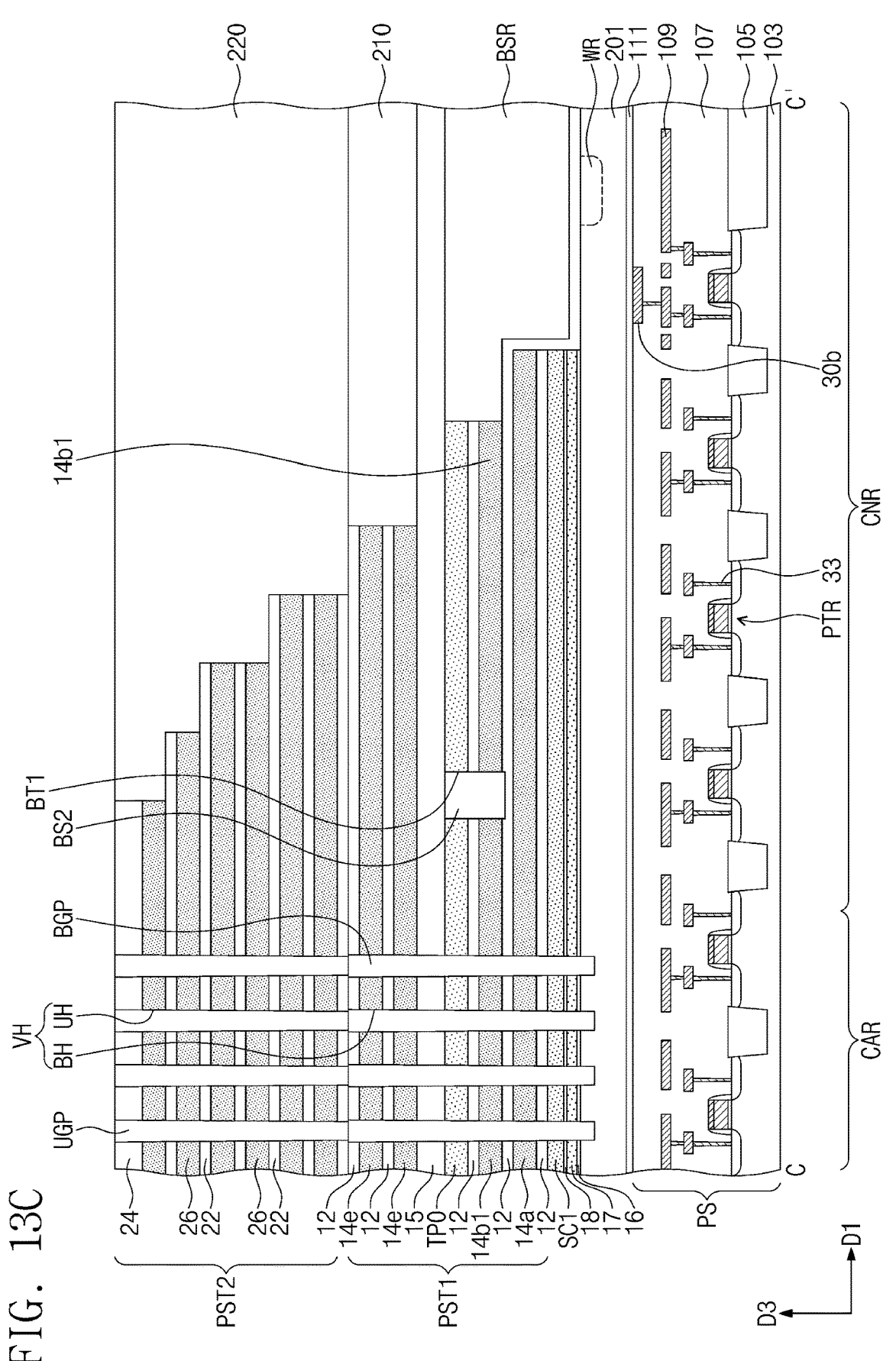

Referring to FIGS. 13A to 13C, a second preliminary stack structure PST2 may be formed by alternately and repeatedly stacking second electrode interlayer dielectric layers 22 and 24 and fourth sacrificial layers 26 on the first preliminary stack structure PST1 and the first planarized dielectric layer 210. The second electrode interlayer dielectric layer 22 and 24 may include a material the same as that of the first electrode interlayer dielectric layers 12. The fourth sacrificial layer 26 may be formed of a material, or silicon nitride (Si₃N₄), the same as that of the third sacrificial layers 14e. A groove may be formed by etching the fourth sacrificial layer 26 and the second electrode interlayer dielectric layers 22 and 24 positioned at top of the second preliminary stack structure PST2, and the groove may be filled with a dielectric layer to form an upper separation pattern 9. The upper separation pattern 9 may be formed to overlap the first lower separation patterns BS1. The upper separation pattern 9 may include a material the same as that of the first lower separation patterns BS1 and that of the electrode interlayer dielectric layers 12, 22, and 24.

A trimming process and an anisotropic etching process may be repeatedly performed such that the second electrode interlayer dielectric layers 22 and 24 and the fourth sacrificial layers 26 may be formed to have a stepwise shape at their ends on the connection region CNR. For example, the etching of the second electrode interlayer dielectric layers 22 and 24 and the fourth sacrificial layers 26 and the reducing of the width of a mask pattern that is used as an etch mask may be repeatedly performed during the trimming and anisotropic etching processes. A second planarized dielectric layer 220 may be formed, and then a chemical mechanical polishing (CMP) process may be executed to cover an end of the second preliminary stack structure PST2. On the cell array region CAR, the second preliminary stack structure PST2 may be etched to form upper holes UH that correspondingly expose the lower sacrificial buried patterns BGP. One or more of the upper holes UH may be formed in the upper separation pattern 9. The upper holes UH may be filled with upper sacrificial buried patterns UGP. The upper sacrificial buried patterns UGP may include, for example, a spin-on-hardmask (SOH) layer, an amorphous carbon layer (ACL), or a silicon germanium (SiGe) layer.

On the cell array region CAR, the upper holes UH and the lower holes BH that overlap each other may constitute vertical holes VH and central dummy vertical holes CDVH. The central dummy vertical holes CDVH may be disposed between the vertical holes VH and may be arranged along the first direction D1. The central dummy vertical holes CDVH may be formed in the first lower separation patterns BS1. On the connection region CNR, edge dummy vertical holes EDVH may be formed simultaneously with the vertical holes VH and the central dummy vertical holes CDVH. In an embodiment of the present inventive concept, instead of forming the lower holes BH first then forming the upper holes UH, the first preliminary stack structure PST1 and the second preliminary stack structure PST2 may be formed first, then the vertical holes VH may be formed by sequentially etching the second preliminary stack structure PST2 and the first preliminary stack structure PST1 to expose the second substrate 201.

Figure 14A:
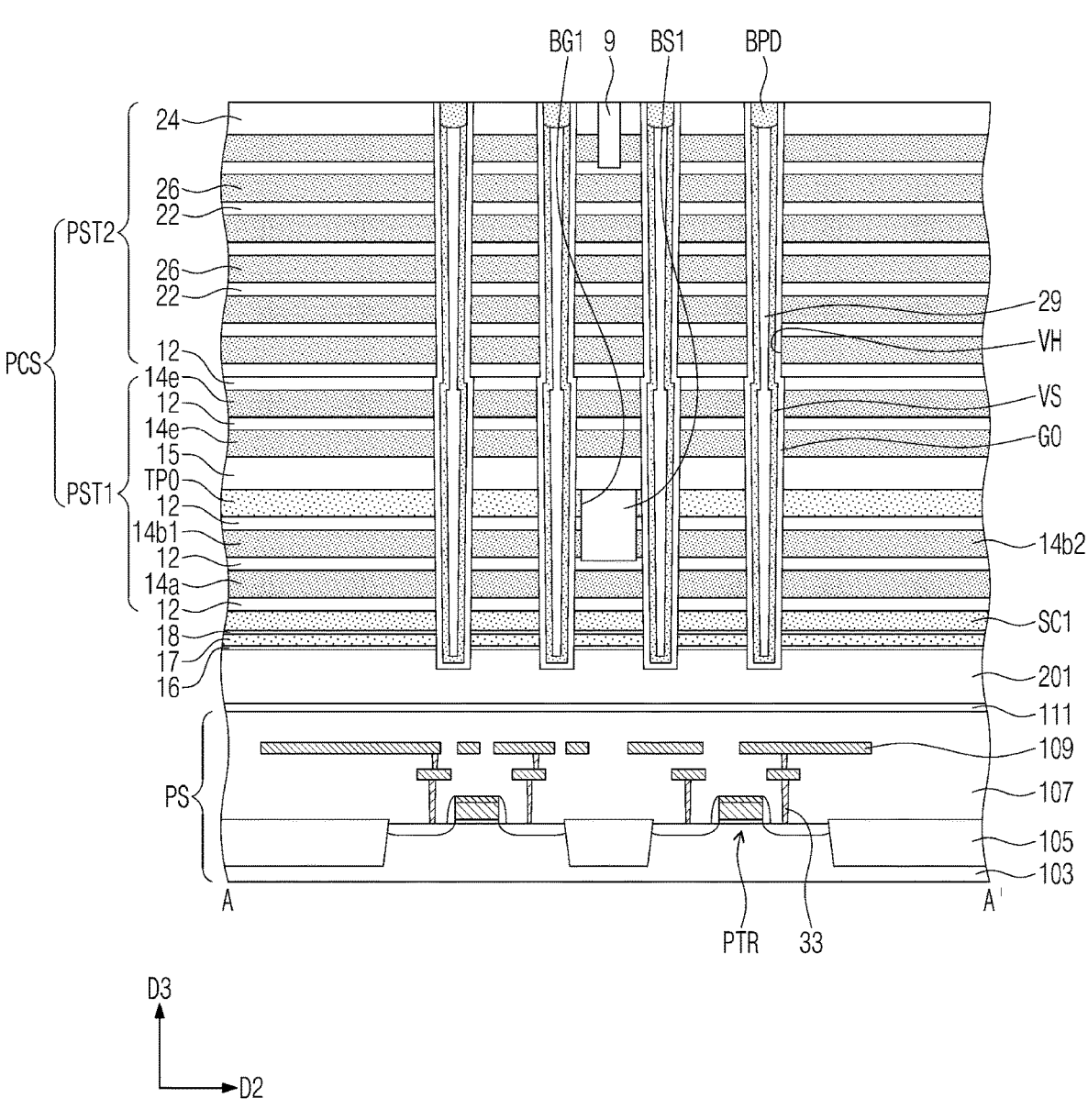
Figure 14B:
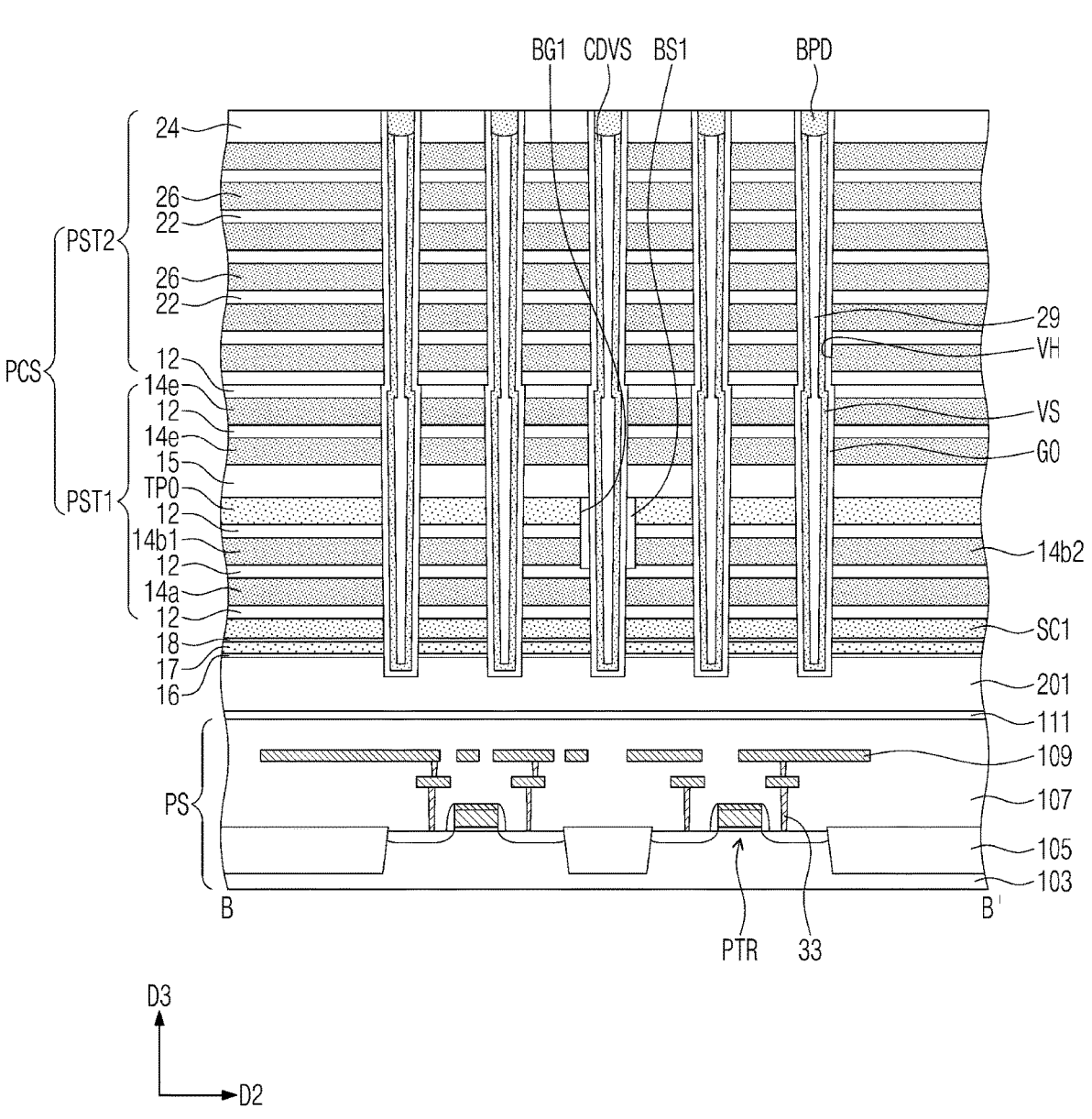
Figure 14C:
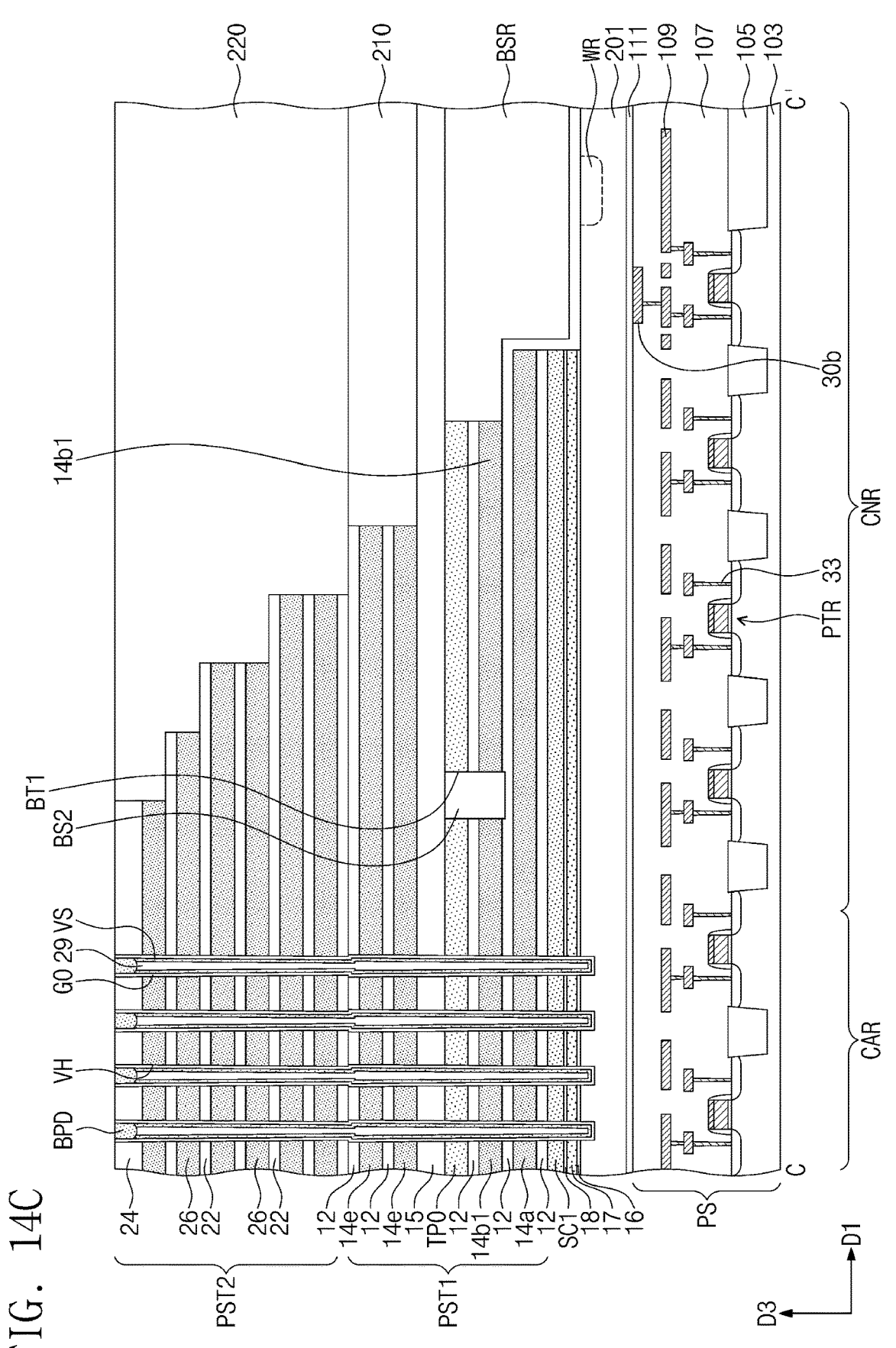

Referring to FIGS. 14A to 14C, the upper sacrificial buried pattern UGP and the lower sacrificial buried pattern BGP may be removed from the vertical holes VH and the central dummy vertical holes CDVH to expose inner surfaces of the vertical holes VH, the central dummy vertical holes CDVH, and the edge dummy vertical holes EDVH. A gate dielectric layer GO may be formed in the vertical holes VH, the central dummy vertical holes CDVH, and the edge dummy vertical holes EDVH. As shown in FIG. 6, a blocking dielectric layer BCL, a charge storage layer SN, and a tunnel dielectric layer TL may be sequentially conformally stacked on the first preliminary stack structure PST1 and the second preliminary stack structure PST2 in which the vertical holes VH and the central dummy vertical holes CDVH are formed. A silicon (Si) layer may be conformally deposited on the gate dielectric layer GO. A dielectric layer may be formed on the silicon (Si) layer to thereby fill the vertical holes VH, the central dummy vertical holes CDVH, and the edge dummy vertical holes EDVH. An etch-back or CMP process may be performed to form cell vertical semiconductor patterns VS, central dummy vertical semiconductor patterns CDVS, and edge dummy vertical semiconductor patterns EDVS in the vertical holes VH, the central dummy vertical holes CDVH, and the edge dummy vertical holes EDVH, respectively. Upper portions of the cell vertical semiconductor patterns VS, the central dummy vertical semiconductor patterns CDVS, and the edge dummy vertical semiconductor patterns EDVS may be partially removed, and then removed portions may be filled with an impurity-doped silicon (Si) layer to form bit-line pads BPD. Accordingly, a preliminary cell array structure PCS may be formed.

Figure 15A:
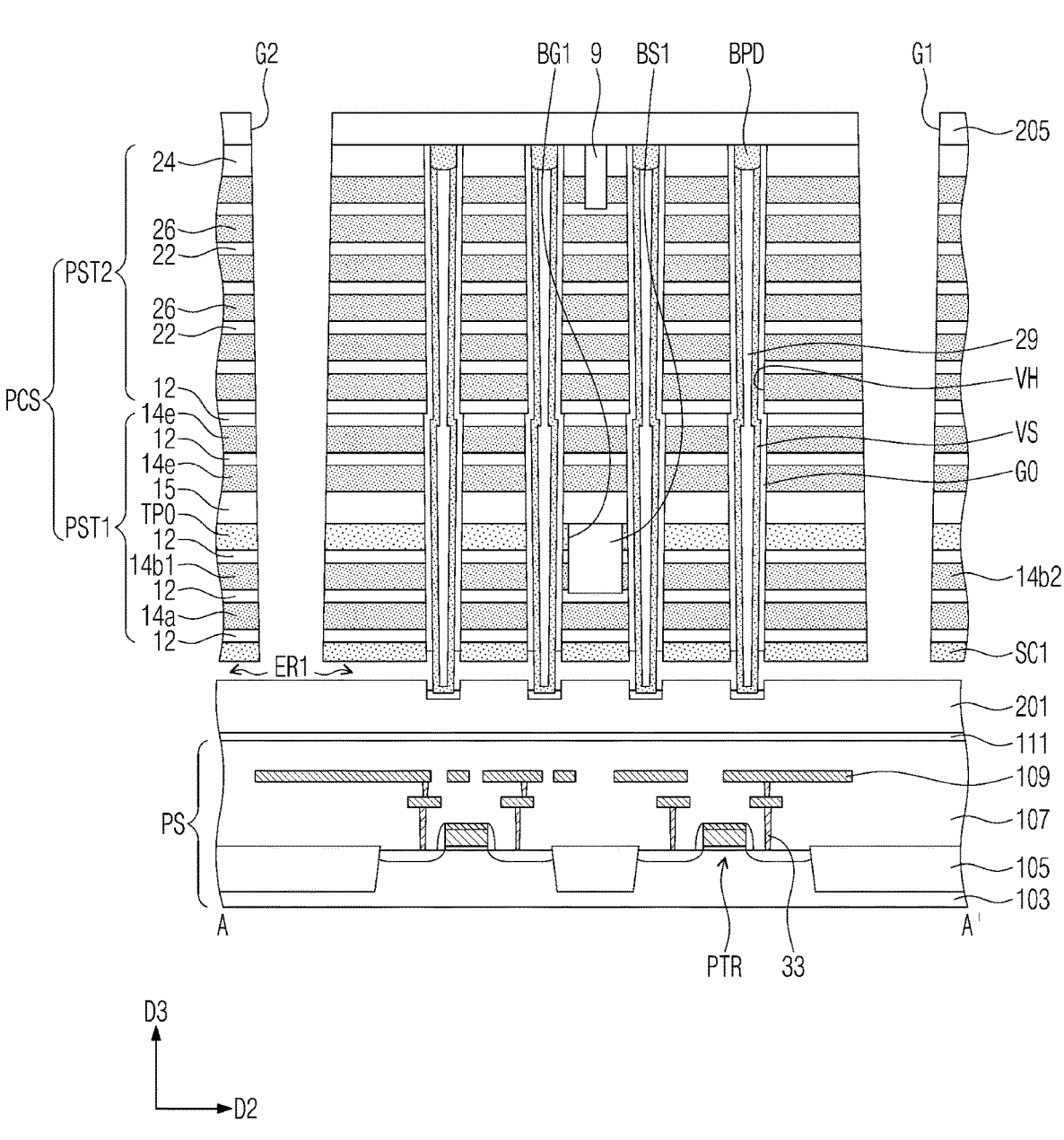
Figure 15B:
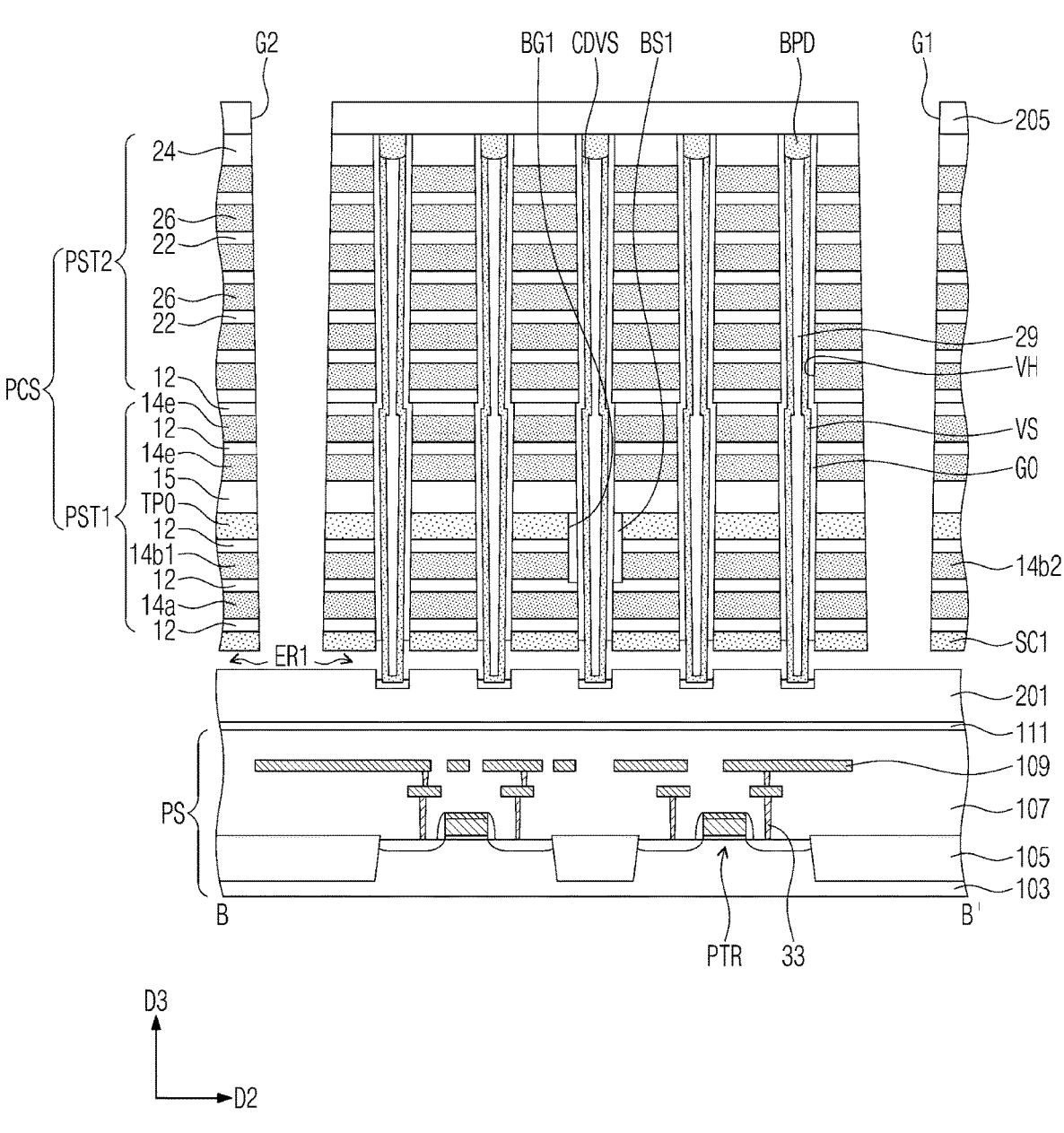
Figure 15C:
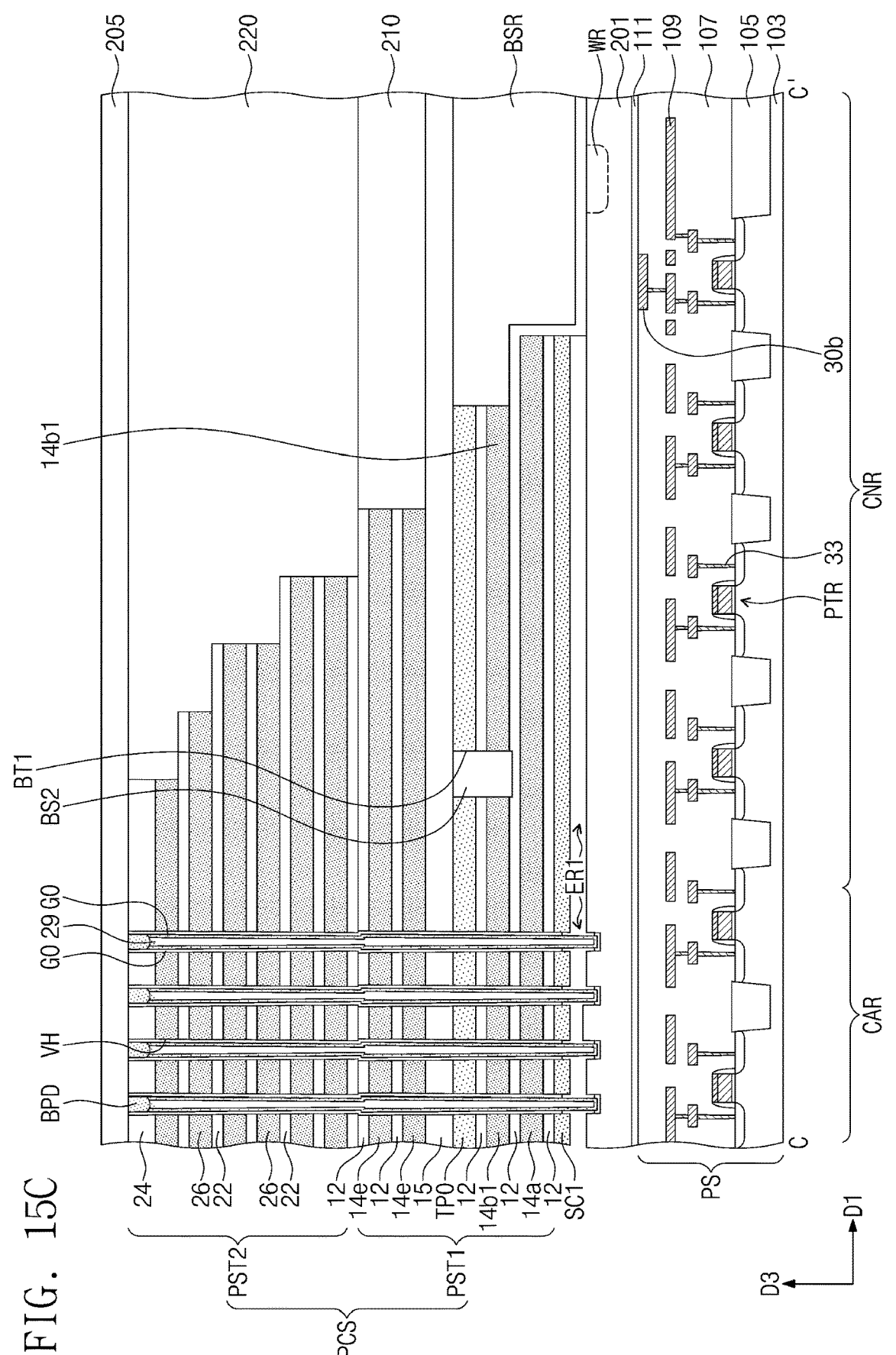

Referring to FIGS. 15A to 15C, a first upper interlayer dielectric layer 205 may be stacked on the second preliminary stack structure PST2. The first upper interlayer dielectric layer 205, the second preliminary stack structure PST2, the first preliminary stack structure PST1, the first source pattern SC1, and the second buffer layer 18 may be sequentially etched to form first and second grooves G1 and G2 that expose the first sacrificial layer 17. A mask pattern may be formed on the first upper interlayer dielectric layer 205, and may be used as an etch mask for etching the first upper interlayer dielectric layer 205, the second preliminary stack structure PST2, the first preliminary stack structure PST1, the first source pattern SC1, and the second buffer layer 18. After the first and second grooves G1 and G2 are formed, the mask pattern may be removed. As illustrated in FIG. 4A or 4C, the second grooves G2 may be formed to expose a sidewall of the second lower separation pattern BS2. The formation of the second grooves G2 may divide the central sacrificial pattern 14b1 of FIG. 10 into two pieces. A first empty space ER1 may be formed by removing the second buffer layer 18, the first sacrificial layer 17, and the first buffer layer 16 through the first and second grooves G1 and G2.

When the first empty space ER1 is formed, a portion of the gate dielectric layer GO may be removed to expose lower sidewalls of the cell vertical semiconductor pattern VS, the central dummy vertical semiconductor pattern CDVS, and the edge dummy vertical semiconductor pattern EDVS. When the first empty space ER1 is formed, the cell vertical semiconductor pattern VS, the central dummy vertical semiconductor pattern CDVS, and the edge dummy vertical semiconductor pattern EDVS may support and prevent collapse of the preliminary cell array structure PCS.

Figure 16A:
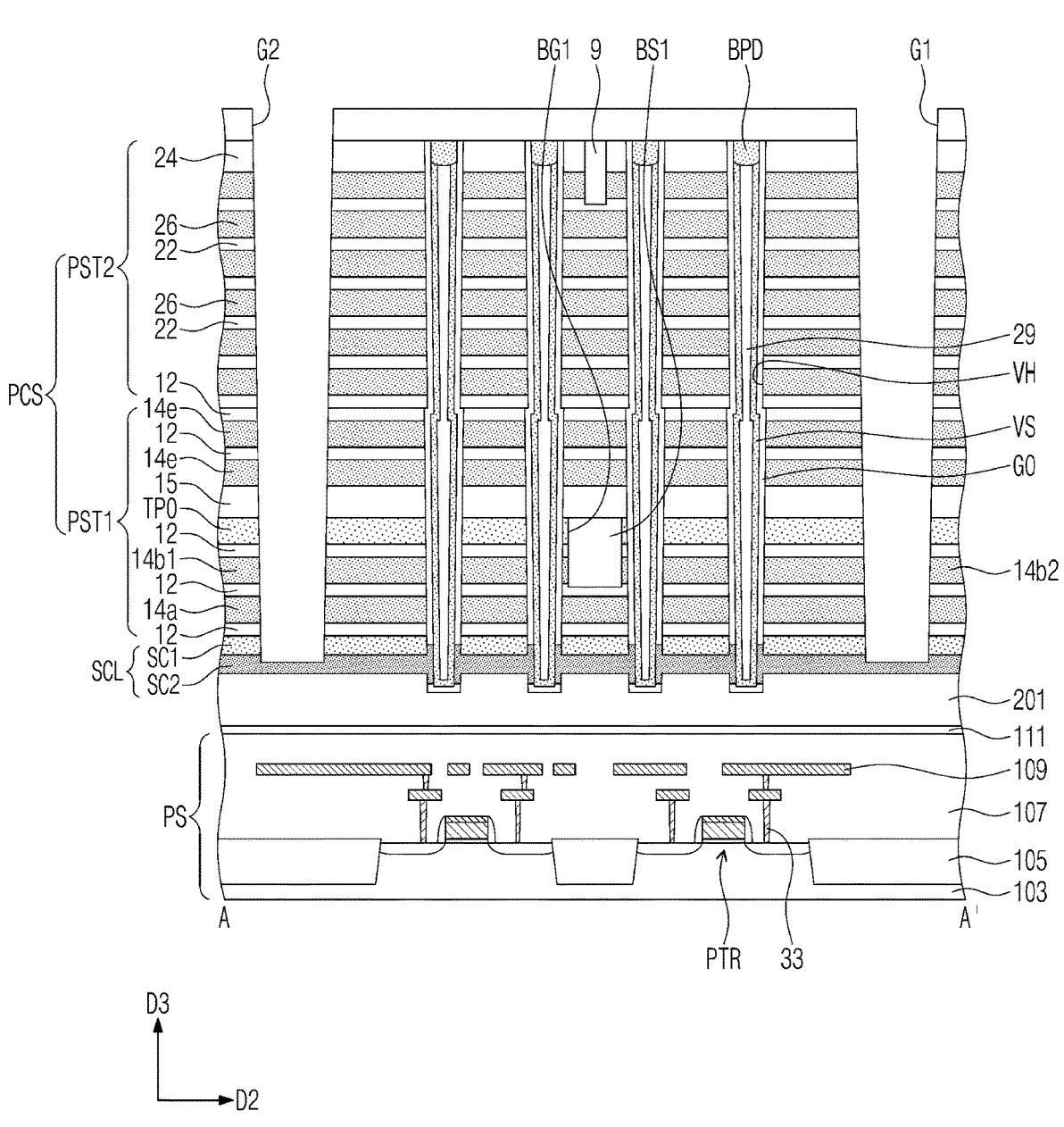
Figure 16B:
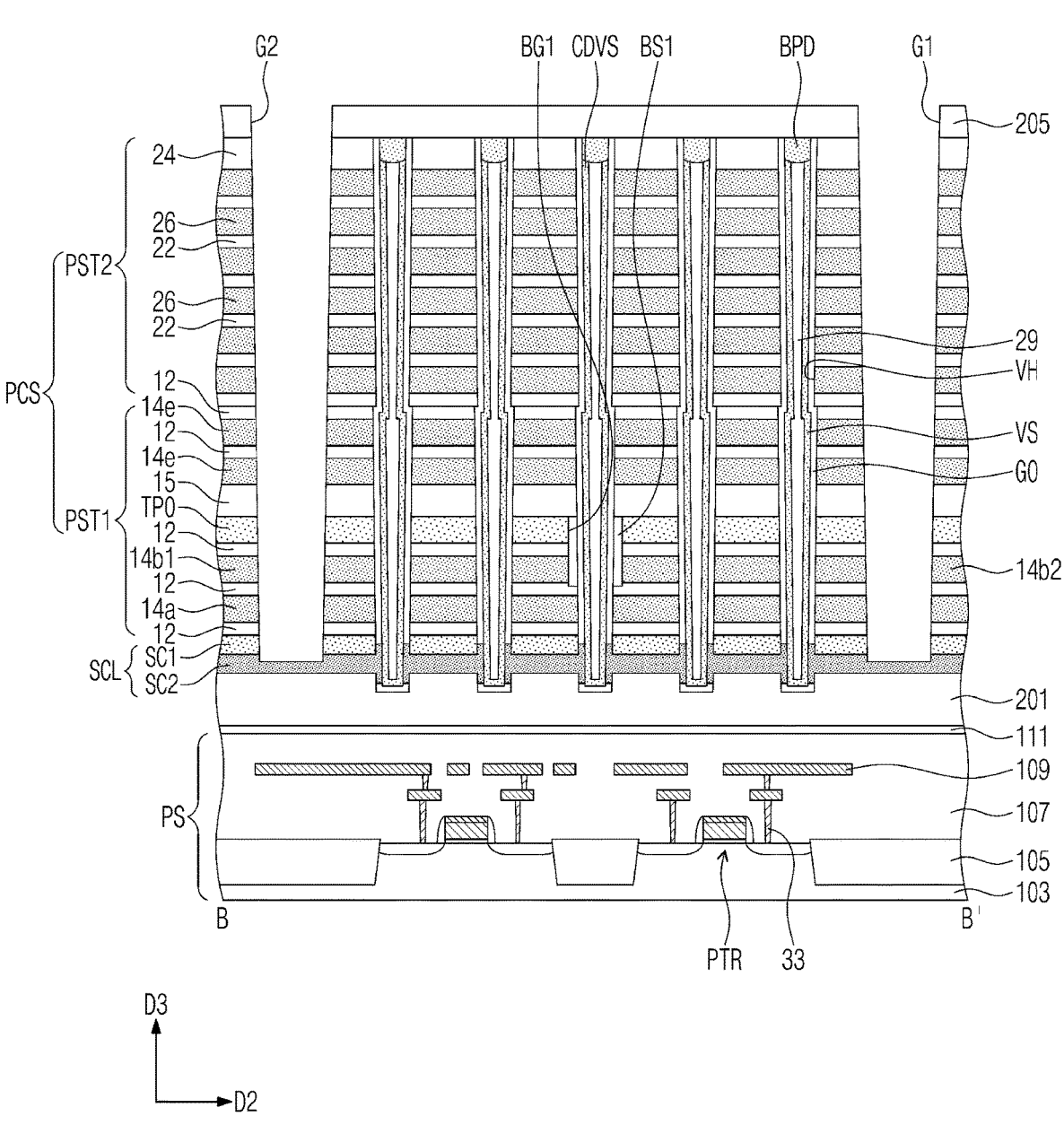
Figure 16C:
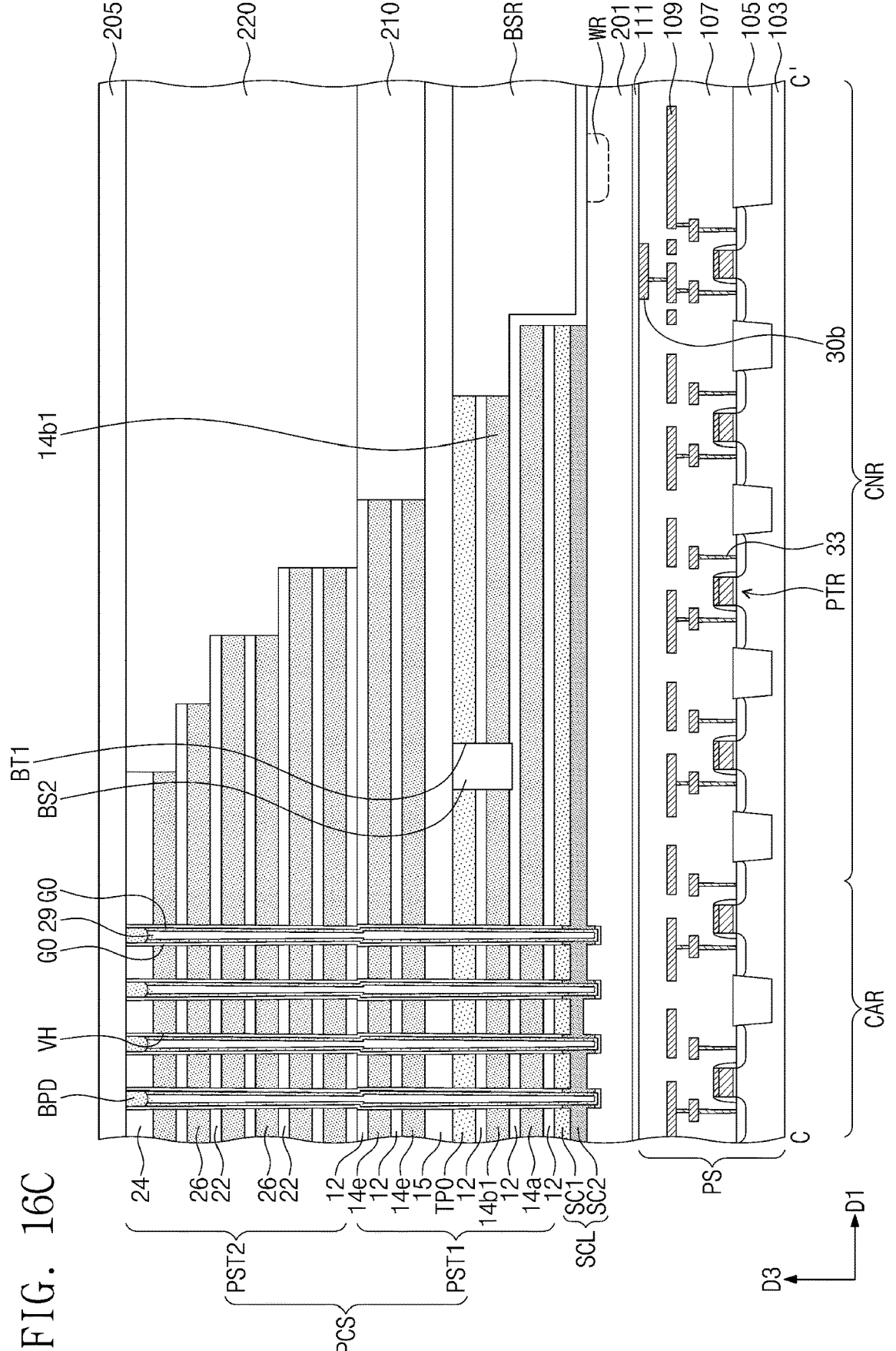

Referring to FIGS. 16A to 16C, a second source layer may be provided through the first and second grooves G1 and G2 to conformally stacked so as to fill the first empty space ER1, and then an anisotropic etching process may be performed to remove the second source layer from the first and second grooves G1 and G2 and to leave the second source layer in the first empty space ER1, thereby forming a second source pattern SC2. Accordingly, the first source pattern SC1 and the second source pattern SC2 may constitute a source structure SCL. The portion of the second source pattern SC2 adjacent to each of the cell vertical semiconductor pattern VS, the central dummy vertical semiconductor pattern CDVS, and the edge dummy vertical semiconductor pattern EDVS may protrude upward to replace a portion of the gate dielectric layer GO interposed between the first source pattern SC1 and each of the cell vertical semiconductor pattern VS, the central dummy vertical semiconductor pattern CDVS, and the edge dummy vertical semiconductor pattern EDVS, and may protrude downward to replace a portion of the gate dielectric layer GO interposed between the second substrate 201 and each of the cell vertical semiconductor pattern VS, the central dummy vertical semiconductor pattern CDVS.

Figure 17A:
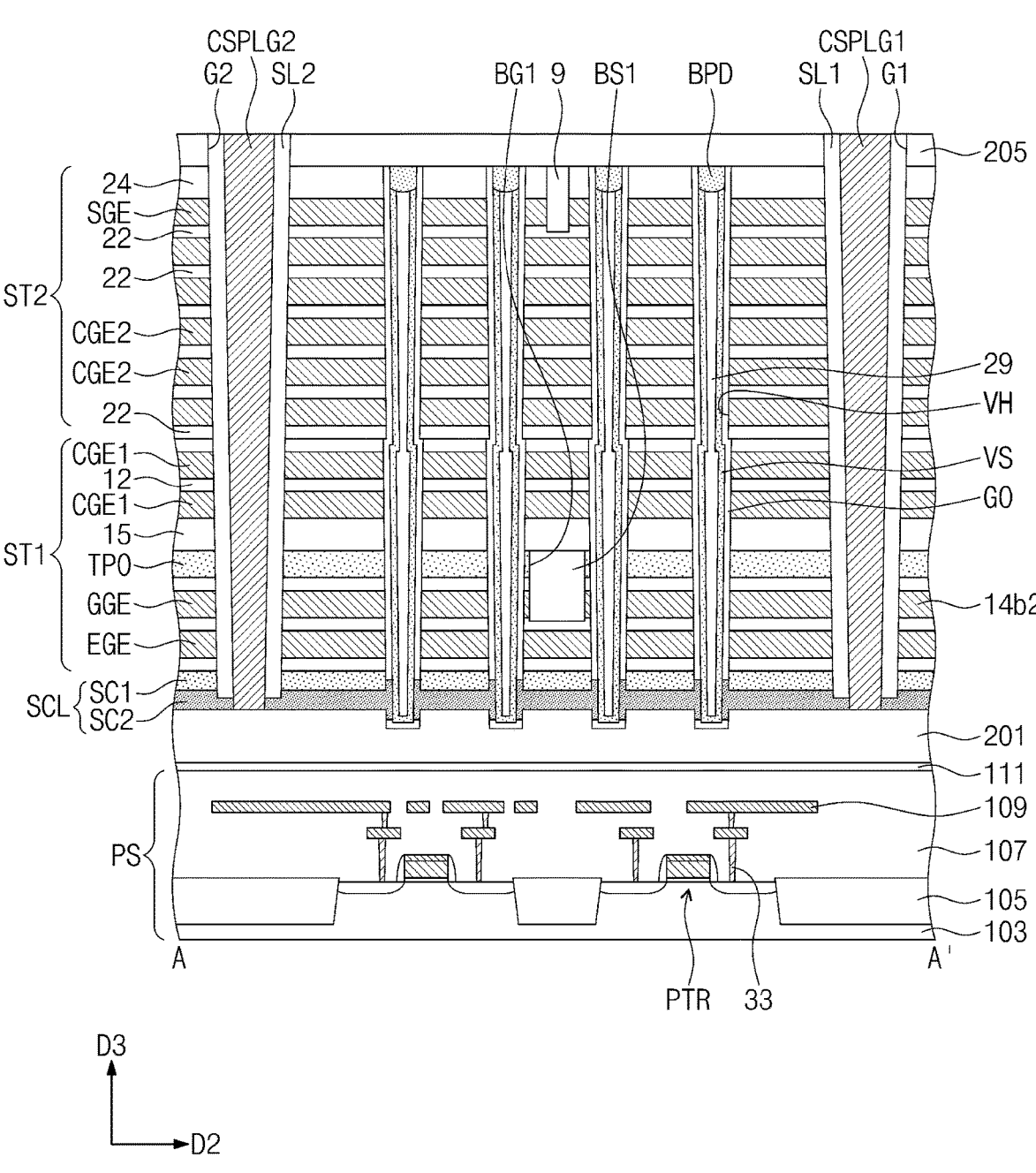
Figure 17B:
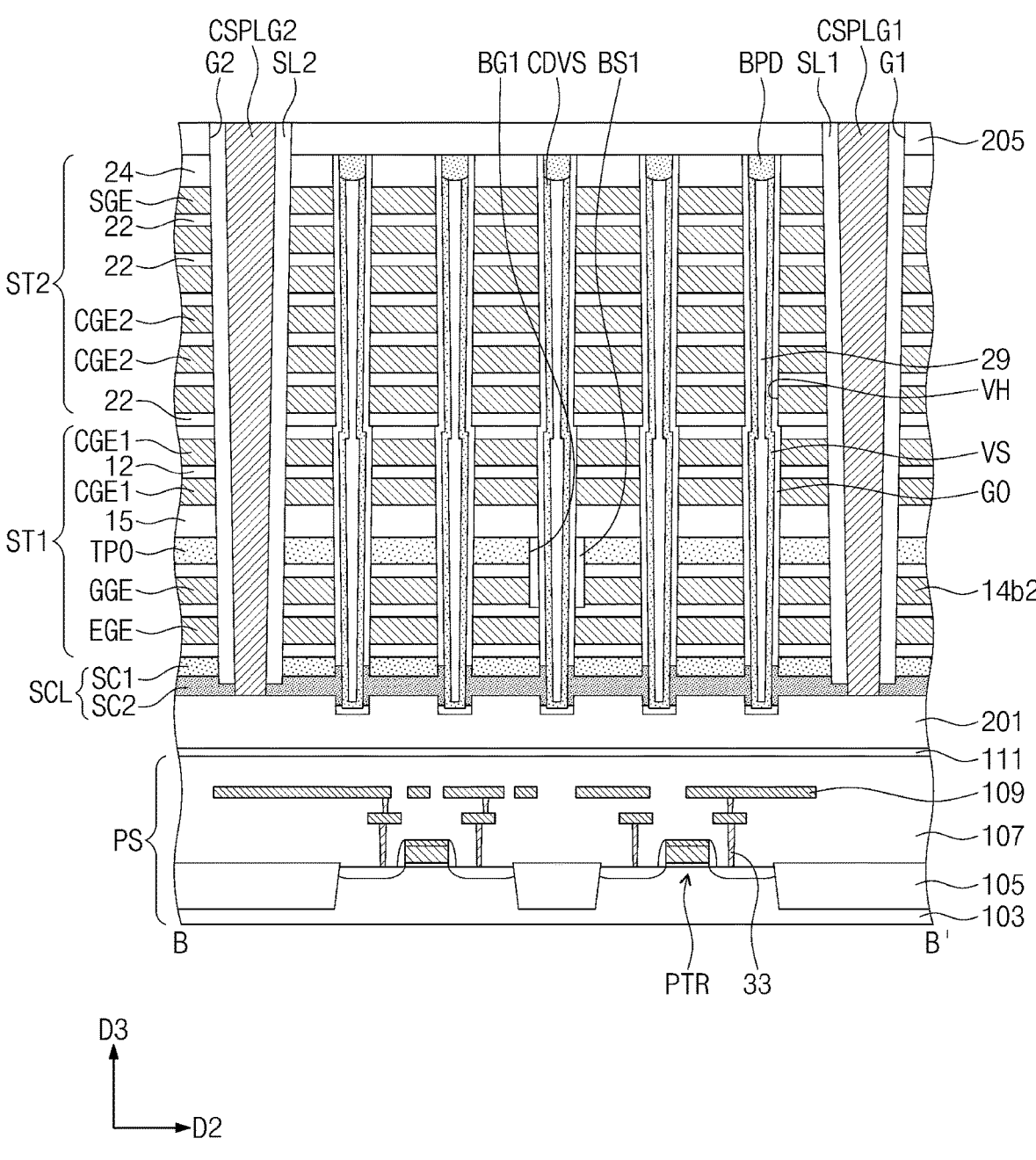
Figure 17C:
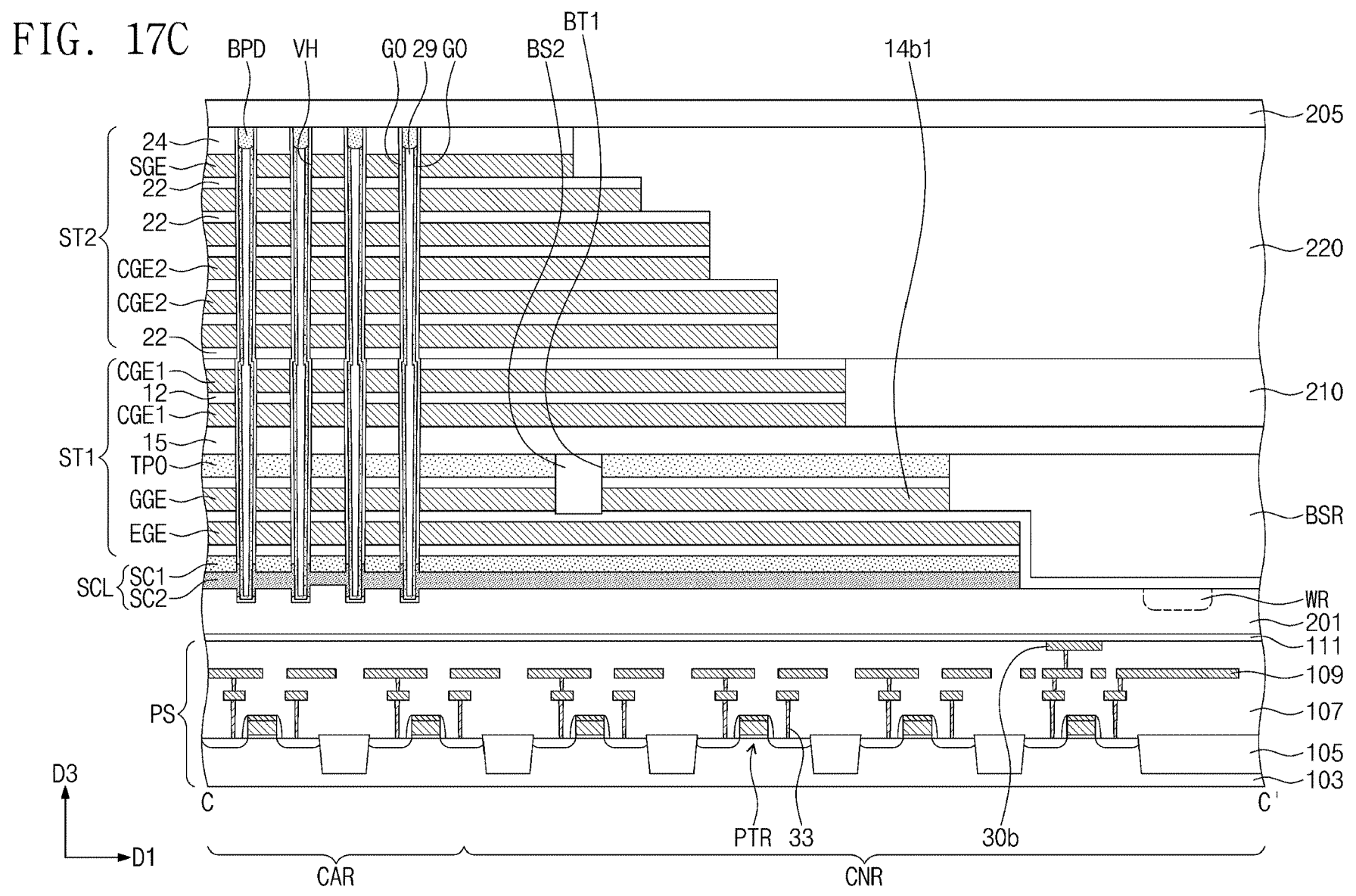

Referring to FIGS. 17A to 17C, the another sacrificial layer 14a, the central sacrificial pattern 14b1, the edge sacrificial patterns 14b2, the third sacrificial layers 14e, and the fourth sacrificial layer 26 may be removed through the first and second grooves G1 and G2, such that second empty spaces may be formed between the electrode interlayer dielectric layers 12, 22, and 24. A conductive layer may be conformally stacked to fill the second empty spaces through the first and second grooves G1 and G2. An anisotropic etching process may be performed to remove the conductive layer from the first and second grooves G1 and G2, such that first and second gate electrodes EGE, GGE, CGE1, CGE2, and SGE may be formed in the second empty spaces. Therefore, a first sub-stack structure ST1 and a second sub-stack structure ST2 may be formed. Before the conductive layer is stacked to form the first and second gate electrodes EGE, GGE, CGE1, CGE2, and SGE, a high-k dielectric layer HL of FIG. 6 may be formed. A dielectric layer may be conformally stacked and then anisotropically etched to form first and second separation dielectric lines SL1 and SL2 to cover sidewalls of the first and second grooves G1 and G2. A conductive layer may be stacked to form a first source connection line CSPLG1 and a second source connection line CSPLG2 that fill the first and second grooves G1 and G2. Subsequently, typical processes may be executed to fabricate a three-dimensional semiconductor memory device discussed with reference to FIGS. 3 to 6.

As the polishing stop pattern TPO is converted into silicon oxide ($SiO_2$) in the thermal oxidation process, the polishing stop pattern TPO may not be removed when removing the another sacrificial layer 14a, the central sacrificial pattern 14b1, the edge sacrificial patterns 14b2, the third sacrificial layers 14e, and the fourth sacrificial layer 26.

When the polishing stop pattern TPO remains as a polysilicon (p-Si) layer without being oxidized, the polishing stop pattern TPO may become a dummy electrode to adversely affect an operation of a three-dimensional semiconductor memory device that is eventually fabricated. In the present embodiment, the polishing stop pattern TPO may be oxidized into a dielectric layer to solve the problems mentioned above. Since only oxidized polysilicon (p-Si) remains, there is no concern of unwanted electrical connection of the polishing stop pattern TPO with any adjacent conductive components.

Figure 18A:
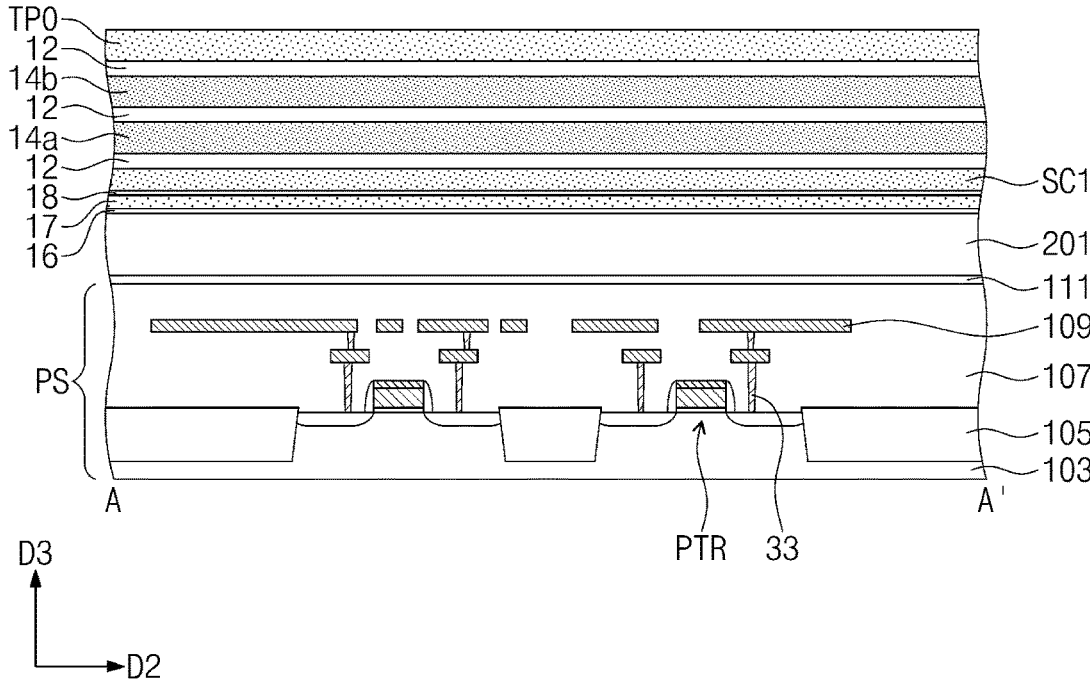
FIGS. 18A and 19A illustrate cross-sectional views showing a method of fabricating a three-dimensional semiconductor memory device whose plan view is shown in FIG. 5A.
Figure 18B:
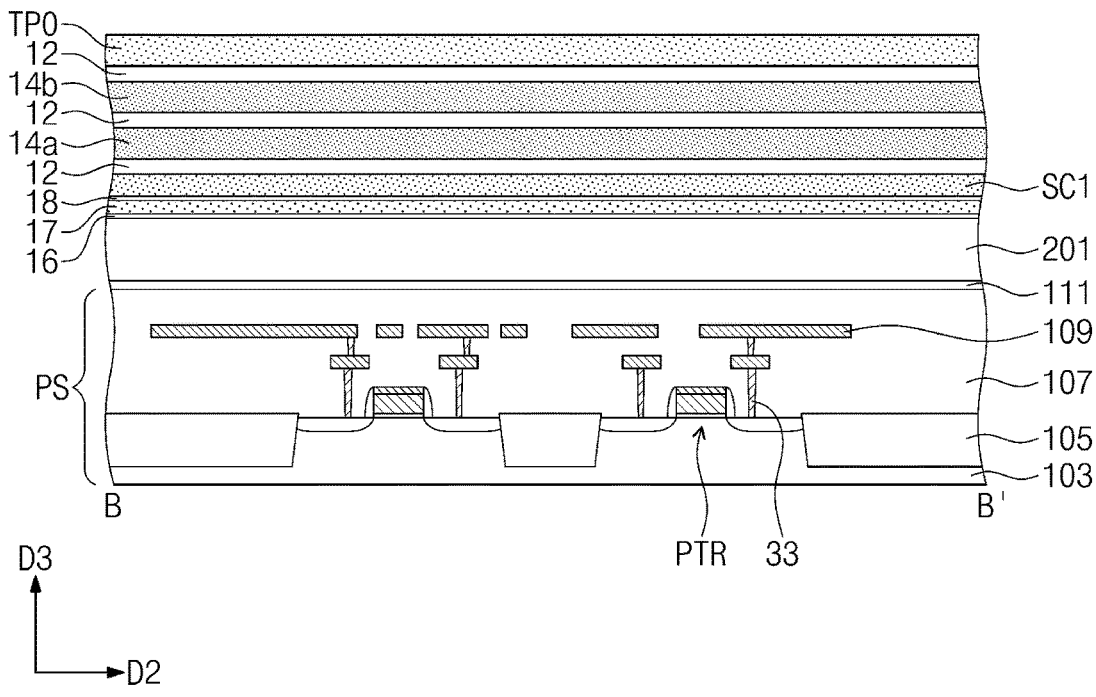
FIGS. 18B and 19B illustrate cross-sectional views showing a method of fabricating a three-dimensional semiconductor memory device whose cross-sectional view is shown in FIG. 5B.
Figure 18C:
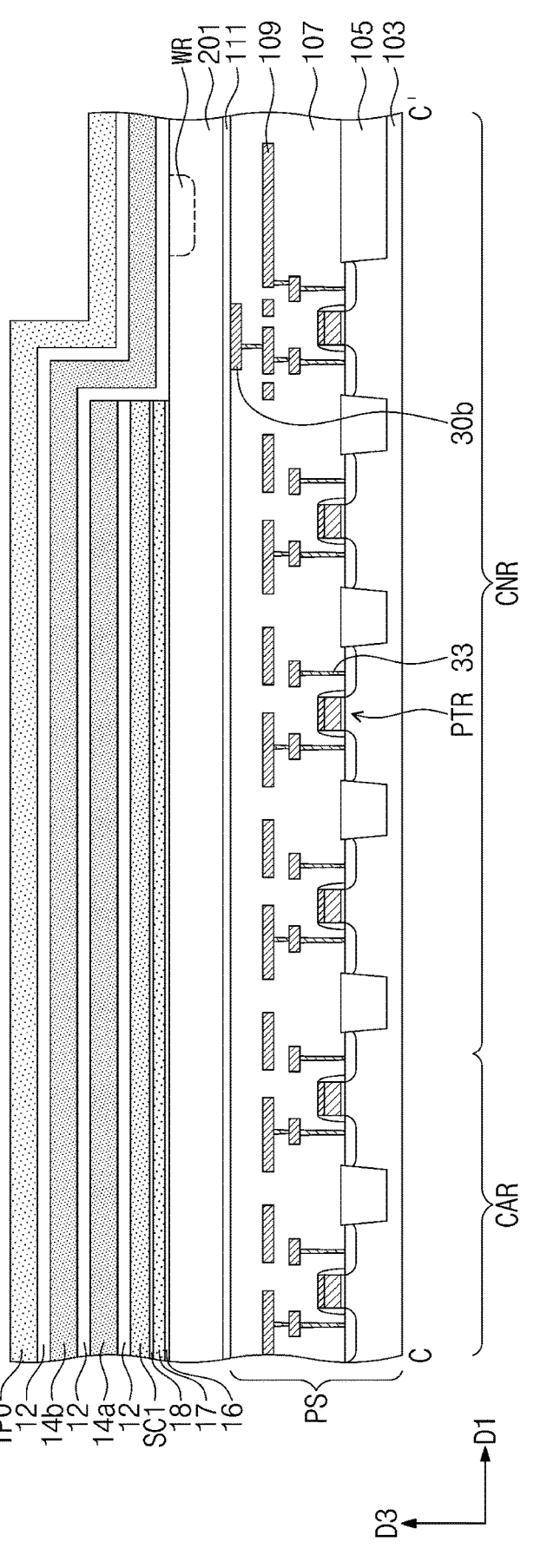
FIGS. 18C and 19C illustrate cross-sectional views showing a method of fabricating a three-dimensional semiconductor memory device whose cross-sectional view is shown in FIG. 5C.
Figure 19A:
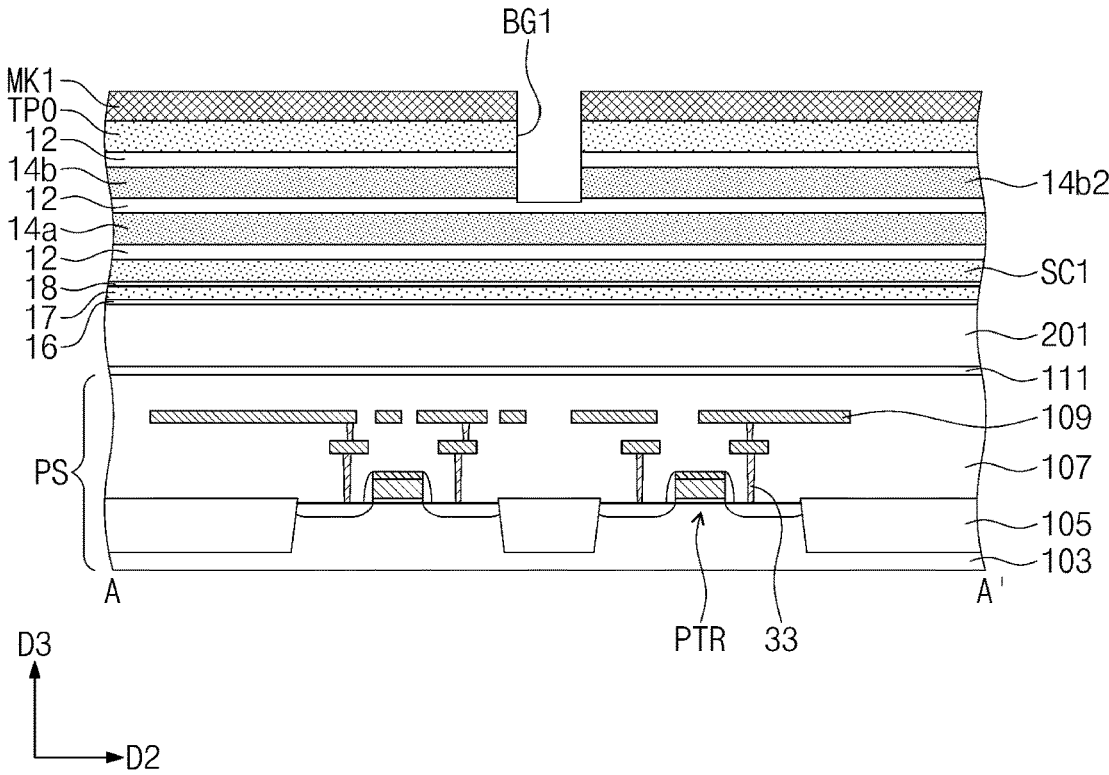
Figure 19B:
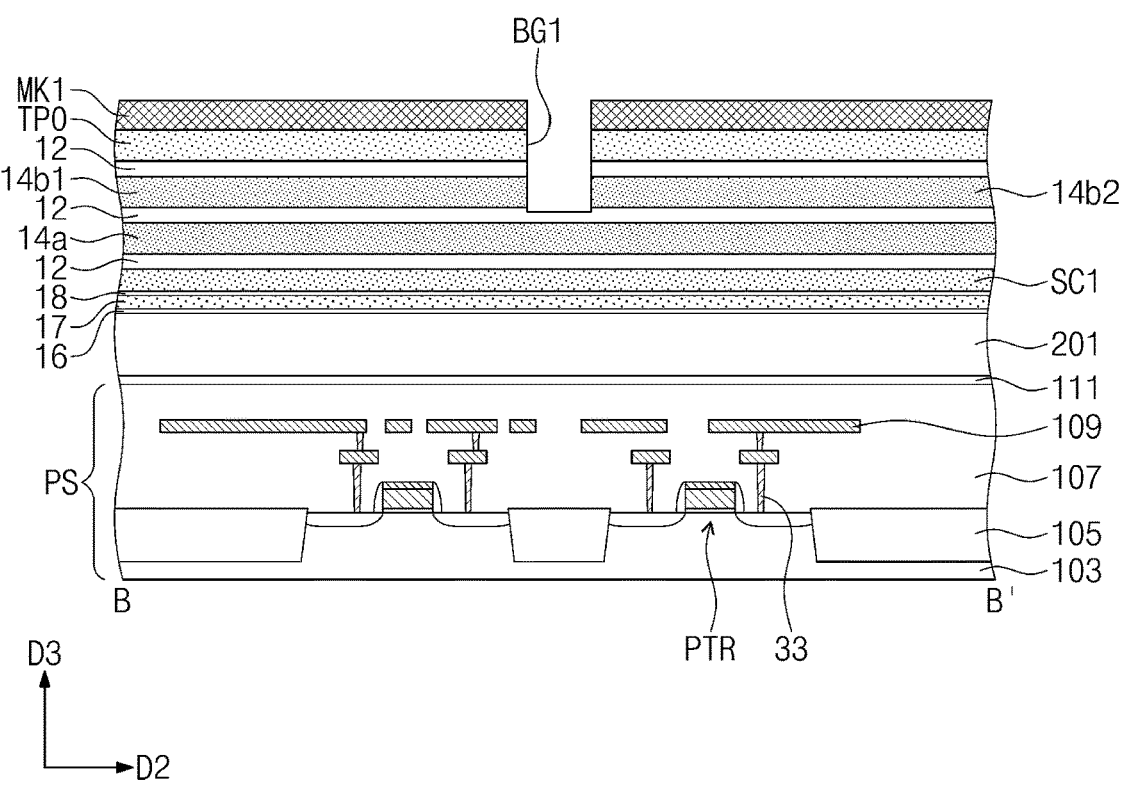
Figure 19C:
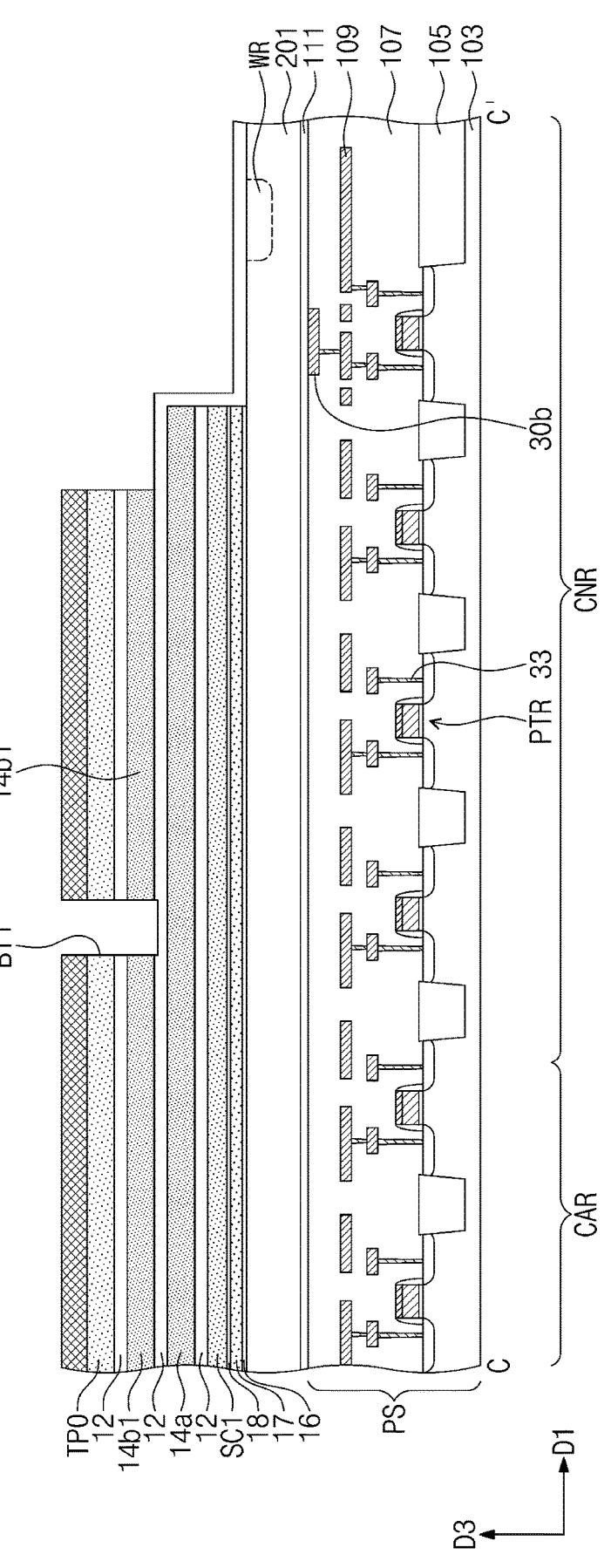

FIGS. 18A and 19A illustrate cross-sectional views showing a method of fabricating a three-dimensional semiconductor memory device whose plan view is shown in FIG. 5A. FIGS. 18B and 19B illustrate cross-sectional views showing a method of fabricating a three-dimensional semiconductor memory device whose cross-sectional view is shown in FIG. 5B. FIGS. 18C and 19C illustrate cross-sectional views showing a method of fabricating a three-dimensional semiconductor memory device whose cross-sectional view is shown in FIG. 5C.

Referring to FIGS. 18A to 18C, in the step of FIGS. 7A to 7C, a polishing stop pattern TPO instead of the polishing stop layer TP may be conformally formed on the first electrode interlayer dielectric layer 12. In this stage, the polishing stop pattern TPO may be formed of a dielectric material having an etch/polish selectivity with respect to the first electrode interlayer dielectric layer 12 and a buried dielectric layer which will be formed subsequently. In the present embodiment, the polishing stop pattern TPO may be formed of, for example, silicon carbonitride (SiCN).

Referring to FIGS. 19A to 19C, a first mask pattern MK1 may be formed on the polishing stop pattern TPO, and identically or similarly to that discussed with reference to FIGS. 8A to 8C, a lower separation groove BG1 and a lower trench BT1 may be formed. Subsequently, as discussed with reference to FIGS. 9A to 9C and 10, a buried dielectric may be stacked and then a chemical mechanical polishing (CMP) process may be performed to form first and second lower separation patterns BS1 and BS2 and a residual lower separation pattern BSR that respectively fill the lower separation groove BG1 and the lower trench BT1.

In the present embodiment, as the polishing stop pattern TPO is formed of silicon carbonitride (SiCN) or a dielectric layer, subsequent processes discussed with reference to FIGS. 12A to 17C may be immediately performed without executing an oxidation process discussed with reference to FIGS. 11A to 11C, with the result that a three-dimensional semiconductor memory device may be fabricated as discussed with reference to FIGS. 3 to 6.

In a fabrication method according to the present embodiment, because the polishing stop pattern TPO is formed of silicon carbonitride (SiCN) or a dielectric layer, it may not be required to remove the polishing stop pattern TPO. Therefore, process steps may become simplified, and a lower structure may have no step difference when the capping interlayer dielectric layer 15 is formed. Accordingly, the capping interlayer dielectric layer 15 may be formed to have a flat top surface, and thus process failure may be prevented. For example, subsequently-formed interlayer dielectric layers may be prevented from variation in thickness.

In a fabrication method according to the present embodiment, as the polishing stop pattern TPO is formed of silicon carbonitride (SiCN), the polishing stop pattern TPO may have an excellent etch selectivity with respect to silicon nitride ($Si_3N_4$). The polishing stop pattern TPO may not be removed when removing the another sacrificial layer 14a, the central sacrificial pattern 14b1, the edge sacrificial patterns 14b2, the third sacrificial layers 14e, and the fourth sacrificial layer 26.

Figure 20:
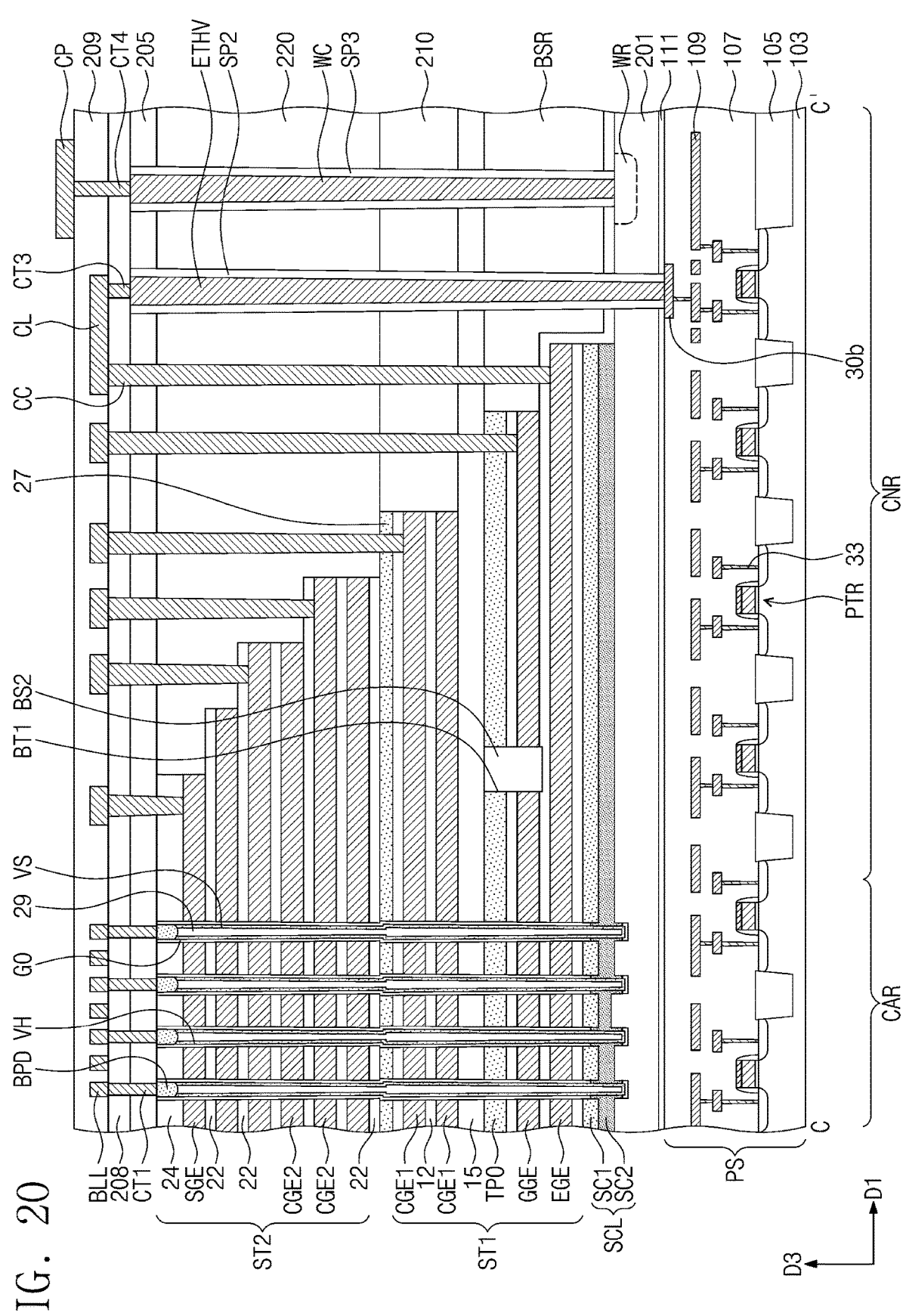
FIG. 20 illustrates a cross-sectional view taken along line C-C' of FIG. 3.

FIG. 20 illustrates a cross-sectional view taken along line C-C' of FIG. 3.

Referring to FIG. 20, a second polishing stop layer 27 may be positioned on the first sub-stack structure ST1 in the structure of FIG. 5C. Referring to FIGS. 5A and 20, the middle stack structure MS may include a first middle stack structure, which includes a lower portion of the middle stack structure MS within the first sub-stack structure ST1, and a second middle stack structure, which includes an upper portion of the middle stack structure MS within the second sub-stack structure ST2, positioned on the first middle stack structure. The second polishing stop layer 27 may be disposed between the first middle stack structure and the second middle stack structure. The second polishing stop layer 27 may be formed of silicon carbonitride (SiCN). Alternatively, the second polishing stop layer 27 may be formed of silicon oxide ($SiO_2$). For example, a silicon (Si) atomic concentration (or density/amount) of the second polishing stop layer 27 may be greater than those of the first electrode interlayer dielectric layers 12. Alternatively, a silicon (Si) atomic concentration (or density/amount) of the second polishing stop layer 27 may increase with decreasing distance from the second substrate 201. For example, the second polishing stop layer 27 may include a material the same as a material of the first polishing stop layer (i.e., the polishing stop pattern TPO). The second polishing stop layer 27 may have a top surface coplanar with that of the first planarized dielectric layer 210. The second polishing stop layer 27 may prevent dishing issues when a chemical mechanical polishing (CMP) process is performed on the first planarized dielectric layer 210 in the step of FIGS. 12A to 12C.

Figure 21:
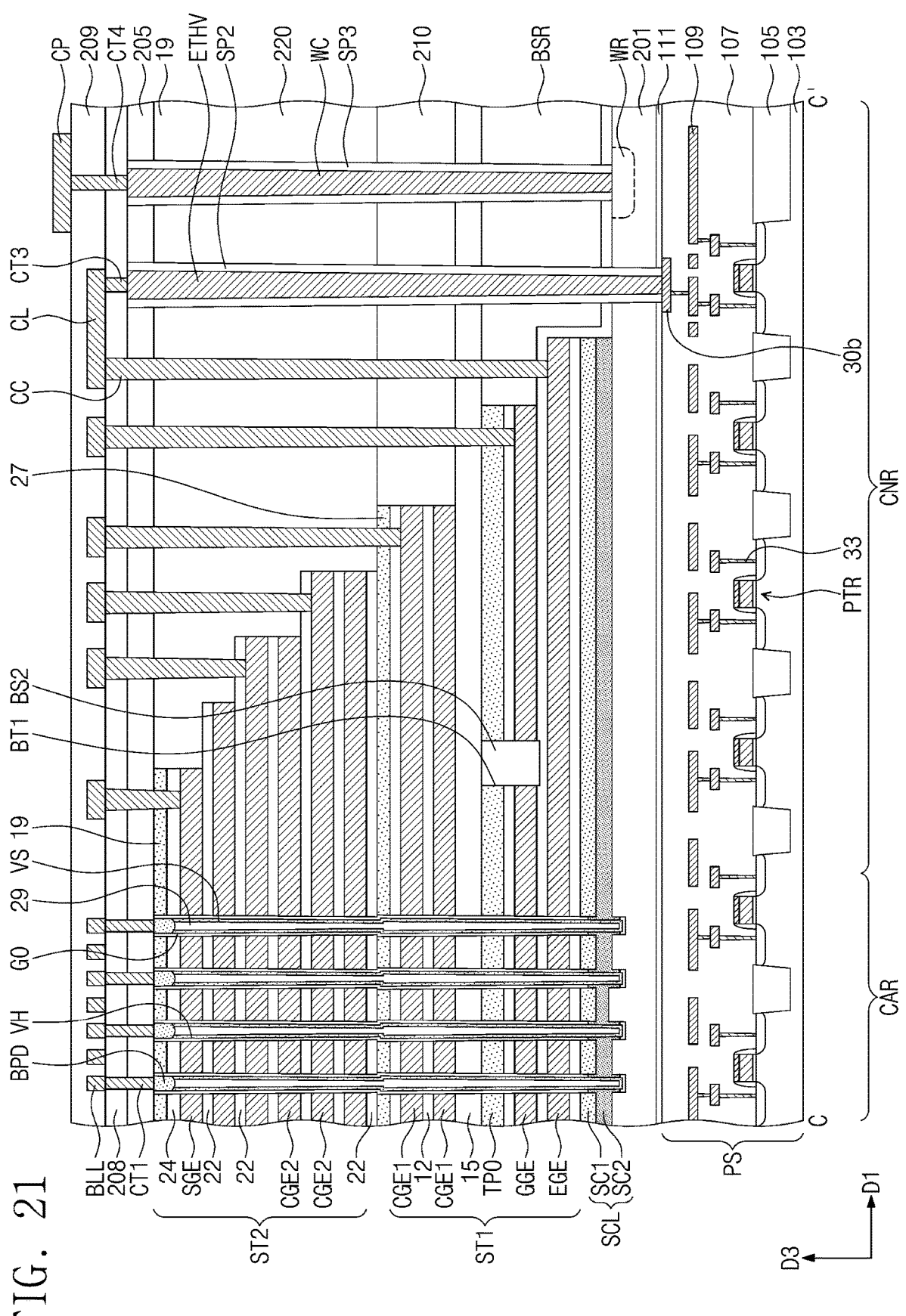
FIG. 21 illustrates a cross-sectional view taken along line C-C' of FIG. 3.

FIG. 21 illustrates a cross-sectional view taken along line C-C' of FIG. 3.

Referring to FIG. 21, a third polishing stop layer 19 may be positioned on the second sub-stack structure ST2 in the structure of FIG. 20. The third polishing stop layer 19 may be formed of silicon carbonitride (SiCN). Alternatively, the third polishing stop layer 19 may be formed of silicon oxide ($SiO_2$). For example, a silicon (Si) atomic concentration (or density/amount) of the third polishing stop layer 19 may be greater than those of the second electrode interlayer dielectric layers 22 and 24. Alternatively, a silicon (Si) atomic concentration (or density/amount) of the third polishing stop layer 19 may increase with decreasing distance from the second substrate 201. The third polishing stop layer 19 may have a top surface coplanar with that of the second planarized dielectric layer 220. For example, the third polishing stop layer 19 may cover the upper selection lines (i.e., the string selection gate electrodes SGE), and may include a material the same as a material of the first polishing stop layer (i.e., the polishing stop pattern TPO). The third polishing stop layer 19 may prevent dishing issues when a chemical mechanical polishing (CMP) process is performed on the second planarized dielectric layer 220 in the step of FIGS. 13A to 13C.

Figure 22:
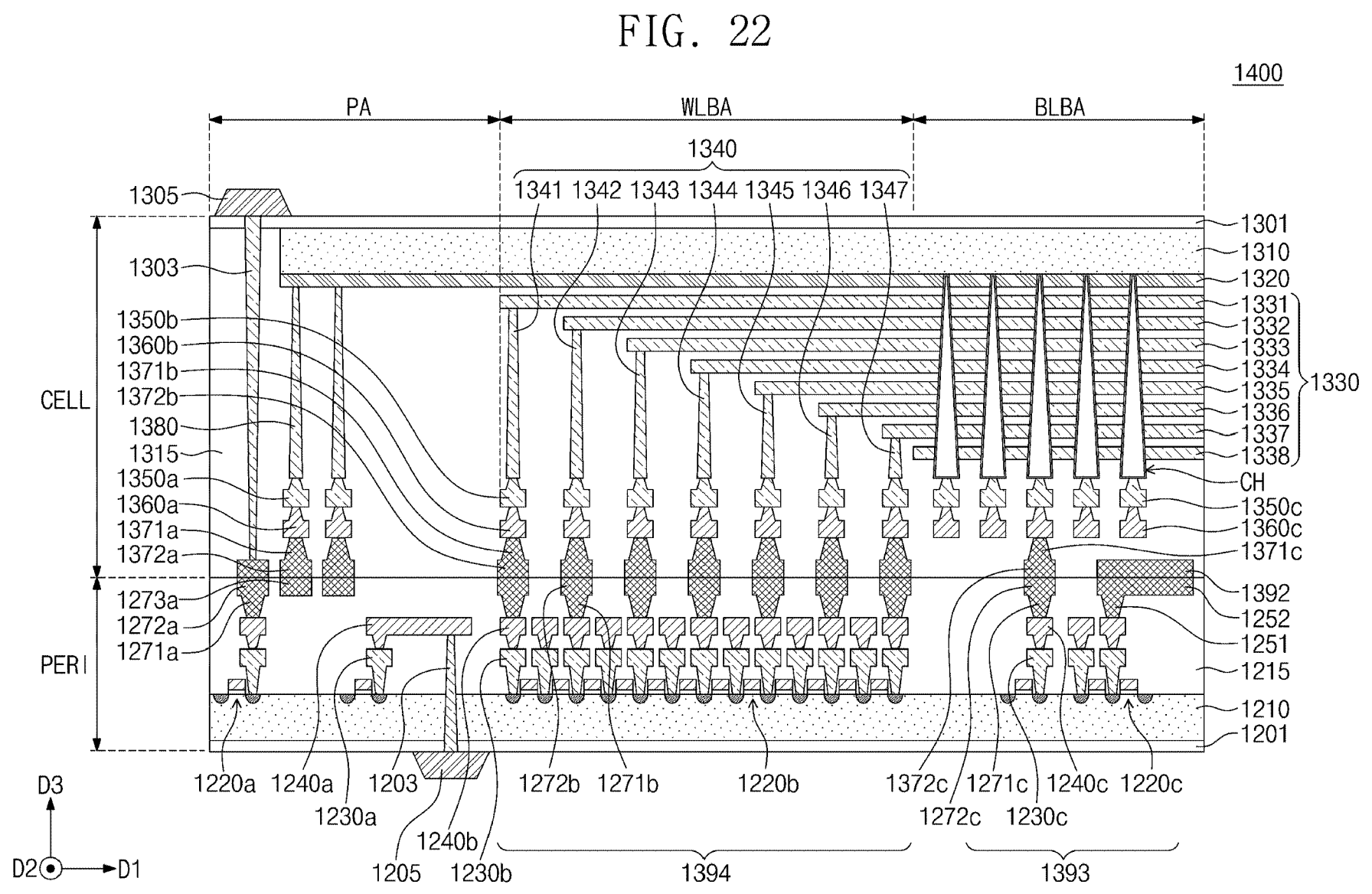

FIG. 22 illustrates a cross-sectional view showing a semiconductor device according to an embodiment of the present inventive concept.

Referring to FIG. 22, a semiconductor device 1400 may have a chip-to-chip (C2C) structure. The C2C structure may be fabricated by forming on a first wafer an upper chip including a cell array structure CELL; forming, on a second wafer different from the first wafer, a lower chip including a peripheral circuit structure PERI; and then using a bonding method to connect the upper and lower chips to each other. For example, the bonding method may indicate a way that electrically connects a bonding metal formed an uppermost metal layer of the upper chip to a bonding metal formed on an uppermost metal layer of the lower chip. For example, when the bonding metal is formed of copper (Cu), the bonding method may be a Cu-to-Cu bonding method, and the bonding metal may also be formed of, for example, aluminum (Al) or tungsten (W). In an embodiment of the present inventive concept, the upper chip and the lower chip may be connected directly to each other by a hybrid bonding method. For example, when the bonding metals of the upper and lower chips are formed of copper (Cu), the bonding metals of the upper and lower chips may be physically and electrically connected to each other by a copper (Cu)-copper (Cu) bonding method. In addition, a surface of an interlayer dielectric layer of the upper chip and a surface of an interlayer dielectric layer of the lower chip may be bonded to each other by a dielectric material-dielectric material bonding method.

Each of the peripheral circuit structure PERI and the cell array structure CELL of the semiconductor device 1400 may include an outer pad bonding area PA, a word-line bonding area WLBA, and a bit-line bonding area BLBA.

The peripheral circuit structure PERI may include a first substrate 1210, an interlayer dielectric layer 1215, a plurality of circuit elements 1220a, 1220b, and 1220c formed on the first substrate 1210, first metal layers 1230a, 1230b, and 1230c correspondingly connected to the plurality of circuit elements 1220a, 1220b, and 1220c, and second metal layers 1240a, 1240b, and 1240c formed on the first metal layers 1230a, 1230b, and 1230c. In an embodiment of the present inventive concept, the first metal layers 1230a, 1230b, and 1230c may be formed of tungsten (W) whose electrical resistivity is relatively higher, and the second metal layers 1240a, 1240b, and 1240c may be formed of copper (Cu) whose electrical resistivity is relatively lower.

The first metal layers 1230a, 1230b, and 1230c and the second metal layers 1240a, 1240b, and 1240c are shown and discussed in this description, but the present inventive concept is not limited thereto, and one or more metal layers may further be formed on the second metal layers 1240a, 1240b, and 1240c. At least one of the metal layers formed on the second metal layers 1240a, 1240b, and 1240c may be formed of aluminum (Al) whose electrical resistivity is greater than that of copper (Cu) used for forming the second metal layers 1240a, 1240b, and 1240c.

The interlayer dielectric layer 1215 may be disposed on the first substrate 1210 so as to cover the plurality of circuit elements 1220a, 1220b, and 1220c, the first metal layers 1230a, 1230b, and 1230c, and the second metal layers 1240a, 1240b, and 1240c, and may include a dielectric material, such as, for example, silicon oxide ($SiO_2$) or silicon nitride ($Si_3N_4$).

A lower bonding metal 1271b and 1272b may be formed on the second metal layer 1240b of the word-line bonding area WLBA. On the word-line bonding area WLBA, the lower bonding metal 1271b and 1272b of the peripheral circuit structure PERI may be electrically bonded and connected to an upper bonding metal 1371b and 1372b of the cell array structure CELL, and the lower bonding metal 1271b and 1272b and the upper bonding metal 1371b and 1372b may be formed of, for example, aluminum (Al), copper (Cu), or tungsten (W).

The cell array structure CELL may correspond to the cell array structure CS discussed with reference to FIGS. 3 to 21. The cell array structure CELL may provide at least one memory block. The cell array structure CELL may include a second substrate 1310 and a common source line 1320. The second substrate 1310 may be provided thereon with a plurality of word lines 1330 (or 1331 to 1338) arranged along a direction (third direction D3) perpendicular to a top surface of the second substrate 1310. String selection lines and a ground selection line may be respectively located on upper and lower portions of the word lines 1330, and the plurality of word lines 1330 may be located between the string selection lines and the ground selection line.

On the bit-line bonding area BLBA, a channel structure CH may extend in the direction (third direction D3) perpendicular to the top surface of the second substrate 1310, and may penetrate the word lines 1330, the string selection lines, and the ground selection line. The channel structure CH may include a data storage layer, a channel layer, and a buried dielectric layer, and the channel layer may be electrically connected to the first metal layer 1350c and the second metal layer 1360c. For example, the first metal layer 1350c may be a bit-line contact, and the second metal layer 1360c may be a bit line. In an embodiment of the present inventive concept, the bit line 1360c may extend along a second direction D2 parallel to a top surface of the second substrate 1310.

In the embodiment shown in FIG. 22, the bit-line bonding area BLBA may be defined to refer to a zone where the channel structure CH and the bit line 1360c are located. On the bit-line bonding area BLBA, the bit lines 1360c may be electrically connected to the circuit elements 1220c that provide a page buffer 1393 on the peripheral circuit structure PERI. For example, the bit line 1360c may have connection through an upper bonding metal 1371c and 1372c with the peripheral circuit structure PERI, and the upper bonding metal 1371c and 1372c may have connection with a lower bonding metal 1271c and 1272c connected to the circuit elements 1220c of the page buffer 1393.

On the word-line bonding area WLBA, the word lines 1330 may extend along a first direction D1 parallel to the top surface of the second substrate 1310 while being perpendicular to the third direction D3, and may be connected to a plurality of cell contact plugs 1340 (or 1341 to 1347). The cell contact plugs 1340 (1341 to 1347) may have their shapes the same as that of the cell contact plug CC of FIG. 5C.

The word lines 1330 and the cell contact plugs 1340 may be connected at pads that are at least portions of the word lines 1330 and that extend to have different lengths along the first direction D1. For example, the word lines 1330 (or 1331 to 1338) may be staked in a reverse staircase shape in which extension lengths in the first direction D1 may gradually decrease in a stepwise manner from an uppermost level toward a lowermost level. The first metal layer 1350b and the second metal layer 1360b may be sequentially connected to upper portions (which are lower portions in FIG. 22) of the cell contact plugs 1340 connected to the word lines 1330. On the word-line bonding area WLBA, the cell contact plugs 1340 may be connected to the peripheral circuit structure PERI through the upper bonding metal 1371b and 1372b of the cell array structure CELL and through the lower bonding metal 1271b and 1272b of the peripheral circuit structure PERI.

The cell contact plugs 1340 may be electrically connected to the circuit elements 1220b that form a row decoder 1394 on the peripheral circuit structure PERI. For example, as the upper bonding metal 1371b and 1372b of the cell array structure CELL and the lower bonding metal 1271b and 1272b of the peripheral circuit structure PERI are connected to each other, the word lines 1330 (or 1331 to 1338) may be electrically connected to the circuit elements 1220b of the row decoder 1394. In an embodiment of the present inventive concept, an operating voltage of the circuit elements 1220b that form the row decoder 1394 may be different from that of the circuit elements 1220c that form the page buffer 1393. For example, the operating voltage of the circuit elements 1220c that form the page buffer 1393 may be greater than that of the circuit elements 1220b that form the row decoder 1394.

A common source line contact plug 1380 may be disposed on an outer pad bonding area PA. The common source line contact plug 1380 may be formed of a conductive material, such as, for example, metal, metal compound, or polysilicon (p-Si), and may be electrically connected to the common source line 1320. A first metal layer 1350a and a second metal layer 1360a may be sequentially stacked on an upper portion (which are lower portions in FIG. 22) of the common source line contact plug 1380. For example, the outer pad bonding area PA may be defined to refer to a zone on which the common source line contact plug 1380, the first metal layer 1350a, and the second metal layer 1360a are disposed.

Input/output pads 1205 and 1305 may be disposed on the outer pad bonding area PA. As illustrated in FIG. 22, a lower dielectric layer 1201 may be formed on a lower portion the first substrate 1210 to cover a bottom surface of the first substrate 1210, and a first input/output pad 1205 may be formed on the lower dielectric layer 1201. The first input/output pad 1205 may be connected through a first input/output contact plug 1203 to at least one of the plurality of circuit elements 1220a, 1220b, and 1220c disposed on the peripheral circuit structure PERI, and the lower dielectric layer 1201 may separate the first input/output pad 1205 from the first substrate 1210. In addition, a sidewall dielectric layer may be disposed between the first input/output contact plug 1203 and the first substrate 1210, and may electrically separate the first input/output contact plug 1203 from the first substrate 1210.

As illustrated in FIG. 22, an upper dielectric layer 1301 may be formed on an upper portion of the second substrate 1310 to cover a top surface of the second substrate 1310, and a second input/output pad 1305 may be disposed on the upper dielectric layer 1301. The second input/output pad 1305 may be connected through a second input/output contact plug 1303 to at least one of the plurality of circuit elements 1220a, 1220b, and 1220c disposed on the peripheral circuit structure PERI. In an embodiment of the present inventive concept, the second input/output pad 1305 may be electrically connected to the circuit element 1220a.

In an embodiment of the present inventive concept, neither the second substrate 1310 nor the common source line 1320 may be located on an area where the second input/output contact plug 1303 is disposed. In addition, the second input/output pad 1305 may not overlap in the third direction D3 with the word lines 1330. As shown in FIG. 22, when viewed in a direction perpendicular to the top surface of the second substrate 1310, the second input/output contact plug 1303 may be separated from the second substrate 1310, and may penetrate an interlayer dielectric layer 1315 of the cell array structure CELL to come into connection with the second input/output pad 1305.

In an embodiment of the present inventive concept, the first input/output pad 1205 and the second input/output pad 1305 may be selectively formed. For example, the semiconductor device 1400 may include only the first input/output pad 1205 disposed on an upper portion (which is a lower portion in FIG. 22) of the first substrate 1210, or only the second input/output pad 1305 disposed on an upper portion of the second substrate 1310. For another example, the semiconductor device 1400 may include all of the first input/output pad 1205 and the second input/output pad 1305.

On each of the outer pad bonding area PA and the bit-line bonding area BLBA that are included in each of the cell array structure CELL and the peripheral circuit structure PERI, a metal pattern at an uppermost metal layer may be present as a dummy pattern, or the uppermost metal layer may be absent.

The semiconductor device 1400 may be configured such that, on the outer pad bonding area PA, a lower metal pattern 1273a may be formed to correspond to an upper metal pattern 1372a formed at an uppermost metal layer (which is a lowermost metal layer in FIG. 22) of the cell array structures CELL, and the lower metal pattern 1273a may have the same shape as that of the upper metal pattern 1372a. The upper metal pattern 1372a may be connected to an upper bonding metal 1371a. The lower metal pattern 1273a formed at the uppermost metal layer of the peripheral circuit structure PERI may not be connected to a separate contact on the peripheral circuit structure PERI. In this case, the lower metal pattern 1273a of the peripheral circuit structure PERI may be used to bond the peripheral circuit structure PERI to the cell array structure CELL, but not used to provide electric connection to other circuit components of the peripheral circuit structure PERI. Similarly, on the outer pad bonding area PA, an upper metal pattern 1372a may be formed at an upper metal layer (which is a lowermost metal layer in FIG. 22) of the cell array structure CELL, which upper metal pattern 1372a may correspond to and have the same shape as that of the lower metal pattern 1273a formed at an uppermost metal layer of the peripheral circuit structure PERI. A lower bonding metal 1271a and 1272a of the peripheral circuit structure PERI may be electrically connected to the circuit element 1220a on the peripheral circuit structure PERI.

A lower bonding metal 1271b and 1272b may be formed on the second metal layer 1240b of the word-line bonding area WLBA. On the word-line bonding area WLBA, the lower bonding metal 1271b and 1272b of the peripheral circuit structure PERI may be bonded to and electrically connected to the upper bonding metal 1371b and 1372b of the cell array structure CELL.

On the bit-line bonding area BLBA, an upper metal pattern 1392 may be formed at an uppermost metal layer (which is a lowermost metal layer in FIG. 22) of the cell array structure CELL, may correspond to a lower metal pattern 1252 formed at an uppermost metal layer of the peripheral circuit structure PERI, and may have a shape the same as that of the lower metal pattern 1252. No contact may be formed on the upper metal pattern 1392 formed at the uppermost metal layer (which is the lowermost metal layer in FIG. 22) of the cell array structure CELL. In this case, the upper metal pattern 1392 of the cell array structure CELL may be used to bond the cell array structure CELL to the peripheral circuit structure PERI, but not used to provide electric connection to other circuit components of the cell array structure CELL. The lower metal pattern 1252 may be connected to a lower bonding metal 1251.

In a three-dimensional semiconductor memory device according to an embodiment of the present inventive concept and an electronic system including the same, a polishing stop pattern may be included to prevent process failure such as dishing issues, such that breakdown voltage degradation of first and second gate electrodes may be minimized or prevented, and variation in thickness of interlayer dielectric layers may be prevented. Accordingly, the three-dimensional semiconductor memory device may increase in reliability. The three-dimensional semiconductor memory device may be configured such that ground selection gate electrodes may be divided by first and second lower separation patterns and second separation dielectric lines, and thus the divided ground selection gate electrodes may one-to-one correspond to string selection gate electrodes. Accordingly, the three-dimensional semiconductor memory device may enhance in program/read/erase operating properties.

A method of fabricating a three-dimensional semiconductor memory device according to an embodiment of the present inventive concept may perform a chemical mechanical polishing (CMP) process by using a polishing stop layer having an excellent etch/polish selectivity, and thus process failure may be prevented and manufacturing yields may increase. Moreover, removal of the polishing stop layer may not be required, and therefore processes may become simplified.

Although the present inventive concept has been described in connection with some specific embodiments of the present inventive concept illustrated with respect to the accompanying drawings, it will be understood to those skilled in the art that various changes and modifications may be made without departing from the spirit and scope of the present inventive concept as defined by the appended claims. The embodiments of FIGS. 1A to 22 may be combined with each other.

What is claimed is:

1. A three-dimensional semiconductor memory device, comprising:
a plurality of lower selection lines disposed on a substrate and extending in a first direction, the lower selection lines being spaced apart from each other in a second direction that is parallel to a top surface of the substrate and intersects the first direction;
a middle stack structure including a plurality of electrode layers and a plurality of electrode interlayer dielectric layers that are alternately stacked on the lower selection lines;
a plurality of upper selection lines disposed on the middle stack structure and extending in the first direction, the upper selection lines being spaced apart from each other in the second direction; and
a first polishing stop layer disposed between the middle stack structure and the lower selection lines,
wherein the first polishing stop layer includes a material different from a material of the electrode interlayer dielectric layers, and
the first polishing stop layer includes a dielectric material.

2. The device of claim 1, wherein
the lower selection lines include first, second, and third lower selection lines spaced apart from each other in the second direction,
the upper selection lines include first, second, and third upper selection lines spaced apart from each other in the second direction,
the first, second, and third lower selection lines respectively correspond to the first, second, and third upper selection lines, and
the three-dimensional semiconductor memory device further comprises:
a first lower separation pattern disposed between the first and second lower selection lines; and
an upper separation pattern disposed between the first and second upper selection lines,
wherein the first lower separation pattern and the upper separation pattern overlap each other and each extends in the first direction.

3. The device of claim 2, wherein
the first lower separation pattern has a first width, and
the upper separation pattern has a second width smaller than the first width.

4. The device of claim 2, wherein a top surface of the first lower separation pattern is coplanar with a top surface of the first polishing stop layer.

5. The device of claim 2, wherein the first lower separation pattern and the upper separation pattern include a material the same as a material of the electrode interlayer dielectric layers.

6. The device of claim 2, wherein the substrate includes a cell array region and a connection region, the three-dimensional semiconductor memory device further comprises a second lower separation pattern disposed on the connection region and between the second and third lower selection lines, the first lower separation pattern has a first width in the second direction, the second lower separation pattern has a second width in the second direction, and the second width is greater than the first width.

7. The device of claim 6, further comprising a separation dielectric line disposed between the second and third lower selection lines and extending in the first direction, wherein the separation dielectric line extends in a third direction and is between the second and third upper selection lines, the third direction being perpendicular to the top surface of the substrate, and the separation dielectric line is in contact with a lateral surface of the second lower separation pattern.

8. The device of claim 2, further comprising:

a plurality of cell vertical semiconductor patterns that penetrate the upper selection lines, the middle stack structure, the first polishing stop layer, and the lower selection lines; and a dummy vertical semiconductor pattern that penetrates the upper selection lines, the middle stack structure, the first polishing stop layer, and the first lower separation pattern to be adjacent to the substrate.

9. The device of claim 1, wherein the first polishing stop layer includes SiCN, and each of the electrode interlayer dielectric layers includes silicon oxide.

10. The device of claim 1, wherein the middle stack structure includes a first middle stack structure and a second middle stack structure on the first middle stack structure, the three-dimensional semiconductor device further comprises a second polishing stop layer disposed between the first middle stack structure and the second middle stack structure, and the second polishing stop layer includes a material the same as a material of the first polishing stop layer.

11. The device of claim 1, wherein the substrate includes a cell array region and a connection region, ends of the upper selection lines, ends of the electrode layers, and ends of the lower selection lines constitute a stepwise shape on the connection region, the three-dimensional semiconductor memory device further comprises:

a planarized dielectric layer on the connection region, the planarized dielectric layer covering the ends of the upper selection lines, the ends of the electrode layers, and the ends of the lower selection lines; and a second polishing stop layer that covers the upper selection lines, wherein the second polishing stop layer includes a material the same as a material of the first polishing stop layer.

12. An electronic system, comprising:

a semiconductor device that includes a peripheral circuit structure and a cell array structure on the peripheral circuit structure;

an input/output pad electrically connected to the peripheral circuit structure; and a controller electrically connected through the input/output pad to the semiconductor device, the controller controlling the semiconductor device, wherein the cell array structure includes:

a plurality of lower selection lines disposed on a substrate and extending in a first direction, the lower selection lines being spaced apart from each other in a second direction that is parallel to a top surface of the substrate and intersects the first direction;

a middle stack structure including a plurality of electrode layers and a plurality of electrode interlayer dielectric layers that are alternately stacked on the lower selection lines;

a plurality of upper selection lines disposed on the middle stack structure and extending in the first direction; and a first polishing stop layer disposed between the middle stack structure and the lower selection lines and including a material different from a material of the electrode interlayer dielectric layers, and the first polishing stop layer includes a dielectric material.

13. A three-dimensional semiconductor memory device, comprising:

a plurality of lower selection lines disposed on a substrate and extending in a first direction, the lower selection lines being spaced apart from each other in a second direction that is parallel to a top surface of the substrate and intersects the first direction;

a middle stack structure including a plurality of electrode layers and a plurality of electrode interlayer dielectric layers that are alternately stacked on the lower selection lines;

a plurality of upper selection lines disposed on the middle stack structure and extending in the first direction, the upper selection lines being spaced apart from each other in the second direction; and a first polishing stop layer disposed between the middle stack structure and the lower selection lines, wherein the first polishing stop layer includes a material different from a material of the electrode interlayer dielectric layers, the lower selection lines include first, second, and third lower selection lines spaced apart from each other in the second direction, the upper selection lines include first, second, and third upper selection lines spaced apart from each other in the second direction, the first, second, and third lower selection lines respectively correspond to the first, second, and third upper selection lines, and the three-dimensional semiconductor memory device further comprises:

a first lower separation pattern disposed between the first and second lower selection lines; and an upper separation pattern disposed between the first and second upper selection lines, wherein the first lower separation pattern and the upper separation pattern overlap each other and each extends in the first direction.

14. The device of claim 13, wherein the first lower separation pattern has a first width, and the upper separation pattern has a second width smaller than the first width.

15. The device of claim 13, wherein a top surface of the first lower separation pattern is coplanar with a top surface of the first polishing stop layer.

16. The device of claim 13, wherein the first lower separation pattern and the upper separation pattern include a material the same as a material of the electrode interlayer dielectric layers.

17. The device of claim 13, wherein the substrate includes a cell array region and a connection region, the three-dimensional semiconductor memory device further comprises a second lower separation pattern disposed on the connection region and between the second and third lower selection lines, the first lower separation pattern has a first width in the second direction, the second lower separation pattern has a second width in the second direction, the second width is greater than the first width, the three-dimensional semiconductor memory device further comprises a separation dielectric line disposed between the second and third lower selection lines and extending in the first direction, the separation dielectric line extends in a third direction and is between the second and third upper selection lines, the third direction being perpendicular to the top surface of the substrate, and the separation dielectric line is in contact with a lateral surface of the second lower separation pattern.

18. The device of claim 13, further comprising:

a plurality of cell vertical semiconductor patterns that penetrate the upper selection lines, the middle stack structure, the first polishing stop layer, and the lower selection lines; and a dummy vertical semiconductor pattern that penetrates the upper selection lines, the middle stack structure, the first polishing stop layer, and the first lower separation pattern to be adjacent to the substrate.

19. The device of claim 13, wherein the middle stack structure includes a first middle stack structure and a second middle stack structure on the first middle stack structure, the three-dimensional semiconductor device further comprises a second polishing stop layer disposed between the first middle stack structure and the second middle stack structure, and the second polishing stop layer includes a material the same as a material of the first polishing stop layer.

20. The device of claim 13, wherein the substrate includes a cell array region and a connection region, ends of the upper selection lines, ends of the electrode layers, and ends of the lower selection lines constitute a stepwise shape on the connection region, the three-dimensional semiconductor memory device further comprises:

a planarized dielectric layer on the connection region, the planarized dielectric layer covering the ends of the upper selection lines, the ends of the electrode layers, and the ends of the lower selection lines; and a second polishing stop layer that covers the upper selection lines, and the second polishing stop layer includes a material the same as a material of the first polishing stop layer.

* * * * *